(12) United States Patent
Sturcken et al.

(10) Patent No.: US 11,302,469 B2
(45) Date of Patent: Apr. 12, 2022

(54) METHOD FOR FABRICATING INDUCTORS WITH DEPOSITION-INDUCED MAGNETICALLY-ANISOTROPIC CORES

(71) Applicant: Ferric Inc., New York, NY (US)

(72) Inventors: Noah Sturcken, New York, NY (US); Ryan Davies, New York, NY (US); Michael Lekas, New York, NY (US)

(73) Assignee: Ferric Inc., New York, NY (US)

( * ) Notice: Subject to any disclaimer, the term of this patent is extended or adjusted under 35 U.S.C. 154(b) by 0 days.

(21) Appl. No.: 16/257,392

(22) Filed: Jan. 25, 2019

(65) Prior Publication Data

US 2019/0172624 A1    Jun. 6, 2019

Related U.S. Application Data

(63) Continuation-in-part of application No. 15/911,778, filed on Mar. 5, 2018, now Pat. No. 10,629,357,
(Continued)

(51) Int. Cl.
*H01F 41/04* (2006.01)
*H01F 27/24* (2006.01)
(Continued)

(52) U.S. Cl.
CPC ......... *H01F 27/24* (2013.01); *H01F 1/14708* (2013.01); *H01F 13/003* (2013.01);
(Continued)

(58) Field of Classification Search
CPC ........ H01F 41/046; H01F 41/06; H01F 41/14; H01F 41/26; H01F 1/14708;
(Continued)

(56) References Cited

U.S. PATENT DOCUMENTS

| 1,553,983 A | 9/1925 | Casper |
| 2,931,966 A | 4/1960 | Rockey |
| (Continued) | | |

FOREIGN PATENT DOCUMENTS

| FR | 2817622 A1 | 6/2002 |
| FR | 2905792 A1 | 3/2008 |
| (Continued) | | |

OTHER PUBLICATIONS

ISA, "International Search Report", PCT/US2018/036832, dated Aug. 28, 2018.
(Continued)

*Primary Examiner* — A. Dexter Tugbang
(74) *Attorney, Agent, or Firm* — Intrinsic Law Corp.

(57) ABSTRACT

A method of fabricating an inductor includes (a) forming a ferromagnetic core on a semiconductor substrate, the ferromagnetic core lying in a core plane and (b) fabricating an inductor coil that winds around the ferromagnetic core, the inductor coil configured to generate an inductor magnetic field that passes through the ferromagnetic core in a first direction parallel to the core plane. While forming the ferromagnetic core, the method further includes (1) generating a bias magnetic field that passes through the ferromagnetic core in a second direction that is orthogonal to the first direction, and (2) inducing a magnetic anisotropy in the ferromagnetic core with the bias magnetic field.

36 Claims, 42 Drawing Sheets

Related U.S. Application Data which is a continuation-in-part of application No. 15/255,804, filed on Sep. 2, 2016, now Pat. No. 10,431,371, which is a continuation of application No. 14/746,994, filed on Jun. 23, 2015, now Pat. No. 9,991,040.

(60) Provisional application No. 62/015,726, filed on Jun. 23, 2014.

(51) Int. Cl.

| | | |
|---|---|---|
| H01F 17/00 | (2006.01) | |
| H01F 1/147 | (2006.01) | |
| H01L 49/02 | (2006.01) | |
| H01F 41/14 | (2006.01) | |
| H01F 41/06 | (2016.01) | |
| H01F 13/00 | (2006.01) | |
| H01F 27/38 | (2006.01) | |
| H01F 27/255 | (2006.01) | |
| H01F 17/06 | (2006.01) | |
| H01F 27/28 | (2006.01) | |
| H01F 17/04 | (2006.01) | |
| H01F 41/26 | (2006.01) | |

(52) U.S. Cl.
CPC ......... *H01F 17/0013* (2013.01); *H01F 17/04* (2013.01); *H01F 17/062* (2013.01); *H01F 27/255* (2013.01); *H01F 27/2823* (2013.01); *H01F 27/38* (2013.01); *H01F 41/046* (2013.01); *H01F 41/06* (2013.01); *H01F 41/14* (2013.01); *H01F 41/26* (2013.01); *H01L 28/10* (2013.01); *H01F 17/0006* (2013.01); *H01F 17/0033* (2013.01); *H01F 27/2895* (2013.01); *H01F 2017/0066* (2013.01); *Y10T 29/4902* (2015.01); *Y10T 29/49073* (2015.01)

(58) Field of Classification Search
CPC ............. H01F 17/0006; H01F 17/0013; H01F 17/0033; H01F 17/04; H01F 17/062; H01F 2017/0066; H01F 27/24; H01F 27/255; H01F 27/2823; H01F 27/2895; H01F 27/38; H01F 13/003; H01L 28/10; Y10T 29/4902; Y10T 29/49073
See application file for complete search history.

(56) References Cited

U.S. PATENT DOCUMENTS

| | | | |
|---|---|---|---|
| 3,110,613 A | 11/1963 | Bean | |
| 3,543,249 A | 11/1970 | Bobeck et al. | |
| 3,573,760 A | 4/1971 | Chang et al. | |
| 3,614,554 A | 10/1971 | Shield et al. | |
| 4,025,379 A | 5/1977 | Whetstone | |
| 4,103,315 A | 7/1978 | Hempstead et al. | |
| 4,236,946 A | 12/1980 | Aboaf et al. | |
| 5,070,317 A | 12/1991 | Bhagat | |
| 5,079,534 A * | 1/1992 | Steingroever | Y10T 29/4902 |
| | | | 100/917 |
| 5,225,971 A | 7/1993 | Spreen | |
| 5,319,343 A | 6/1994 | Jeffries | |
| 5,583,474 A | 12/1996 | Mizoguchi | |
| 5,635,892 A | 6/1997 | Ashby | |
| 5,831,431 A | 11/1998 | Gottfried-Gottfried et al. | |
| 5,912,553 A | 6/1999 | Mengelkoch | |
| 6,118,351 A | 9/2000 | Kossives et al. | |
| 6,362,986 B1 | 3/2002 | Schultz | |
| 6,542,060 B2 | 4/2003 | Fedeli | |
| 6,542,379 B1 | 4/2003 | Lauffer | |
| 6,856,226 B2 | 2/2005 | Gardner | |
| 6,940,384 B2 | 9/2005 | Hooey et al. | |
| 7,230,408 B1 | 6/2007 | Vinn et al. | |
| 7,554,399 B1 | 6/2009 | Gaboriau et al. | |
| 7,636,242 B2 | 12/2009 | Hazucha | |
| 7,719,084 B2 | 5/2010 | Gardner | |
| 7,791,837 B2 | 9/2010 | Fujiwara | |
| 7,867,787 B2 | 1/2011 | Gardner | |
| 7,868,431 B2 | 1/2011 | Feng et al. | |
| 7,875,955 B1 * | 1/2011 | Hopper | H01F 17/0006 |
| | | | 257/531 |
| 8,108,984 B2 | 2/2012 | Gardner | |
| 8,270,137 B2 | 9/2012 | Briere et al. | |
| 8,288,277 B2 | 10/2012 | Takahashi et al. | |
| 8,432,144 B2 | 4/2013 | Notani | |
| 8,558,344 B2 | 10/2013 | Chen | |
| 9,047,890 B1 | 6/2015 | Herget | |
| 9,679,958 B2 | 6/2017 | Sturcken et al. | |
| 2002/0060621 A1 | 5/2002 | Duffy et al. | |
| 2002/0136929 A1 | 9/2002 | Oikawa et al. | |
| 2003/0005569 A1 | 1/2003 | Hiatt et al. | |
| 2003/0070282 A1 | 4/2003 | Hiatt et al. | |
| 2003/0090244 A1 | 5/2003 | Shenai et al. | |
| 2003/0160677 A1 | 8/2003 | Fujiwara et al. | |
| 2004/0009614 A1 * | 1/2004 | Ahn | H01F 41/26 |
| | | | 436/526 |
| 2004/0135661 A1 | 7/2004 | Haugs et al. | |
| 2004/0196019 A1 | 10/2004 | Schneider | |
| 2005/0088269 A1 | 4/2005 | Hatano et al. | |
| 2005/0156704 A1 | 7/2005 | Gardner et al. | |
| 2006/0197510 A1 | 9/2006 | Chandrasekaran | |
| 2006/0263727 A1 | 11/2006 | Lee et al. | |
| 2006/0273418 A1 | 12/2006 | Chung et al. | |
| 2007/0037414 A1 | 2/2007 | Yamauchi et al. | |
| 2007/0290362 A1 | 12/2007 | Hsu et al. | |
| 2008/0003699 A1 | 1/2008 | Gardner et al. | |
| 2008/0023791 A1 | 1/2008 | Muthukumar et al. | |
| 2008/0075975 A1 * | 3/2008 | Glaser | H01F 41/046 |
| | | | 428/693.1 |
| 2008/0172861 A1 | 7/2008 | Holmes | |
| 2008/0316647 A1 | 12/2008 | Joisten | |
| 2009/0007418 A1 | 1/2009 | Edo et al. | |
| 2009/0068762 A1 | 3/2009 | Takahashi et al. | |
| 2009/0128274 A1 | 5/2009 | Park et al. | |
| 2009/0175014 A1 | 7/2009 | Zeng et al. | |
| 2009/0188104 A1 | 7/2009 | Ching et al. | |
| 2011/0208019 A1 | 8/2011 | Sato et al. | |
| 2011/0279214 A1 | 11/2011 | Lee et al. | |
| 2012/0086416 A1 | 4/2012 | Kudo et al. | |
| 2012/0154966 A1 | 6/2012 | Wolfus et al. | |
| 2013/0027170 A1 | 1/2013 | Chen | |
| 2013/0056847 A1 * | 3/2013 | Chen | Y10T 29/4902 |
| | | | 257/531 |
| 2013/0099334 A1 | 4/2013 | Mohan | |
| 2013/0099762 A1 | 4/2013 | Terrovitis | |
| 2013/0206845 A1 | 8/2013 | Koujima et al. | |
| 2013/0234821 A1 | 9/2013 | Shim | |
| 2014/0027879 A1 | 1/2014 | Weyers et al. | |
| 2014/0062646 A1 | 3/2014 | Morrissey et al. | |
| 2014/0068932 A1 | 3/2014 | Sturcken | |
| 2014/0071636 A1 | 3/2014 | Sturcken | |
| 2014/0203398 A1 | 7/2014 | Sturcken | |
| 2014/0240074 A1 | 8/2014 | Qui et al. | |
| 2014/0252548 A1 | 9/2014 | Yen et al. | |
| 2014/0266541 A1 | 9/2014 | Sakamoto et al. | |
| 2015/0036308 A1 | 2/2015 | Sturcken | |
| 2015/0137776 A1 | 5/2015 | Thomas et al. | |
| 2015/0171157 A1 | 6/2015 | Sturcken et al. | |
| 2015/0187488 A1 | 7/2015 | Williams et al. | |
| 2015/0243881 A1 | 8/2015 | Sankman et al. | |
| 2015/0302974 A1 | 10/2015 | Zhao et al. | |
| 2016/0126008 A1 | 5/2016 | Sturcken | |
| 2018/0061545 A1 | 3/2018 | Murashima et al. | |

FOREIGN PATENT DOCUMENTS

| | | |
|---|---|---|
| JP | S5821810 A | 2/1983 |
| JP | 60124859 A | 7/1985 |
| JP | 01028957 A | 1/1989 |

(56) References Cited

FOREIGN PATENT DOCUMENTS

| JP | 05082736 A | | 4/1993 |
|---|---|---|---|
| JP | 05291063 | | 11/1993 |
| JP | H09162354 A | | 6/1997 |
| JP | 10284314 A | | 10/1998 |
| JP | 2000068133 A | | 3/2000 |
| JP | 2002190411 A | | 7/2002 |
| JP | 2006228824 A | * | 8/2006 |
| WO | WO2012166877 A1 | | 12/2012 |

OTHER PUBLICATIONS

N. Sturcken et al., "Design of Coupled Power Inductors with Crossed Anisotropy Magnetic Core for Integrated Power Conversion", IEEE-APEC 2012, p. 417-423, doi: 10.1109/APEC.2012.6165853.

D. W. Lee et al., "Design and Fabrication of Integrated Solenoid Inductors with Magnetic Cores", Electronic Components and Technology Conference, 2008, p. 701-705, IEEE.

N. Sturcken et al., "A 2.5D Integrated Voltage Regulator Using Coupled Magnetic-Core Inductors on Silicon Interposer Delivering 10.8A/mm²", IEEE International Solid-State Circuits Conference, Feb. 22, 2012, p. 3-5, Session 23, IEEE.

N. A. Sturcken, "Integrated Voltage Regulators with Thin-Film Magnetic Power Inductors", 2013, pp. 1-166, Columbia University.

* cited by examiner

METHOD FOR FABRICATING INDUCTORS WITH DEPOSITION-INDUCED MAGNETICALLY-ANISOTROPIC CORES

CROSS REFERENCE TO RELATED APPLICATIONS

This application is a continuation-in-part of U.S. patent application Ser. No. 15/911,778, titled "Apparatus and Methods for Magnetic Core Inductors with Biased Permeability," filed on Mar. 5, 2018, which is a continuation-in-part of U.S. patent application Ser. No. 15/255,804, titled "Apparatus and Methods for Magnetic Core Inductors with Biased Permeability," filed on Sep. 2, 2016, which is a continuation of U.S. patent application Ser. No. 14/746,994, titled "Apparatus and Methods for Magnetic Core Inductors with Biased Permeability," filed on Jun. 23, 2015, now U.S. Pat. No. 9,991,040, which claims priority to U.S. Provisional Application No. 62/015,726, titled "Apparatus and Methods for Magnetic Core Inductors with Biased Permeability," filed on Jun. 23, 2014, each of which is hereby incorporated by reference.

TECHNICAL FIELD

This application is directed to inductive elements comprising anisotropic media, means for magnetically biasing thereof and methods of manufacture and operation for use in applications such as microelectronics.

BACKGROUND

The increase in computing power, spatial densities in semiconductor based devices and energy efficiency of the same allow for ever more efficient and small microelectronic sensors, processors and other machines. These have found wide use in mobile and wireless applications and other industrial, military, medical and consumer products.

Even though computing energy efficiency is improving over time, the total amount of energy used by computers of all types is on the rise. Hence, there is a need for even greater energy efficiency. Most efforts to improve the energy efficiency of microelectronic devices have been at the chip and transistor level, including with respect to transistor gate width. However, these methods are limited and other approaches are necessary to increase device density, processing power and to reduce power consumption and heat generation in the same.

One field that can benefit from the above improvements is in switched inductor power conversion devices. Power supplies include power converters that convert one form of electrical energy to another. A regulated power supply is one that controls the output voltage or current to a specific value; the controlled value is held nearly constant despite variations in either load current or the voltage supplied by the power supply's energy source.

Power converters for electronic devices can be broadly divided into AC-AC, AC-DC and DC-DC power converters. Each of these classes use similar devices, techniques and topologies as the others. Modern integrated circuits using advanced CMOS technology will run on power supplies with voltages at 1V-DC or less, while the power levels delivered to a computer are typically at 120V-AC or higher. The 120V-AC is provided by the grid, where the 120V-AC is derived using AC-AC converters from much higher voltage levels for power transmission. Once delivered to the computer, the 120V-AC power is down-converted in the computer to 1V-DC for the microprocessor through a series of power converters, AC-DC converters will generally provide a range of DC voltages such as 3.3V, 5V and 12V, and then a buck converter will take one of those power levels and down-convert to the 1V-DC required by the microprocessor.

AC-AC, AC-DC and DC-DC converters can be further divided into line-frequency (also called "conventional" or "linear") and switching power supplies. Conventional AC-AC and AC-DC power supplies are usually a relatively simple design, but they become increasingly bulky and heavy for high-current equipment. This is due to the need for large mains-frequency transformers and heat-sinked electronic regulation circuitry. Conventional DC-DC converter, linear voltage regulators, produce regulated output voltage by means of an active voltage divider that consumes energy, thus making efficiency low.

A switched-mode power supply of the same rating as a conventional power supply maintains a smaller footprint with better efficiency but at the expense of being more complex. In an AC-AC switched-mode power supply (SMPS), the AC mains input is directly rectified and then filtered to obtain a DC voltage. The resulting DC voltage is then switched on and off at a high frequency by electronic switching circuitry, thus producing an AC current that will pass through a high-frequency transformer or inductor. In a DC-DC SMPS, a DC input voltage is switched on and off at a high frequency by electronic switching circuitry and then passed through a transformer or inductor, where the output of the transformer or inductor is connected to a decoupling capacitor. The output of the inductor or transformer is the converted DC power supply.

Switching occurs at a very high frequency (typically 10 kHz-500 MHz), thereby enabling the use of transformers and filter capacitors that are much smaller, lighter, and less expensive than those found in linear power supplies operating at mains frequency.

Switched-mode power supplies are usually regulated, and to keep the output voltage constant, the power supply employs a feedback controller that monitors current drawn by the load. The switching duty cycle increases as power output requirements increase which puts increasing demands on the constituent components, particularly the inductors. Switch-mode power supplies also use filters or additional switching stages to improve the waveform of the current taken from the input power source. This adds to the circuit complexity, with the inclusion of additional inductors and capacitors.

Additionally, the delivery of low voltage/high current power is also challenging because power loss increases with higher currents, as follows:

$$P_{loss} = I^2 R$$

where, $P_{loss}$ is the power loss over the length of wire and circuit trace, I is the current and R is the inherent resistance over the length of wire and circuit trace. As such, and to increase overall performance, there has been a recognized need in the art for large scale integration of compact and dense electrical components at the chip level, such as, for use with the fabrication of complementary metal oxide semiconductors (CMOS).

With the development of highly integrated electronic systems that consume large amounts of electricity in very small areas, the need arises for new technologies which enable improved energy efficiency and power management for future integrated systems. Integrated power conversion is a promising potential solution as power can be delivered to integrated circuits at higher voltage levels and lower current levels. That is, integrated power conversion allows for step down voltage converters to be disposed in close proximity to transistor elements.

Unfortunately, practical integrated inductors that are capable of efficiently carrying large current levels for switched-inductor power conversion are not available. Specifically, inductors that are characterized by high inductance (>1 nH), low resistance (<1 Ohm), high maximum current rating (>100 mA), and high frequency response whereby no inductance decrease for alternating current (AC) input signal greater than 1 MHz are unavailable or impractical using present technologies.

Furthermore, all of these properties must be economically achieved in a small area, typically less than 1 mm$^2$, a form required for CMOS integration either monolithically or by 3D or 2.5D chip stacking. Thus, an inductor with the aforementioned properties is necessary in order to implement integrated power conversion with high energy efficiency and low output voltage ripple which engenders periodic noise in the output of the converter's output.

The use of high permeability, low coercivity material is typically required to achieve the desired properties on a small scale. In electromagnetism, permeability is the measure of the ability of a material to support the formation of a magnetic field within itself. In other words, it is the degree of magnetization that a material obtains in response to an applied magnetic field. A high permeability denotes a material achieving a high level of magnetization for a small applied magnetic field.

Coercivity, also called the coercive field or force, is a measure of a ferromagnetic or ferroelectric material to withstand an external magnetic or electric field. Coercivity is the measure of hysteresis observed in the relationship between applied magnetic field and magnetization. The coercivity is defined as the applied magnetic field strength necessary to reduce the magnetization to zero after the magnetization of the sample has reached saturation. Thus coercivity measures the resistance of a ferromagnetic material to becoming demagnetized. Ferromagnetic materials with high coercivity are called magnetically hard materials, and are used to make permanent magnets.

Coercivity is determined by measuring the width of the hysteresis loop observed in the relationship between applied magnetic field and magnetization. Hysteresis is the dependence of a system not only on its current environment but also on its past environment. This dependence arises because the system can be in more than one internal state. When an external magnetic field is applied to a ferromagnet such as iron, the atomic dipoles align themselves with it. Even when the field is removed, part of the alignment will be retained: the material has become magnetized. Once magnetized, the magnet will stay magnetized indefinitely. To demagnetize it requires heat or a magnetic field in the opposite direction.

High quality inductors are typically made from high permeability, low coercivity material. However, high permeability materials tend to saturate when biased by a large direct current (DC) magnetic field. Magnetic saturation can have adverse effects as it results in reduced permeability and consequently reduced inductance.

Soft ferromagnetic materials have a number of useful applications within circuits and microelectronic applications. High permeability and low coercivity are two properties that are useful for enhancing inductance. Inductance is a physical phenomenon that can be explained by the combination of Oersted's law (an electric current in a conductor creates a proportional magnetic field) and Faraday's law (a time varying magnetic flux induces an electric potential in nearby conductors). The consequence of inductance is that a change in electric current through a conductor will result in an induced electric potential (EMF) that resists the change in current. Soft magnetic materials exhibit a high permeability and consequently can be placed proximal to conductors within the path of magnetic fields that originate from these conductors, in order increase inductance values.

Typically, within the plane of the film there exists a hard axis of magnetization and an easy axis of magnetization. Along the easy axis, the material tends to exhibit greater coercivity and a highly non-linear relationship between applied magnetic field and magnetization. Along the hard axis, the material tends to exhibit lower coercivity and a relatively linear relationship between applied magnetic field and magnetization.

FIG. 1 illustrates a top view of a toroidal inductor 10 according to the prior art. The inductor 10 includes an annular magnetic core 110 and an inductor coil 120. The coil 120 wraps around the core 110 and extends in a circular direction with respect a core plane 125 that bisects the core 110. The inductor 10 generates a closed loop magnetic field 140 parallel to the circular direction of the core. As illustrated, the magnetic field 140 induces the core 110 to form a hard axis 150 and an easy axis 160 in the plane 125, with the hard axis 150 orthogonal to the easy axis 160. Thus, the magnetic field 140 passes through about half the core 110 in general alignment with the hard axis 150 and about half the core 110 in general alignment with the easy axis 160. This is undesirable because the easy axis 160 of the core has a greater coercivity (and thus non-linearity), which results in magnetic saturation as discussed above.

Accordingly, there is a need for high quality inductors to be used in large scale CMOS integration. This provides a platform for the advancement of systems comprising highly granular dynamic voltage and frequency scaling as well as augmented energy efficiency. The present disclosure contemplates the novel fabrication of efficient and compact on-chip inductors and practical methods for manufacturing operating thereof for remedying these and/or other associated problems.

SUMMARY

The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Other objects, advantages and novel features of the disclosure will be set forth in the following detailed description of the disclosure when considered in conjunction with the drawings.

As mentioned above, the present invention relates to new and improved methods and apparatus for providing integrated inductive elements comprising anisotropic media and means for magnetically biasing thereof. In particular, inductive devices with magnetic cores utilize biasing coils for control of core permeability to be used on-chip in microelectronic applications. Application of an electrical current through the bias coils generates magnetic fields that bias the magnetic materials such that a desirable orientation of anisotropy is achieved throughout the magnetic core and enables modulation of the inductive response of the device.

As described, soft ferromagnetic materials generally exhibit a high permeability and a low coercivity. Permeability is the relationship between applied magnetic field and magnetization of the material, where a high permeability suggests the material achieves a high level of magnetization for a small magnetic field. Coercivity is the measure of hysteresis observed in the B-H loop (the relationship between applied magnetic field and magnetization) and is the magnetic field required to reduce the magnetization to zero after reaching magnetic saturation. Magnetic saturation is the asymptotic point where any increase in the applied magnetic field cannot appreciably increase the magnetization further.

Soft ferromagnetic materials have a number of useful applications within circuits and microelectronic applications. High permeability and low coercivity are two properties that are useful for enhancing inductance. Inductance is a physical phenomenon that can be explained by the combination of Oersted's law (an electric current in a conductor creates a proportional magnetic field) and Faraday's law (a time varying magnetic flux induces an electric potential in nearby conductors). The consequence of inductance is that a change in electric current through a conductor will result in an induced electric potential (EMF) that resists the change in current. Soft magnetic materials exhibit a high permeability and consequently can be placed proximal to conductors within the path of magnetic fields that originate from these conductors, in order increase inductance values.

According to one aspect of the invention, the soft magnetic materials comprise alloys containing at least one of Co, Ni or Fe and/or anisotropic in their magnetic response. Typically, within the plane of the film there exists a hard axis of magnetization and an easy axis of magnetization. Along the easy axis, the material tends to exhibit greater coercivity and a highly non-linear relationship between applied magnetic field and magnetization. Along the hard axis, the material tends to exhibit lower coercivity and a relatively linear relationship between applied magnetic field and magnetization.

According to another aspect of the invention, it is desirable to utilize the hard axis for most applications, due to the low coercivity and linearity in magnetization. In the case of an inductor, this would involve aligning the orientation of the hard axis with the expected orientation of some or all of the magnetic field lines that originate from the inductor coil. The orientation of the induced magnetic anisotropy may be controlled by several, potentially competing physical phenomena.

According to one aspect of the invention, the induced anisotropy may be set by controlling the direction of film growth during film deposition and/or by applying a magnetic field during film deposition. According to another aspect, the induced anisotropy is controlled by applying a magnetic field during a high temperature (greater than 100 degrees Celsius) anneal. Shape anisotropy results from the demagnetizing fields of a magnetic structure which are determined by the magnetic structure's physical shape.

Other factors can influence a magnetic structures orientation of anisotropy, including various types of coupling to adjacent magnetic structures. The apparent orientation of anisotropy for a specific structure is determined by the collection of these effects. According to another aspect, the application of a static magnetic field sufficiently large in magnitude has a similar effect as controlling the orientation of anisotropy by magnetizing the material such that the easy axis aligns with the applied magnetic field.

Another aspect of the invention is directed to a method of fabricating an inductor, the method comprising: forming a ferromagnetic core on a semiconductor substrate, the ferromagnetic core lying in a core plane; fabricating an inductor coil that winds around the ferromagnetic core, the inductor coil configured to generate an inductor magnetic field that passes through the ferromagnetic core in a first direction parallel to the core plane; and while forming the ferromagnetic core: generating a bias magnetic field that passes through the magnetic core in a second direction that is orthogonal to the first direction; and inducing a magnetic anisotropy in the ferromagnetic core with the bias magnetic field.

In one or more embodiments, forming the ferromagnetic core comprises: depositing a ferromagnetic material on the semiconductor substrate; and while depositing the ferromagnetic material: generating the bias magnetic field; and inducing the magnetic anisotropy in the ferromagnetic material with the bias magnetic field. In one or more embodiments, forming the ferromagnetic core further comprises defining a pattern in the ferromagnetic material. In one or more embodiments, inducing the magnetic anisotropy comprises, with the bias magnetic field, inducing an easy axis of magnetization in the ferromagnetic material, the easy axis parallel to the second direction. In one or more embodiments, inducing the magnetic anisotropy further comprises inducing a hard axis of magnetization in the ferromagnetic material, the hard axis orthogonal to the easy axis. In one or more embodiments, the hard axis is parallel to the first direction.

In one or more embodiments, the method further comprises applying current in a bias coil disposed on the substrate to generate the bias magnetic field. In one or more embodiments, the method further comprises applying at least 10 mA of current in the bias coil. In one or more embodiments, the method further comprises fabricating the bias coil on the substrate, the bias coil disposed parallel to the core plane. In one or more embodiments, the method further comprises disposing the bias coil between the ferromagnetic core and the substrate. In one or more embodiments, the method further comprises disposing the bias coil between the inductor coil and the substrate. In one or more embodiments, the inductor coil includes a top conductor, a bottom conductor, and a VIA that is electrically coupled to the top and bottom conductors, and the method further comprises disposing the bias coil between the ferromagnetic core and the bottom conductor. In one or more embodiments, the method further comprises aligning an axis of symmetry of the bias coil with a target axis of symmetry of the ferromagnetic core.

In one or more embodiments, the ferromagnetic core is formed on a first semiconductor substrate and the method further comprises: providing relative movement between the first semiconductor substrate and a second substrate having a bias coil disposed thereon such that the bias coil on the second substrate and a target location for the ferromagnetic core on the first semiconductor substrate are within a predetermined distance of one another; and generating the bias magnetic field with the bias coil. In one or more embodiments, the method further comprises applying current in the bias coil to generate the bias magnetic field. In one or more embodiments, the method further comprises applying at least 10 mA of current in the bias coil.

In one or more embodiments, the relative movement between the first semiconductor substrate and the second substrate results in a relative positioning thereof in which the first semiconductor substrate and the second substrate are in contact with one another. In one or more embodiments, the relative movement between the first substrate and the second substrate aligns the bias coil and a target location for the ferromagnetic core.

Yet another aspect of the invention is directed to a method of fabricating an inductor, the method comprising: forming a ferromagnetic core on a semiconductor substrate, the ferromagnetic core lying in a core plane; fabricating an inductor coil that winds around the ferromagnetic core, the inductor coil configured to generate an inductor magnetic field that passes through the ferromagnetic core in a first direction parallel to the core plane; and while forming the ferromagnetic core: with a bias permanent magnet, producing a bias magnetic field that passes through the magnetic core in a second direction that is orthogonal to the first direction; and inducing a magnetic anisotropy in the ferromagnetic core with the bias magnetic field.

In one or more embodiments, the method further comprises forming the bias permanent magnet on the semiconductor substrate. In one or more embodiments, the method further comprises disposing the bias permanent magnet between the ferromagnetic core and the semiconductor substrate. In one or more embodiments, the method further comprises disposing the bias permanent magnet between the inductor coil and the semiconductor substrate. In one or more embodiments, the inductor coil includes a top conductor, a bottom conductor, and a VIA that is electrically coupled to the top and bottom conductors, and the method further comprises disposing the bias permanent magnet between the ferromagnetic core and the bottom conductor.

In one or more embodiments, the method further comprises aligning an axis of symmetry of the bias permanent magnet with a target axis of symmetry of the ferromagnetic core. In one or more embodiments, the ferromagnetic core is formed on a first semiconductor substrate and the method further comprises: providing relative movement between the first semiconductor substrate and a second substrate having the bias permanent magnet disposed thereon such that the bias permanent magnet on the second substrate and a target location for the ferromagnetic core on the first semiconductor substrate are within a predetermined distance of one another; and generating the bias magnetic field with the bias permanent magnet. In one or more embodiments, the method further comprises forming the bias permanent magnet on the second substrate. In one or more embodiments, the relative movement between the first substrate and the second substrate results in a relative positioning thereof in which the first semiconductor substrate and the second substrate are in contact with one another. In one or more embodiments, the relative movement between the first semiconductor substrate and the second substrate aligns the bias coil and the target location for the ferromagnetic core.

In one or more embodiments, forming the ferromagnetic core comprises: depositing a ferromagnetic material on the semiconductor substrate; and while depositing the ferromagnetic material: producing the bias magnetic field; and inducing the magnetic anisotropy in the ferromagnetic material with the bias magnetic field. In one or more embodiments, forming the ferromagnetic core further comprises defining a pattern in the ferromagnetic material. In one or more embodiments, the method further comprises placing a shadow mask on the semiconductor substrate, the shadow mask comprising the bias permanent magnet; and depositing the ferromagnetic material on the shadow mask, the shadow mask defining the pattern in the ferromagnetic material.

In one or more embodiments, forming the ferromagnetic core further comprises, with the bias magnetic field, inducing an easy axis of magnetization in the ferromagnetic material, the easy axis parallel to the second direction. In one or more embodiments, forming the ferromagnetic core further comprises inducing a hard axis of magnetization in the ferromagnetic material, the hard axis orthogonal to the easy axis. In one or more embodiments, the hard axis is parallel to the first direction.

Another aspect of the invention is directed to a method of fabricating a planar magnetic core, the method comprising: depositing a ferromagnetic material on a semiconductor substrate; and while depositing the ferromagnetic material: generating a bias magnetic field that passes through the magnetic ferromagnetic material in a first direction; and inducing a magnetic anisotropy in the ferromagnetic material, with the bias magnetic field; and defining a pattern in the ferromagnetic material to form the planar magnetic core, the planar magnetic core having the magnetic anisotropy.

In one or more embodiments, inducing the magnetic anisotropy comprises inducing an easy axis of magnetization in the ferromagnetic material, the easy axis parallel to the first direction. In one or more embodiments, inducing the magnetic anisotropy further comprises inducing a hard axis of magnetization in the ferromagnetic material, the hard axis orthogonal to the easy axis.

In one or more embodiments, the method further comprises placing a shadow mask on the semiconductor substrate, the shadow mask comprising the bias permanent magnet; and depositing the ferromagnetic material on the shadow mask, the shadow mask defining the pattern in the ferromagnetic material.

In the Drawings

Figure 6:
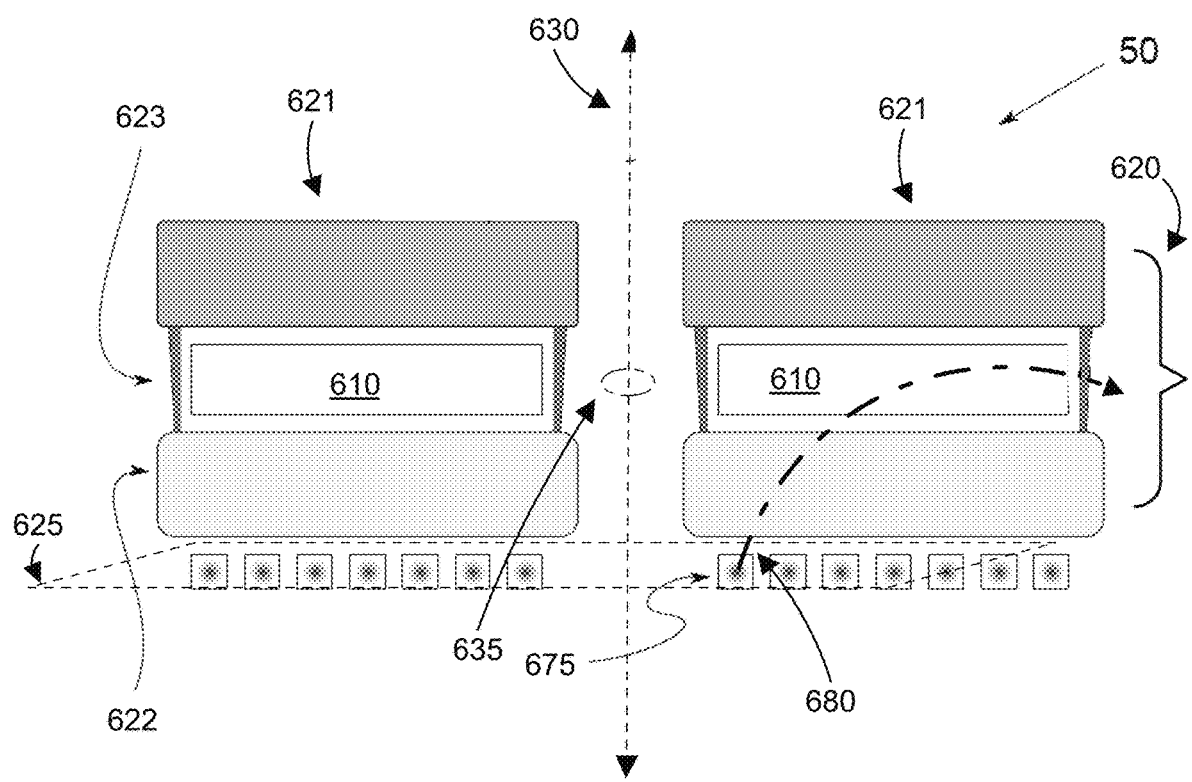
Figure 7:
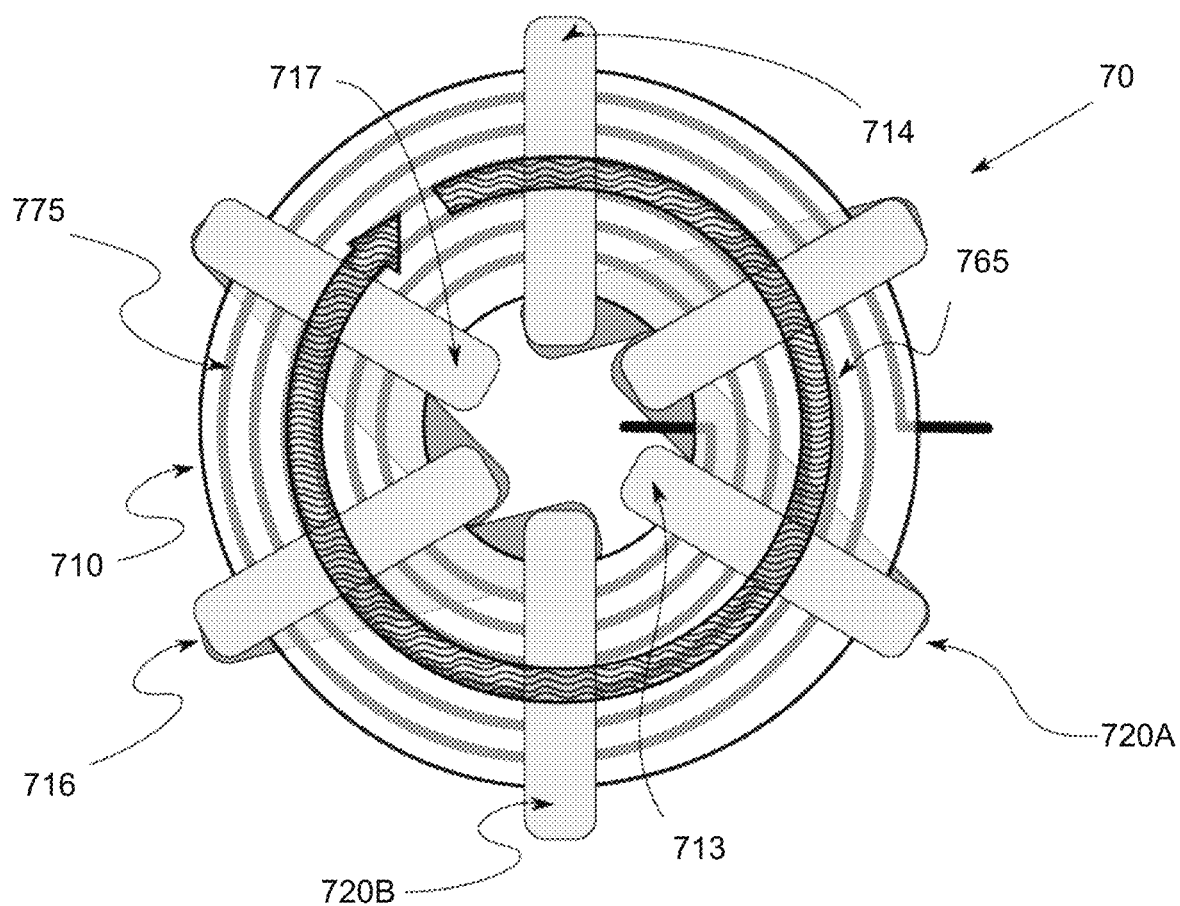
Figure 8:
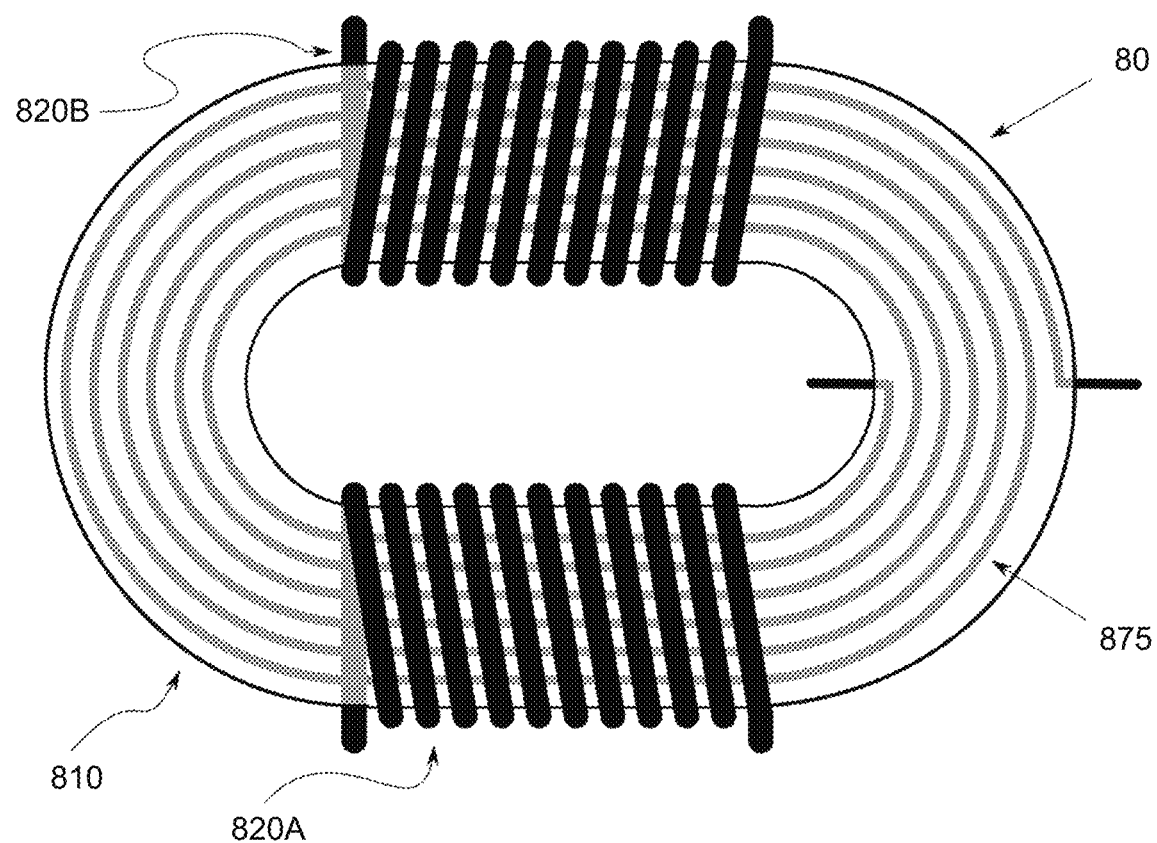
Figure 9:
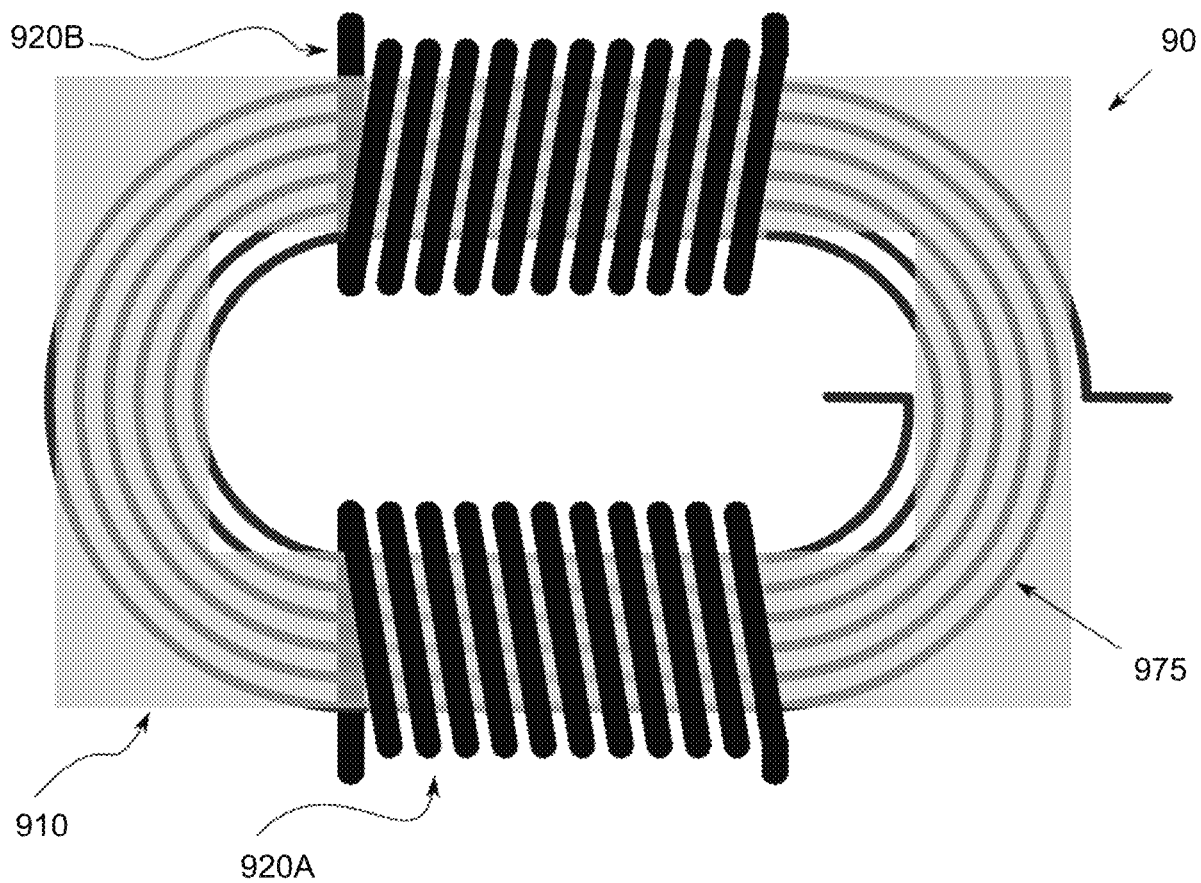
Figure 10:
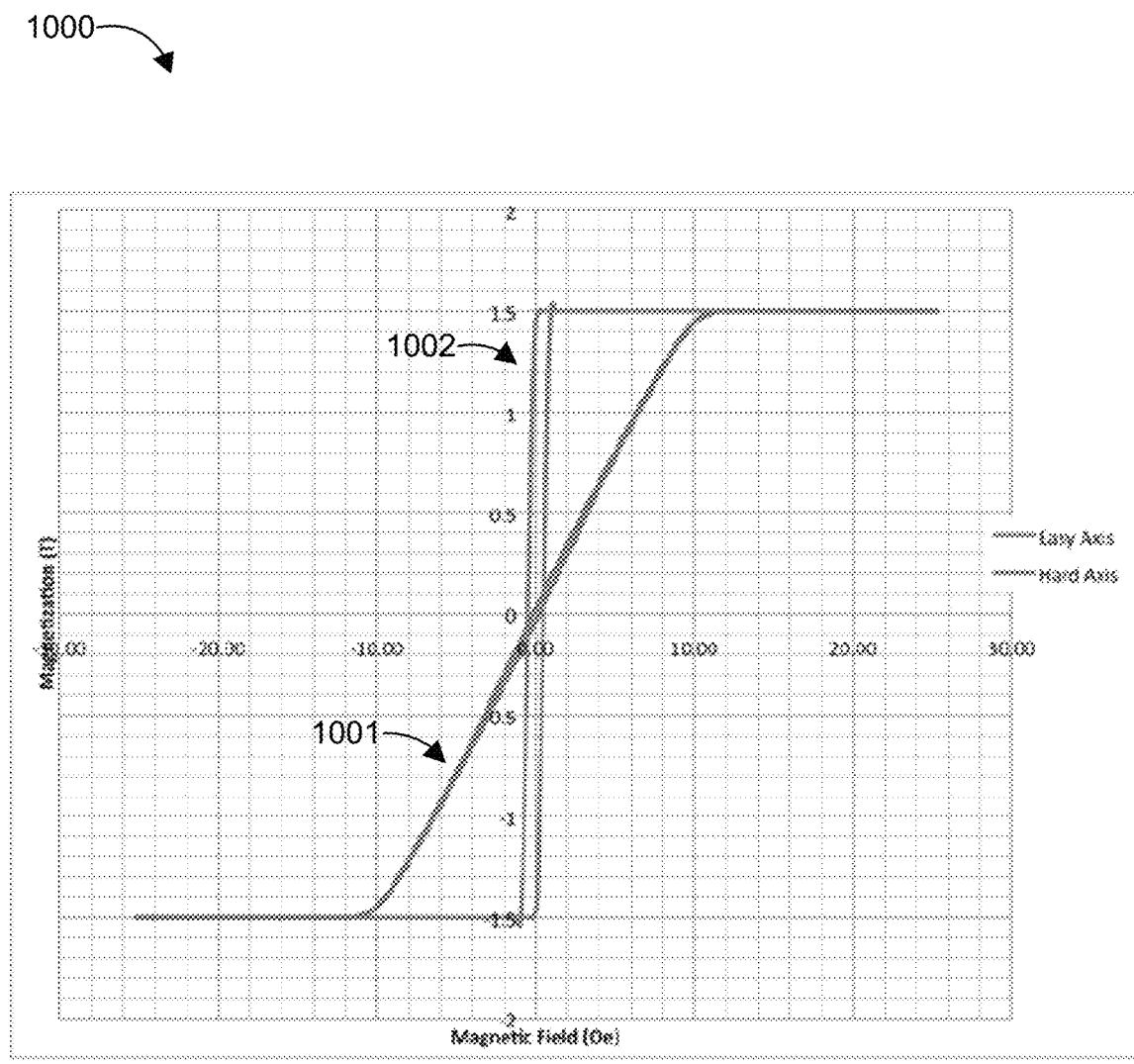
Figure 11:
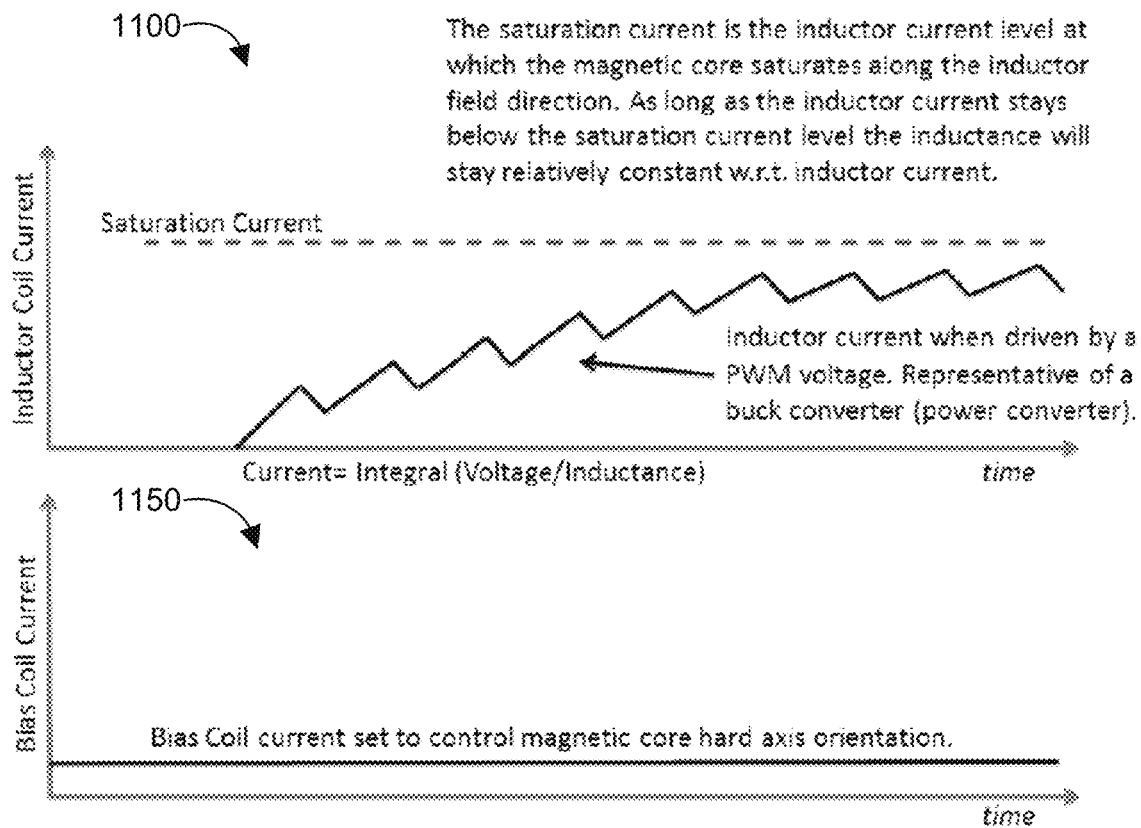
Figure 12:
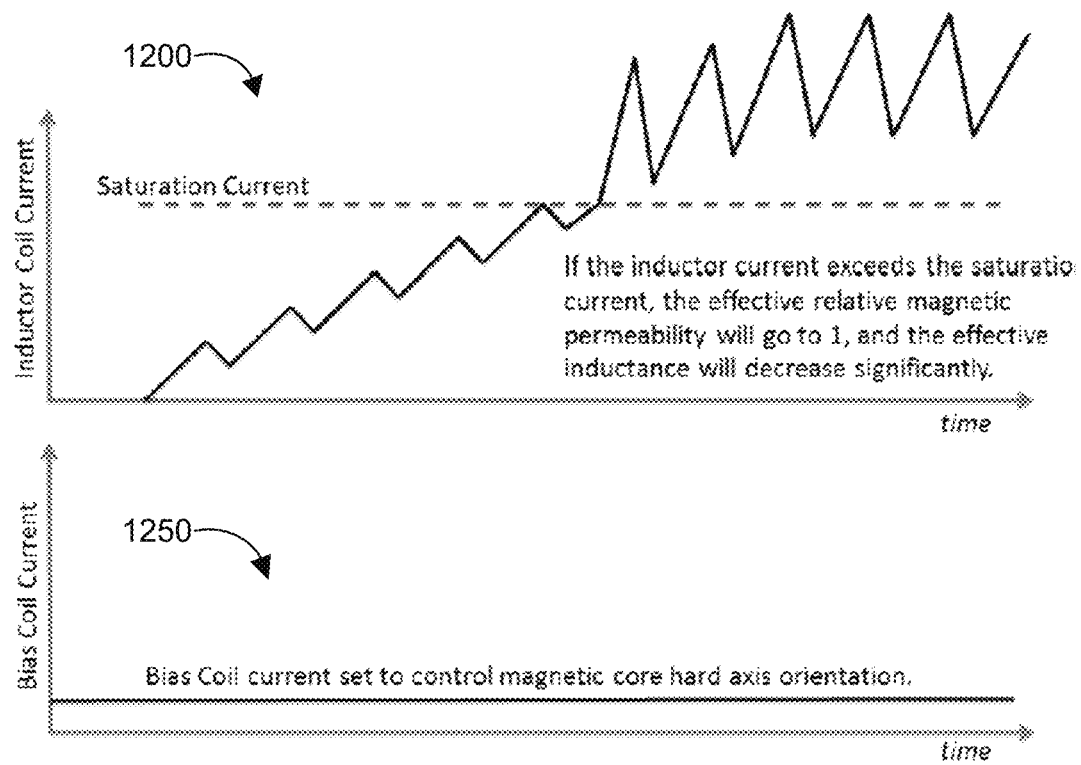
Figure 13:
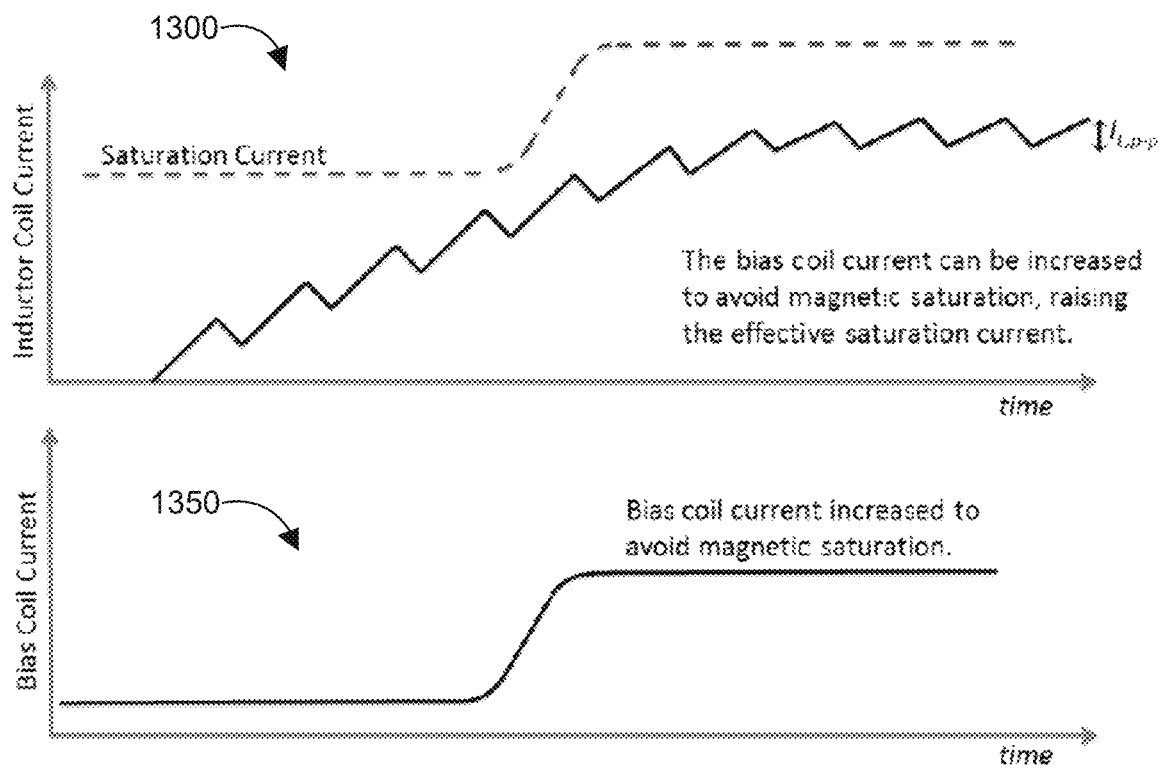
Figure 14:
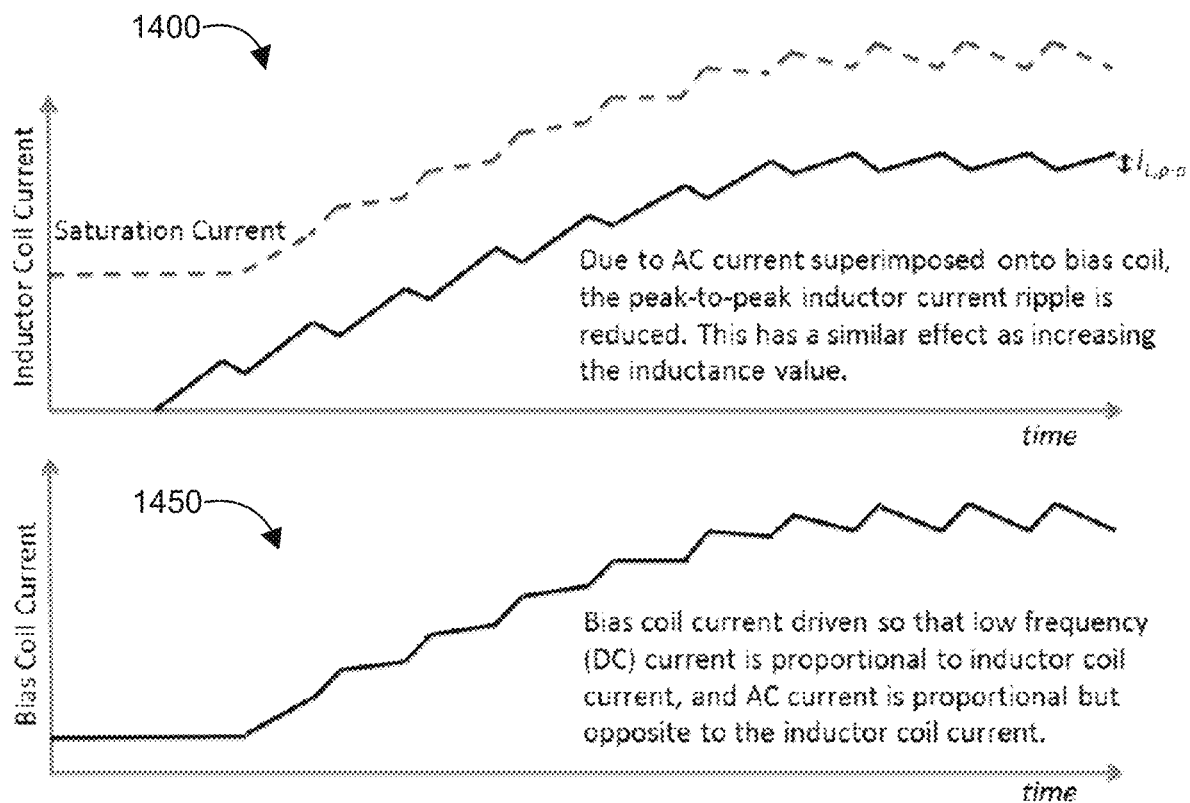
Figure 15:
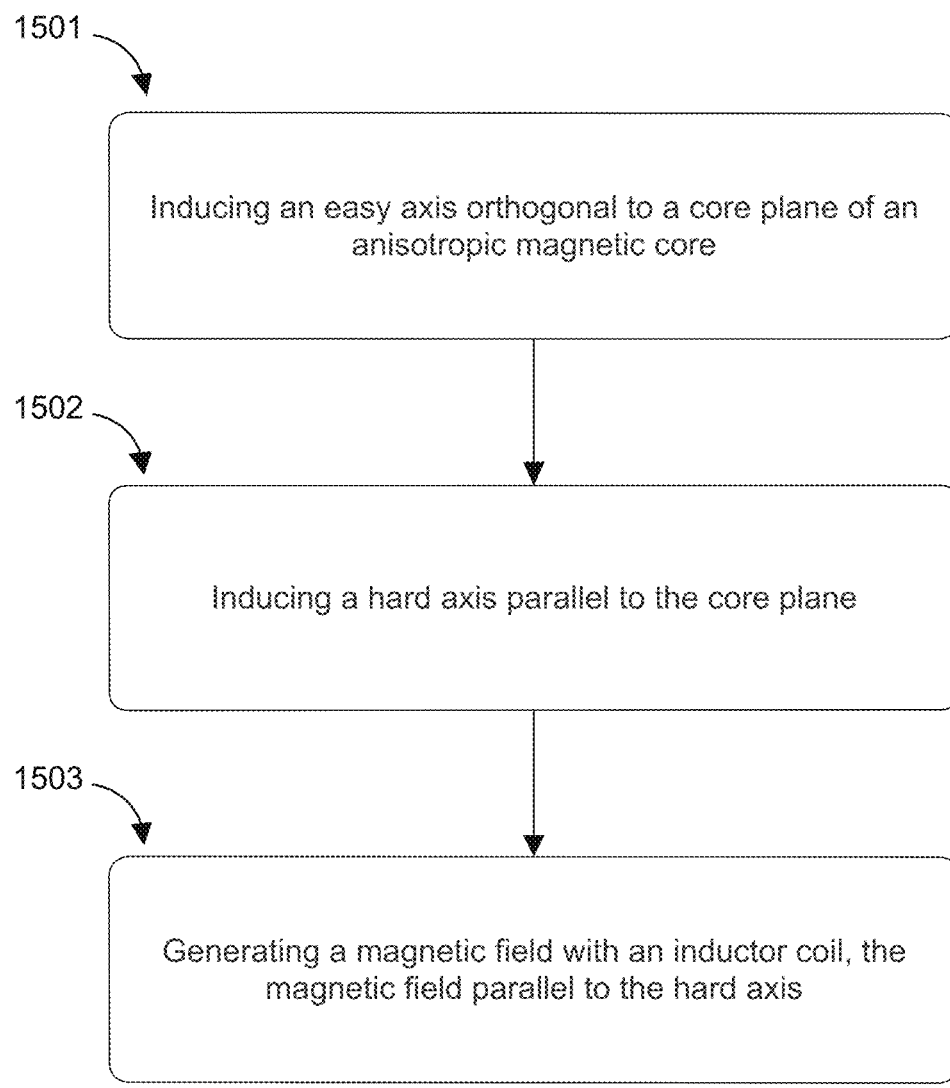

FIG. 6 portrays a side-view of an exemplary toroidal inductor with anisotropic magnetic core and integrated biasing coil;

FIG. 7 depicts a top-view of an exemplary toroidal mutual inductor with anisotropic magnetic core and integrated biasing coil;

FIG. 8 depicts a top-view of an exemplary race-track mutual inductor with anisotropic magnetic core and integrated biasing coil;

FIG. 9 depicts a top-view of an exemplary rectangular mutual inductor with anisotropic magnetic core and integrated biasing coil;

FIG. 10 graphically illustrates the juxtaposition of hysteresis loops for the hard and soft axes in a soft ferromagnetic material;

FIG. 11 is a graphical abstraction of a magnetic anisotropic inductor below a saturation current condition;

FIG. 12 is a graphical abstraction of a magnetic anisotropic inductor above a saturation current condition;

FIG. 13 is a graphical abstraction that illustrates the saturation current increasing over time as the bias coil current increases;

FIG. 14 is a graphical abstraction that illustrates the saturation current increasing over time as the inductor coil current increases;

FIG. 15 is a flow chart of a method for operating an inductor assembly

Figure 16:
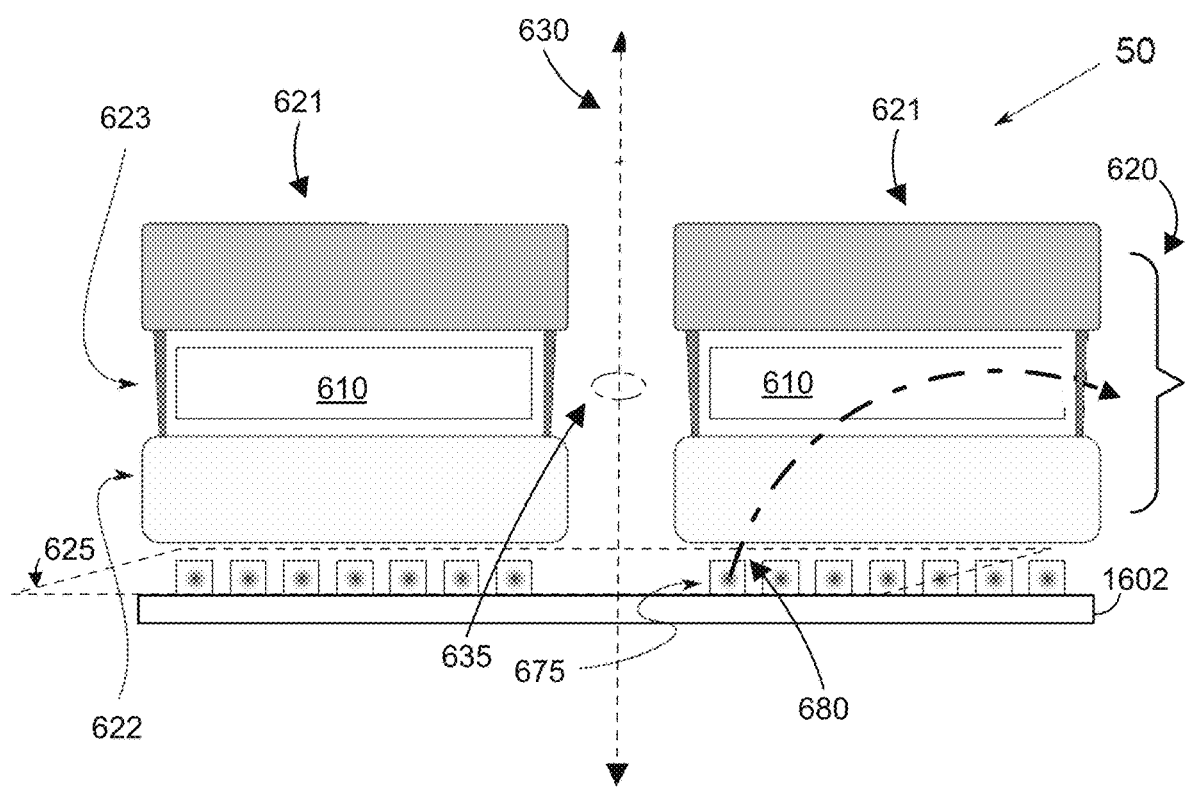
Figure 17:
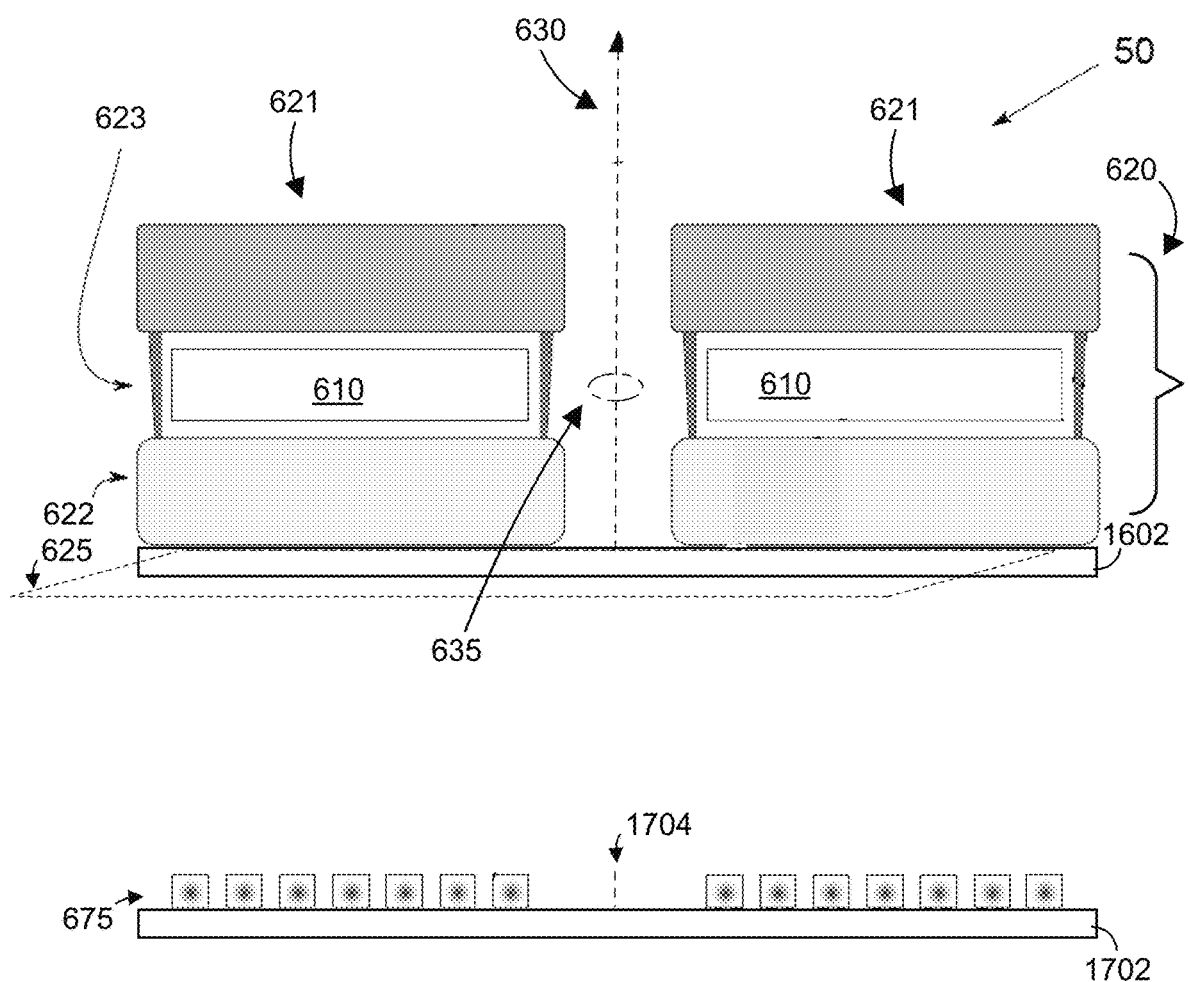
Figure 18:
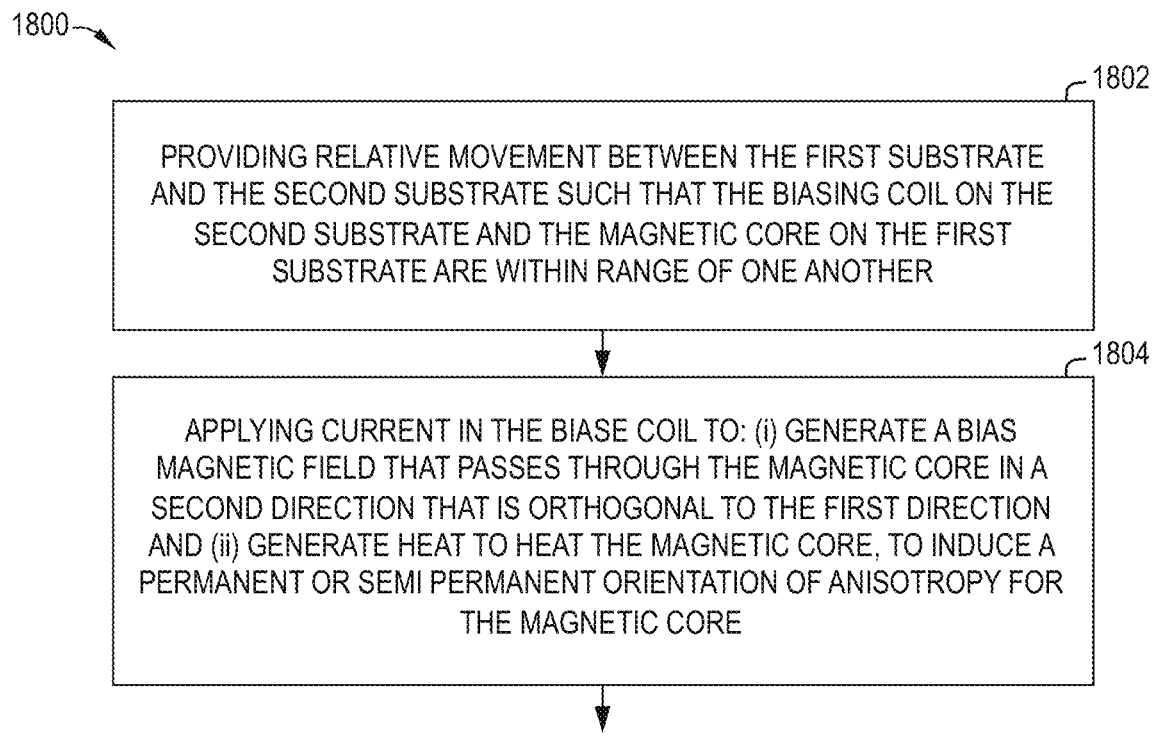
Figure 19:
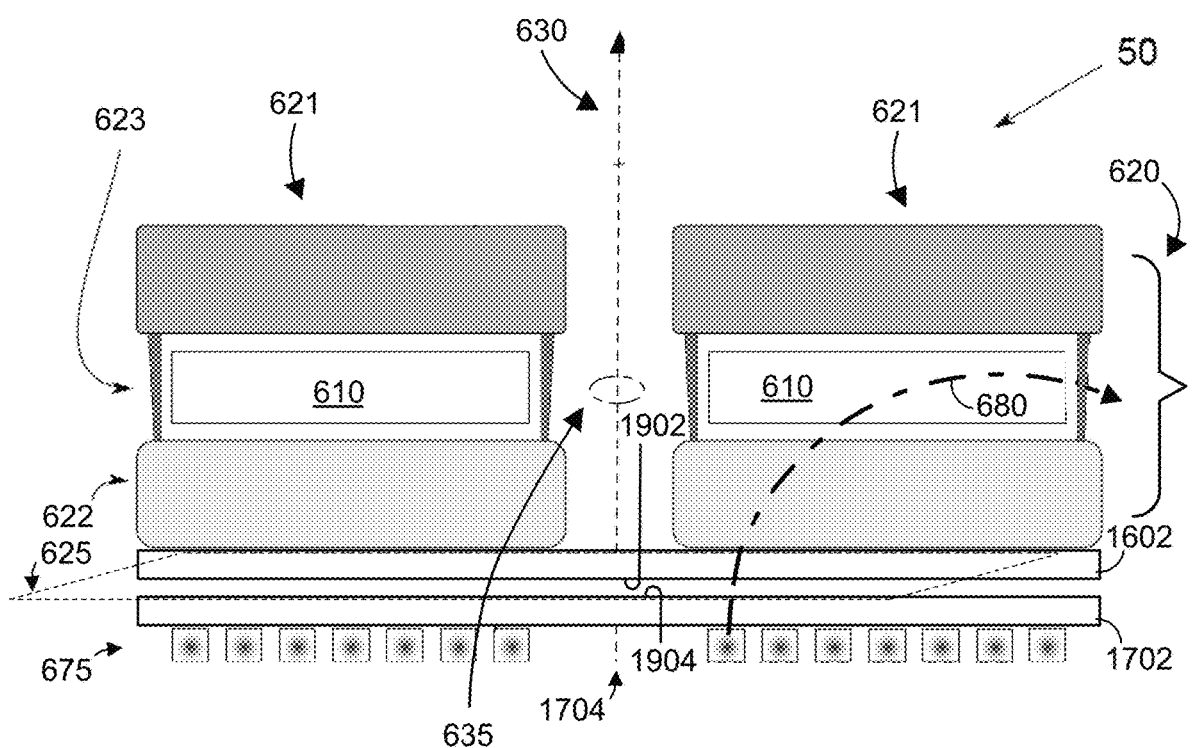
Figure 20:
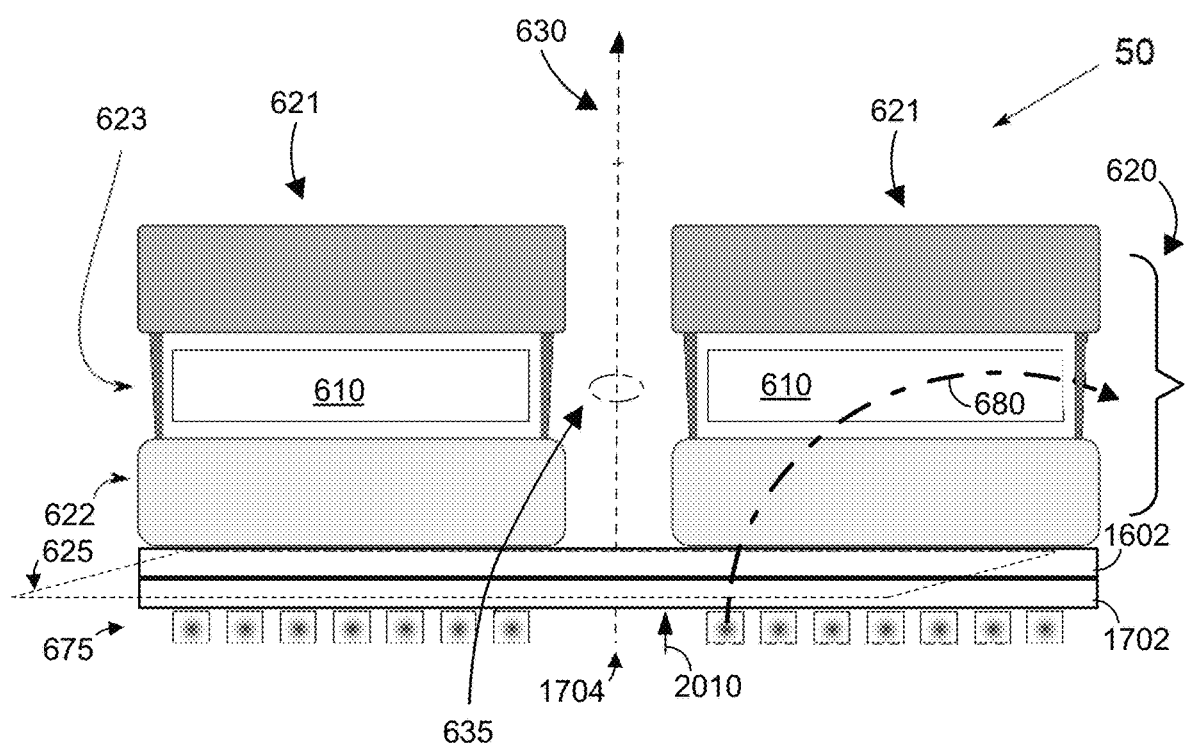
Figure 21:
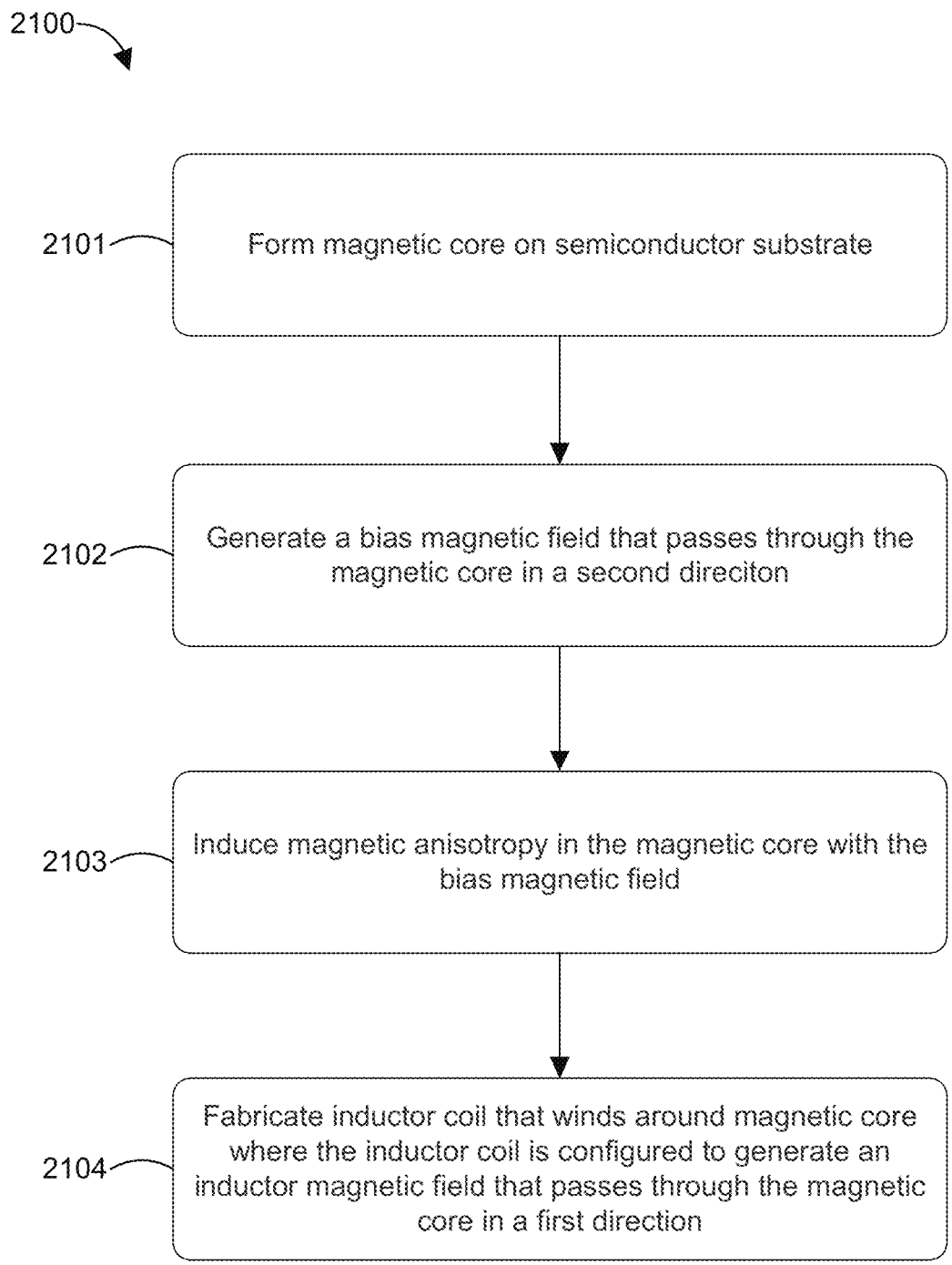
Figure 22:
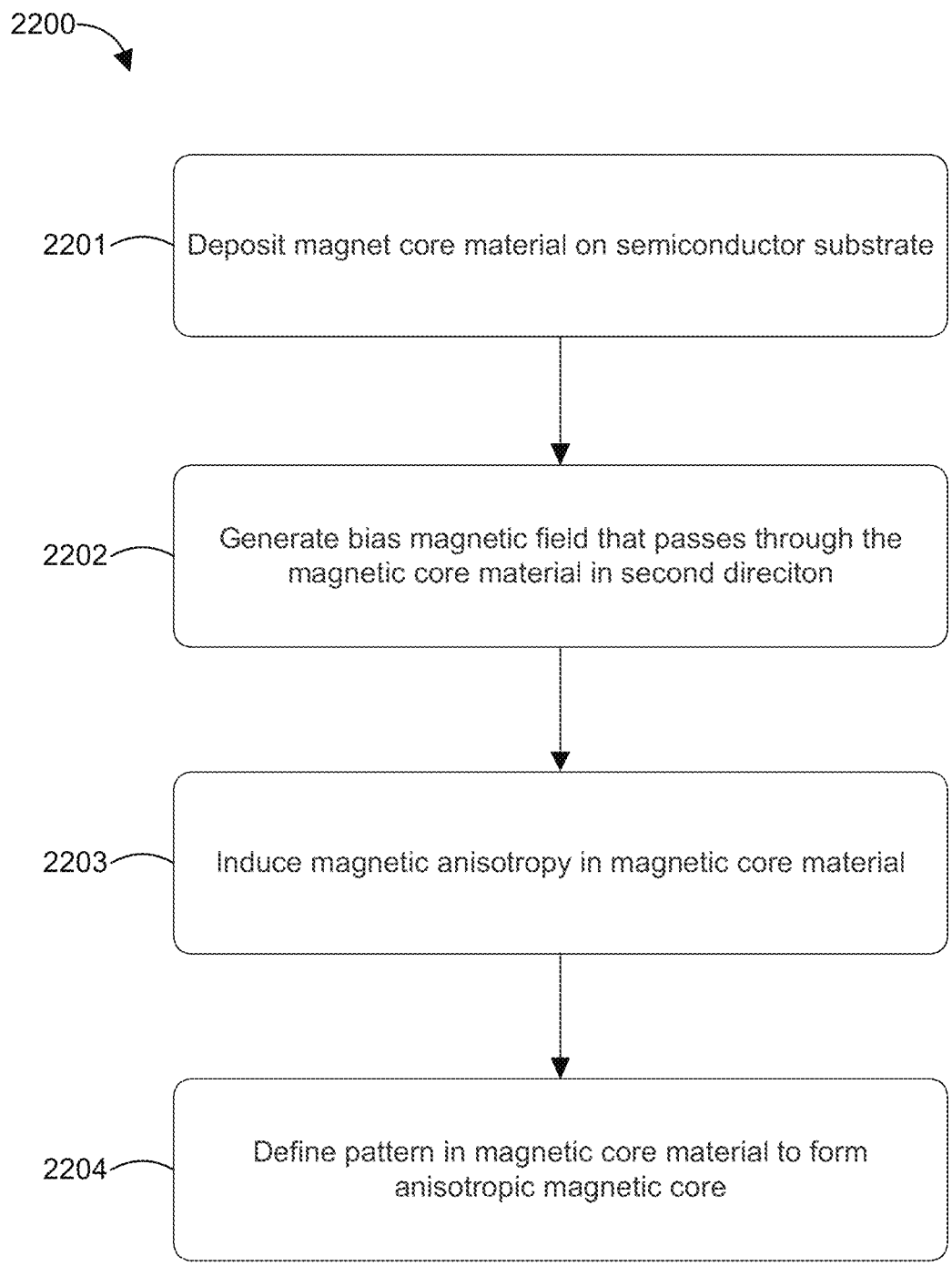
Figure 23:
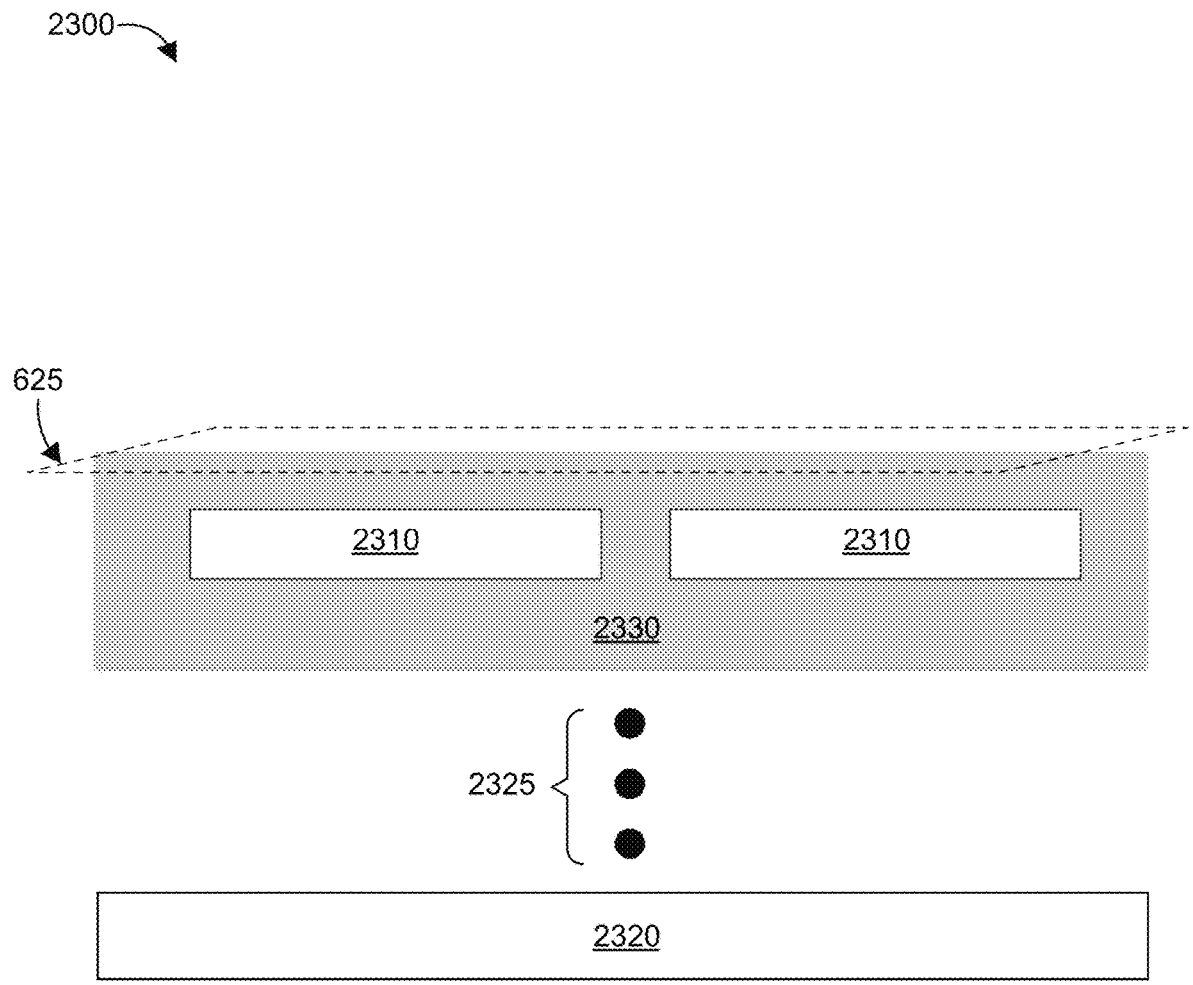
Figure 24:
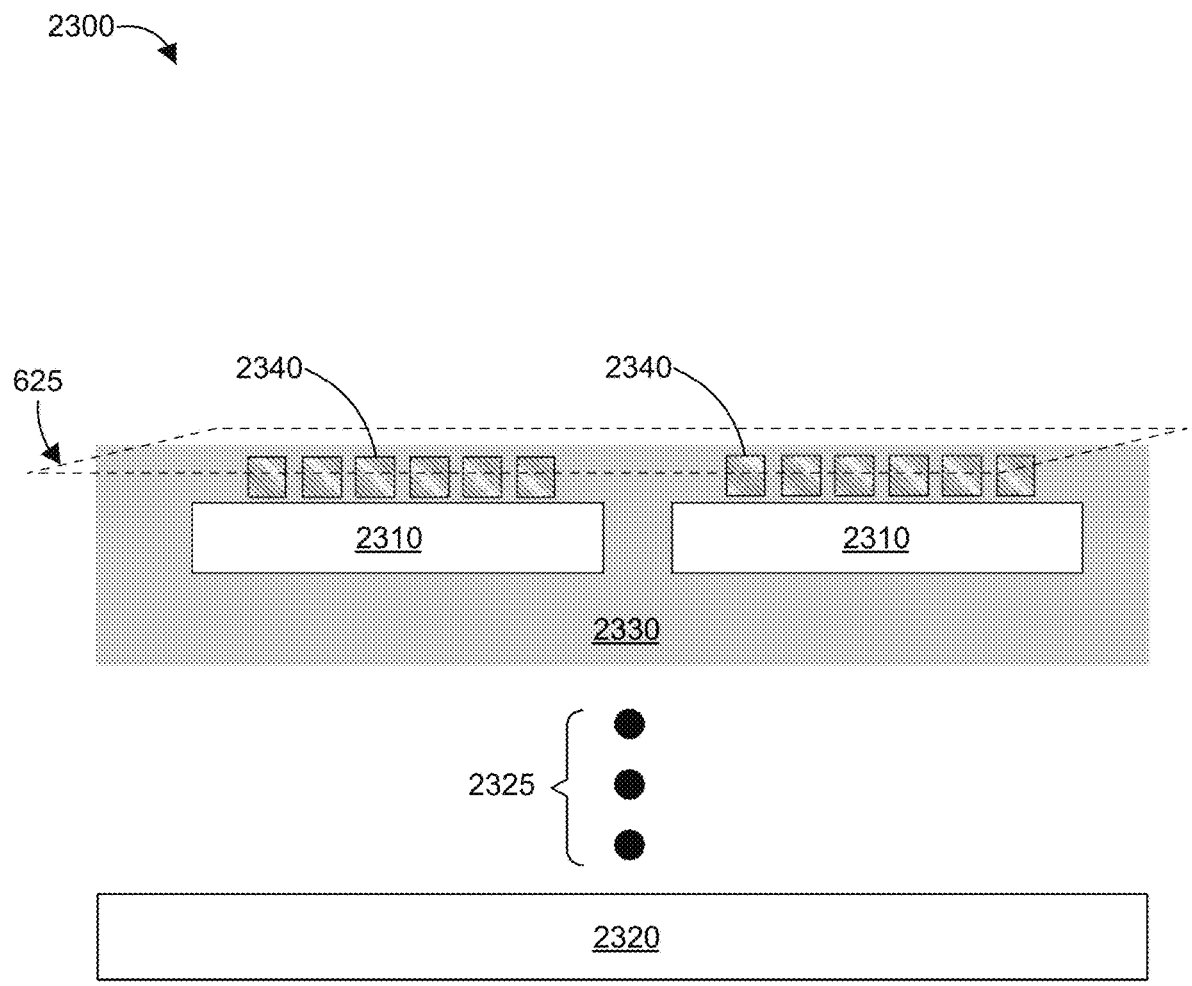
Figure 25:
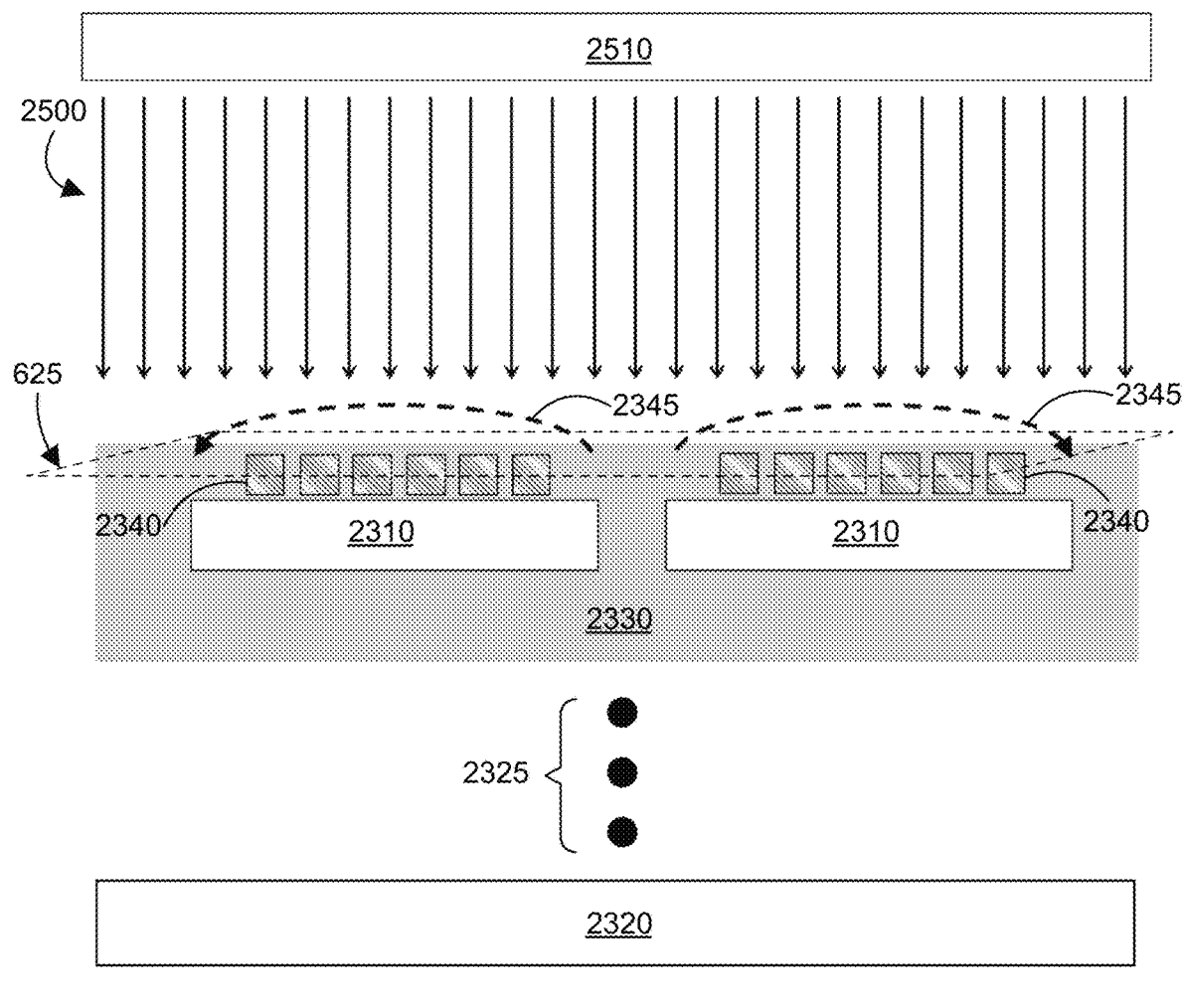
Figure 26:
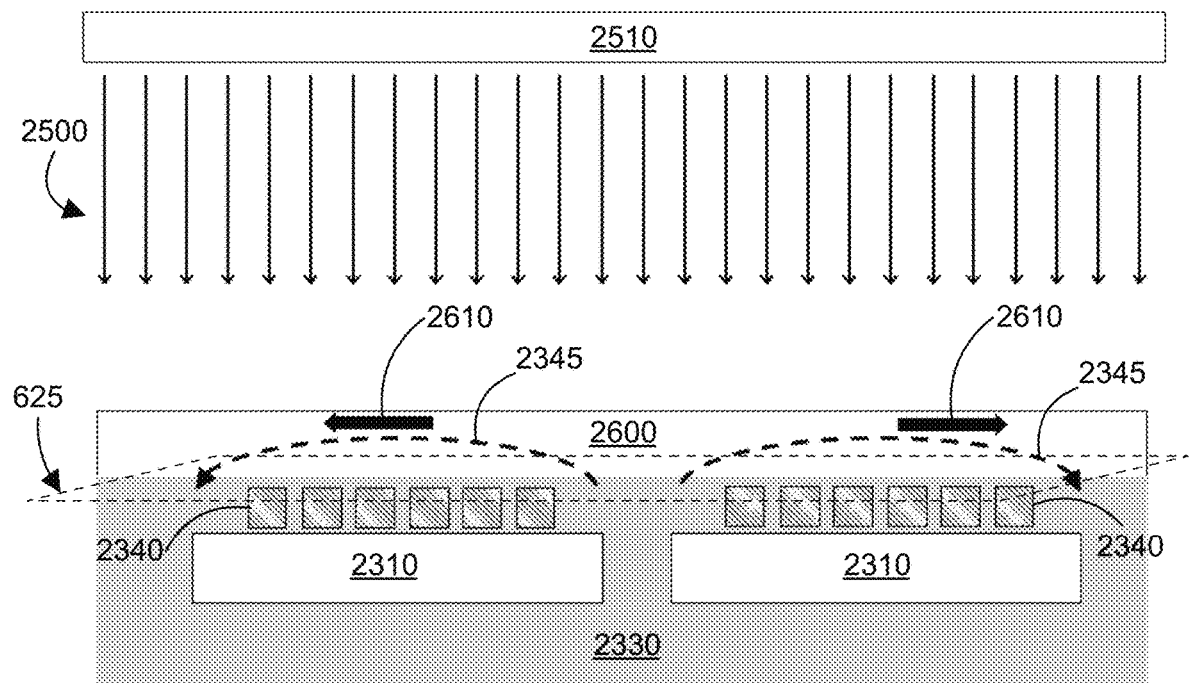
Figure 27:
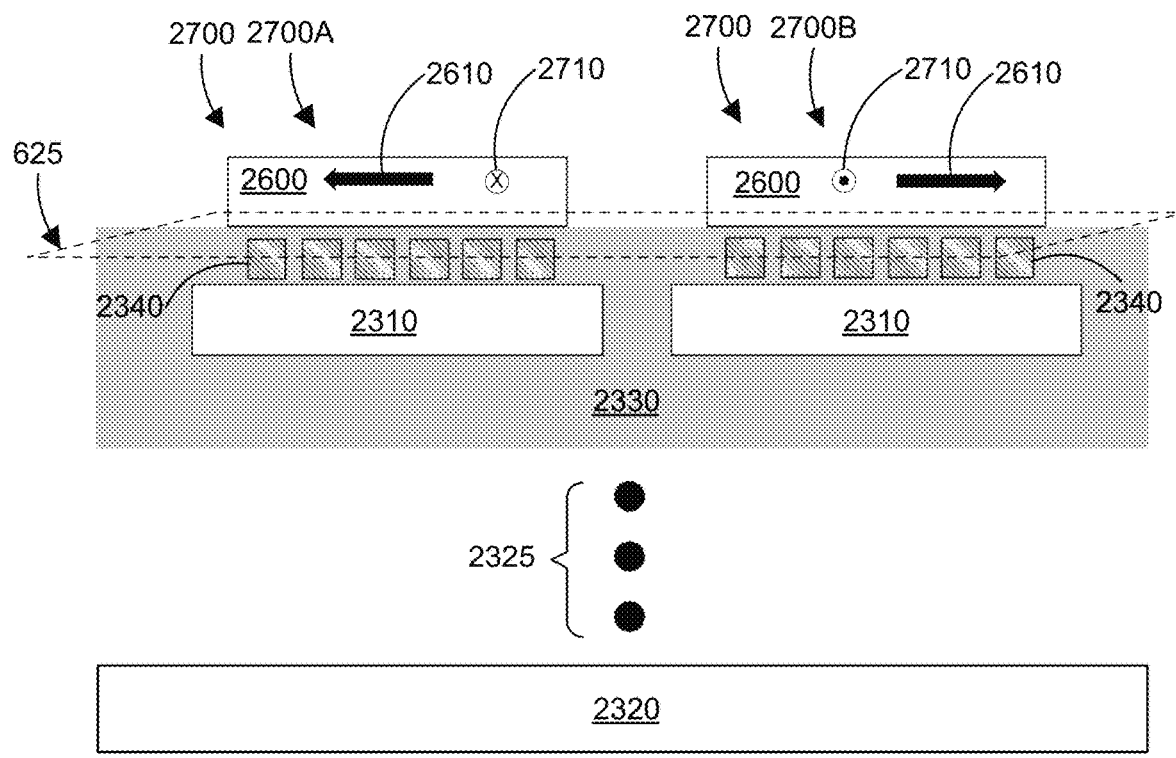
Figure 28:
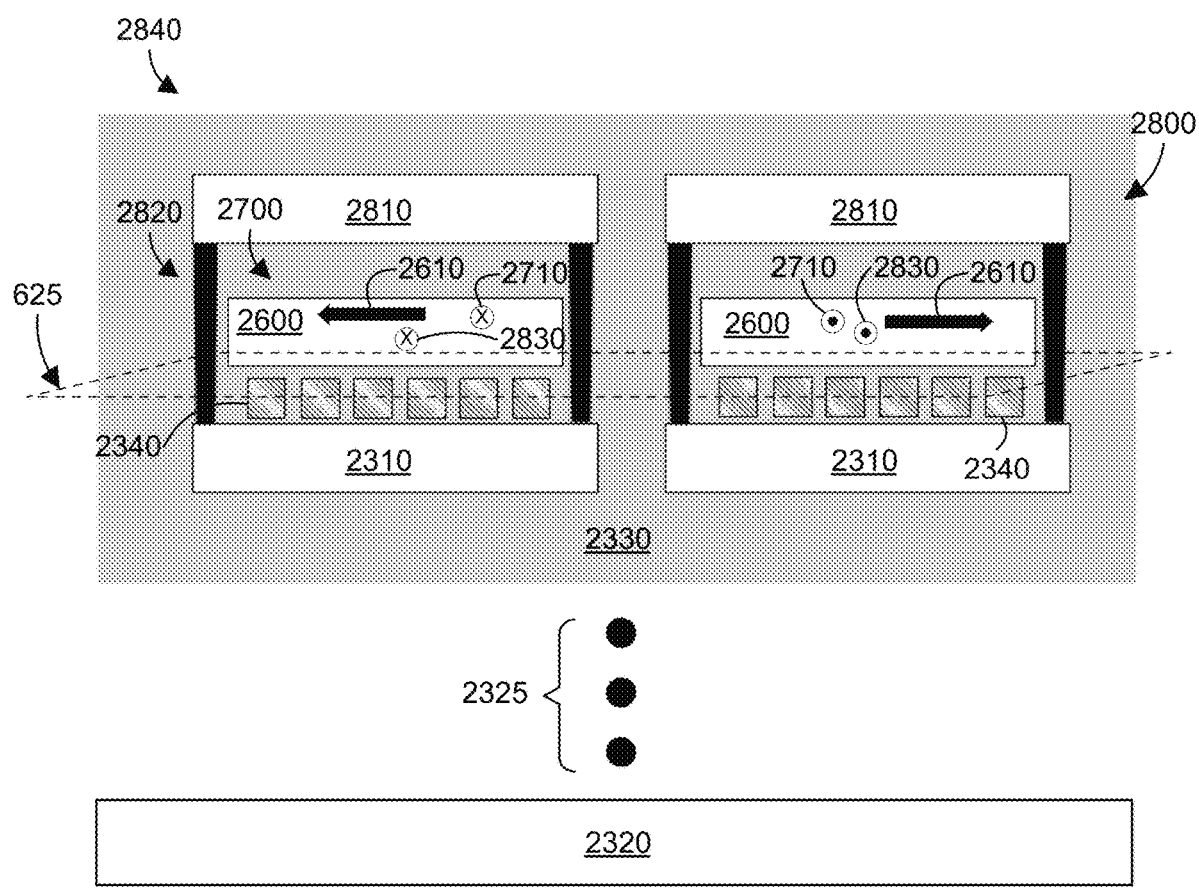
Figure 29:
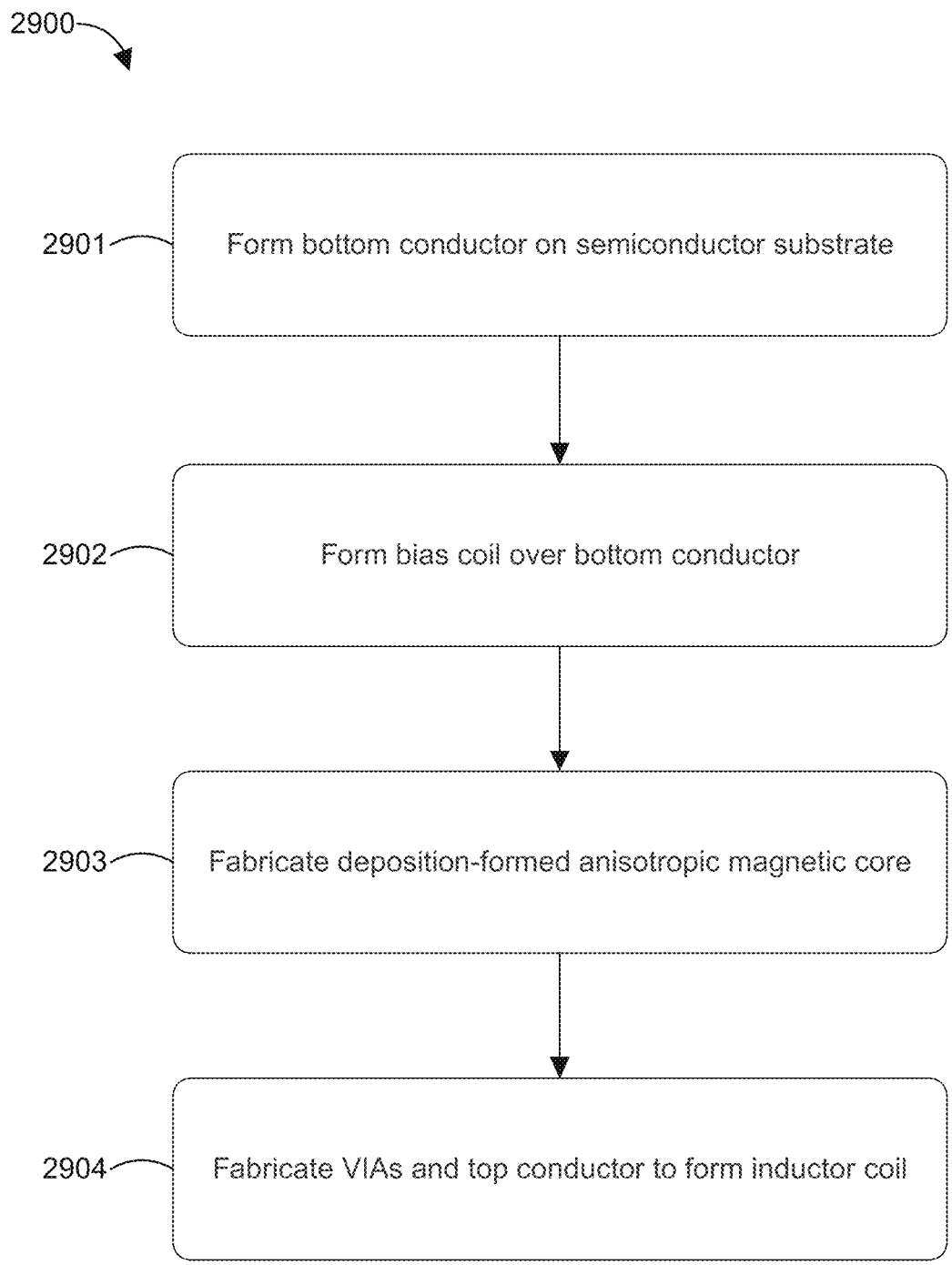
Figure 30:
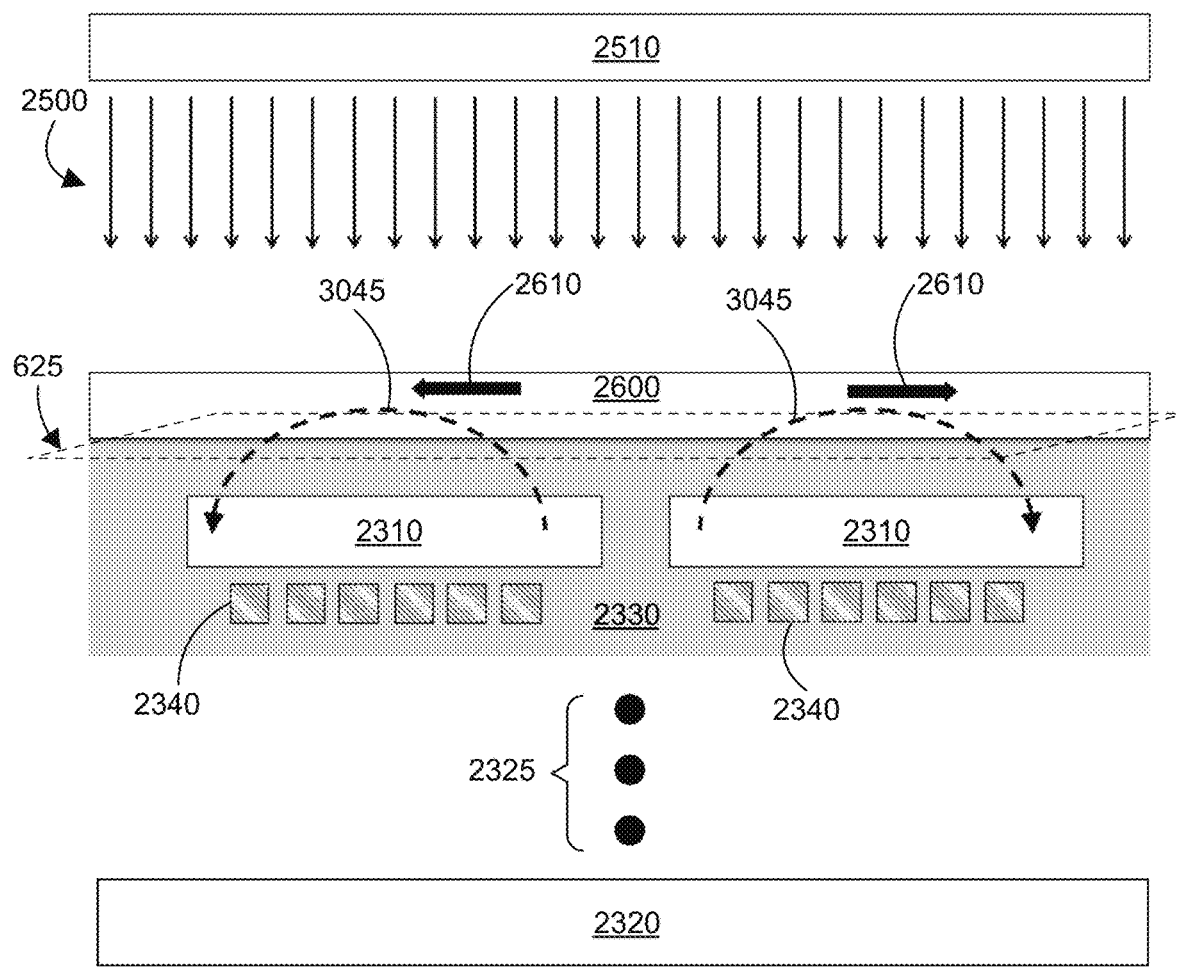
Figure 31:
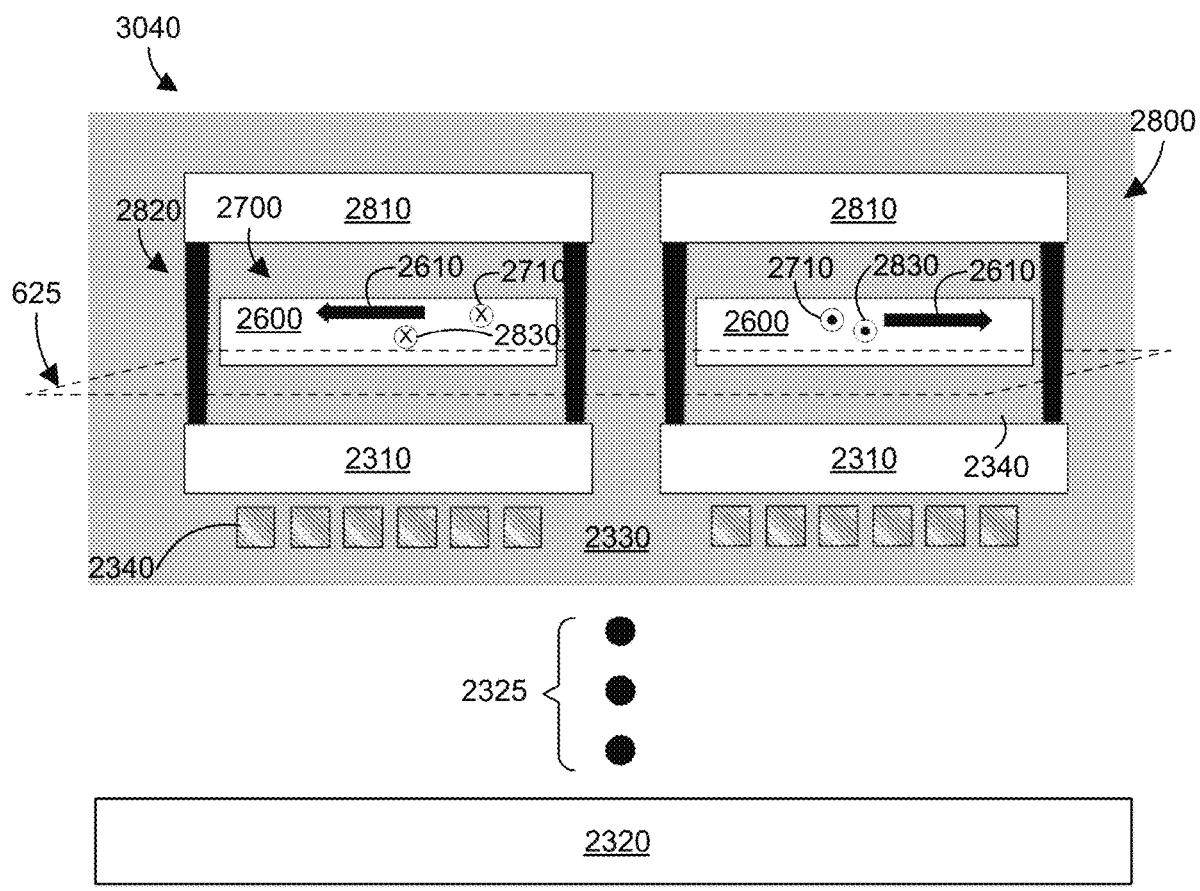
Figure 32:
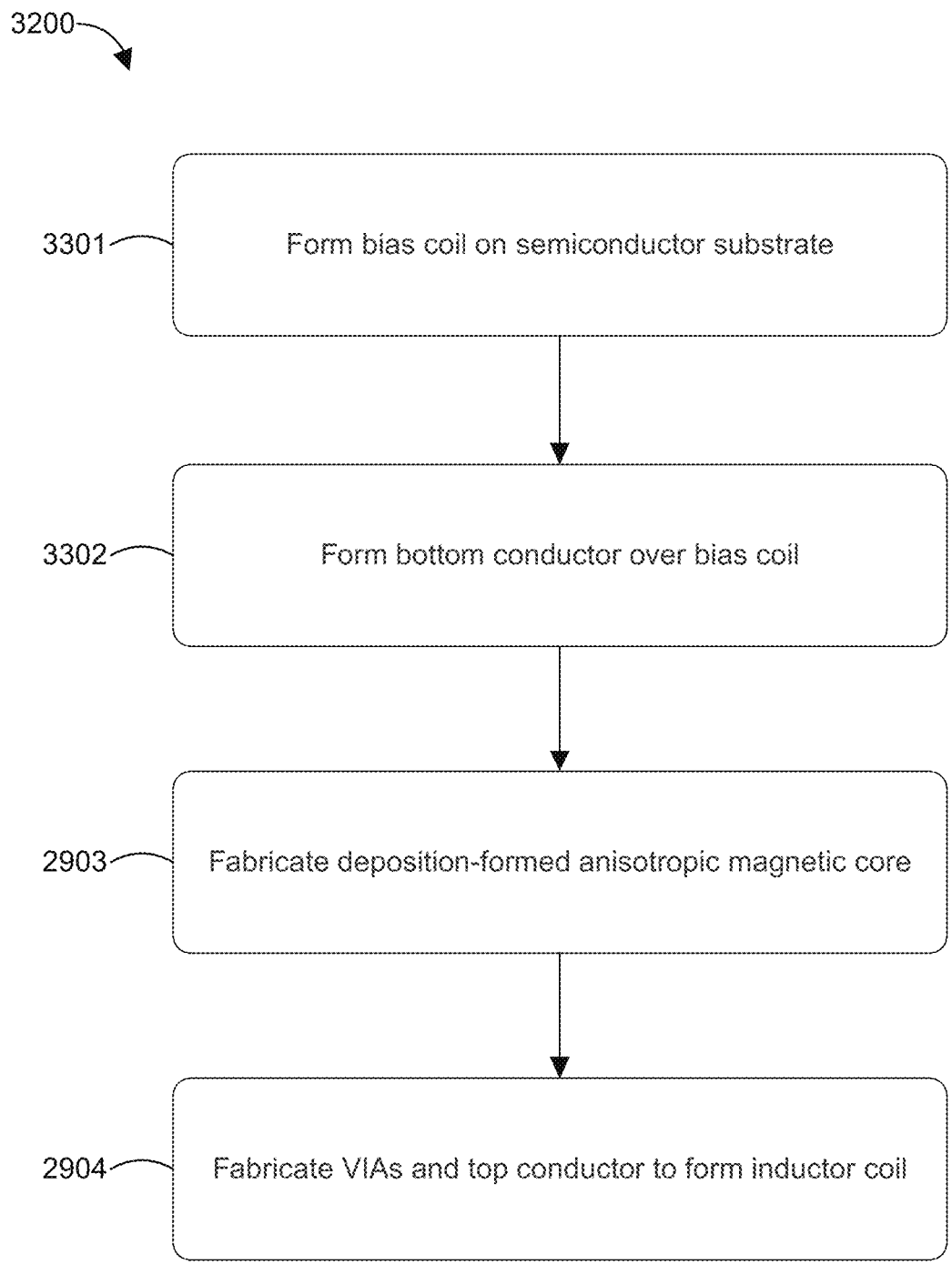
Figure 33:
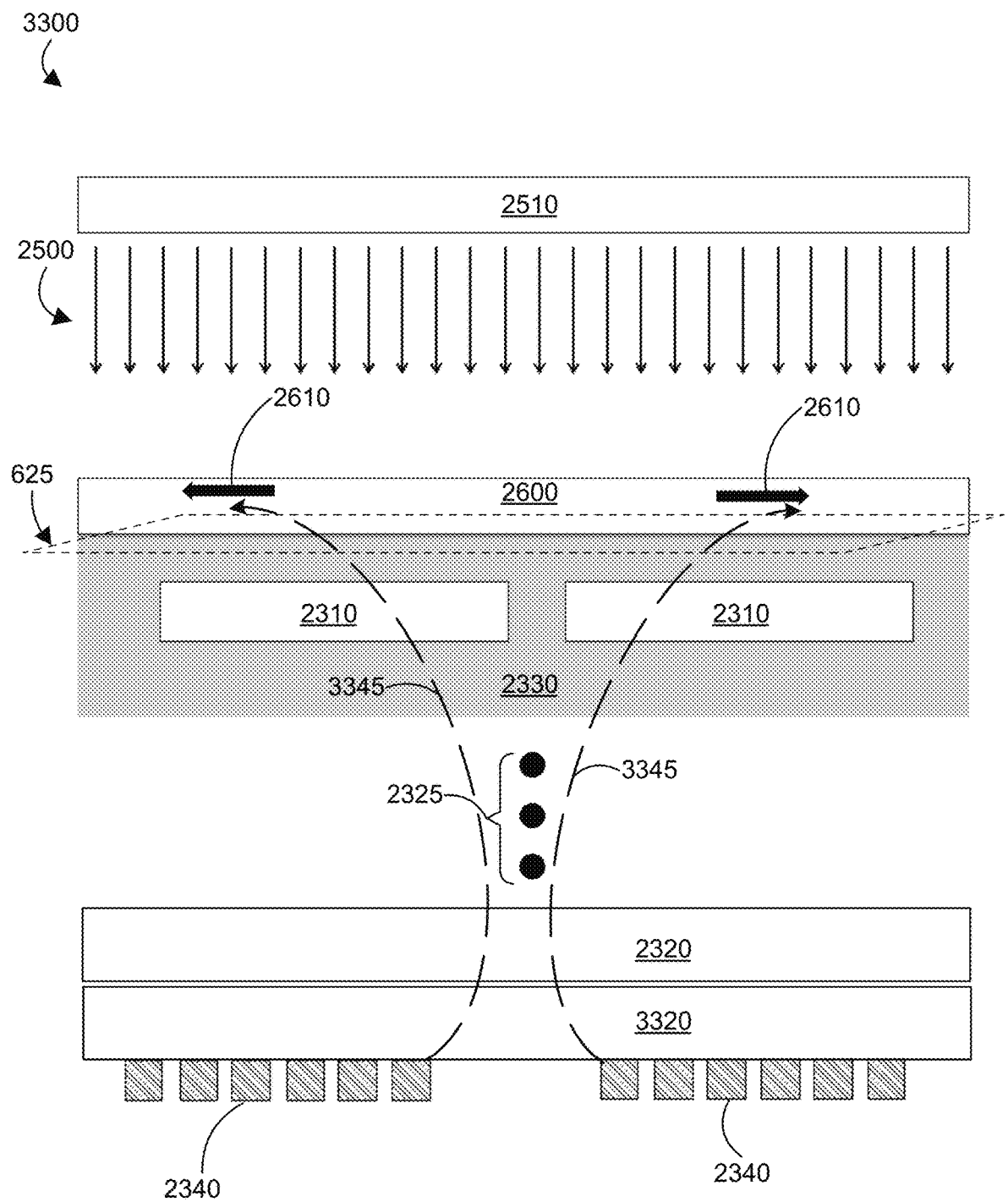
Figure 34:
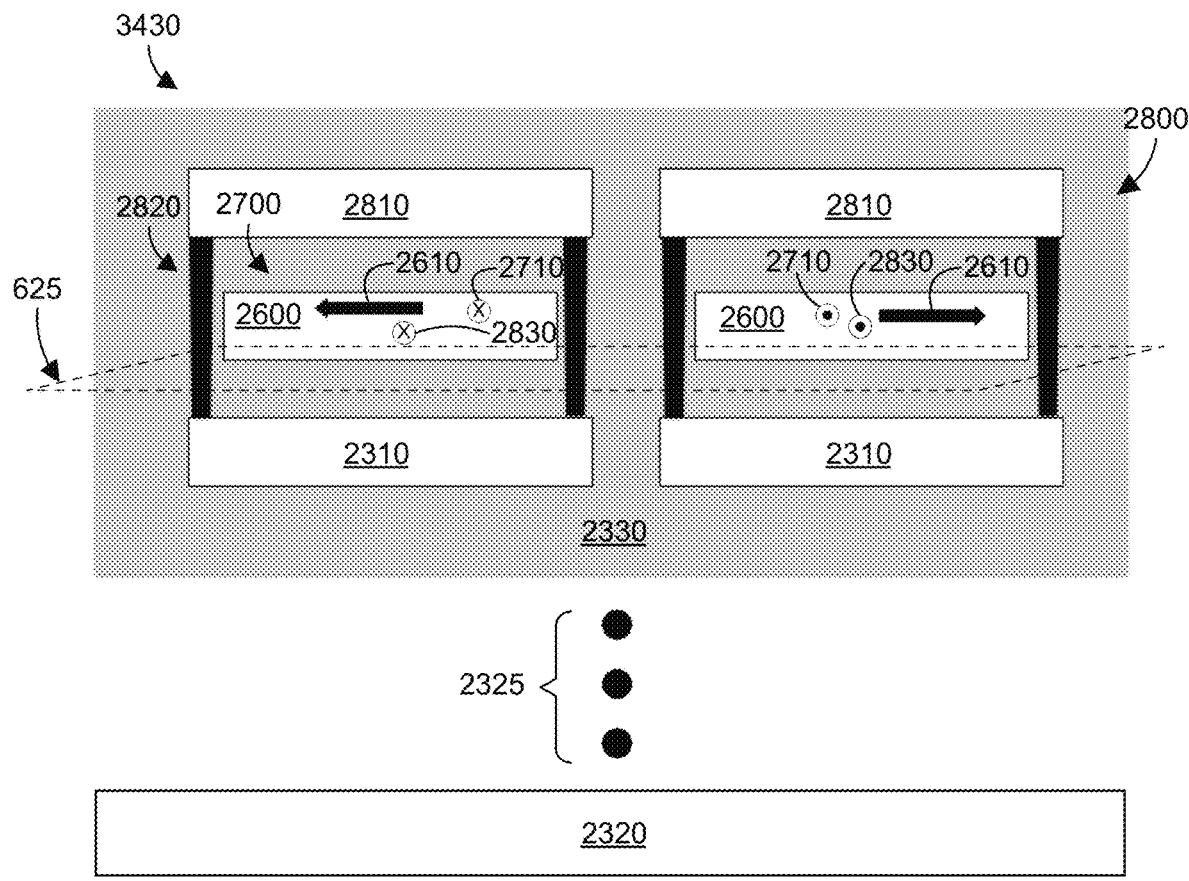
Figure 35:
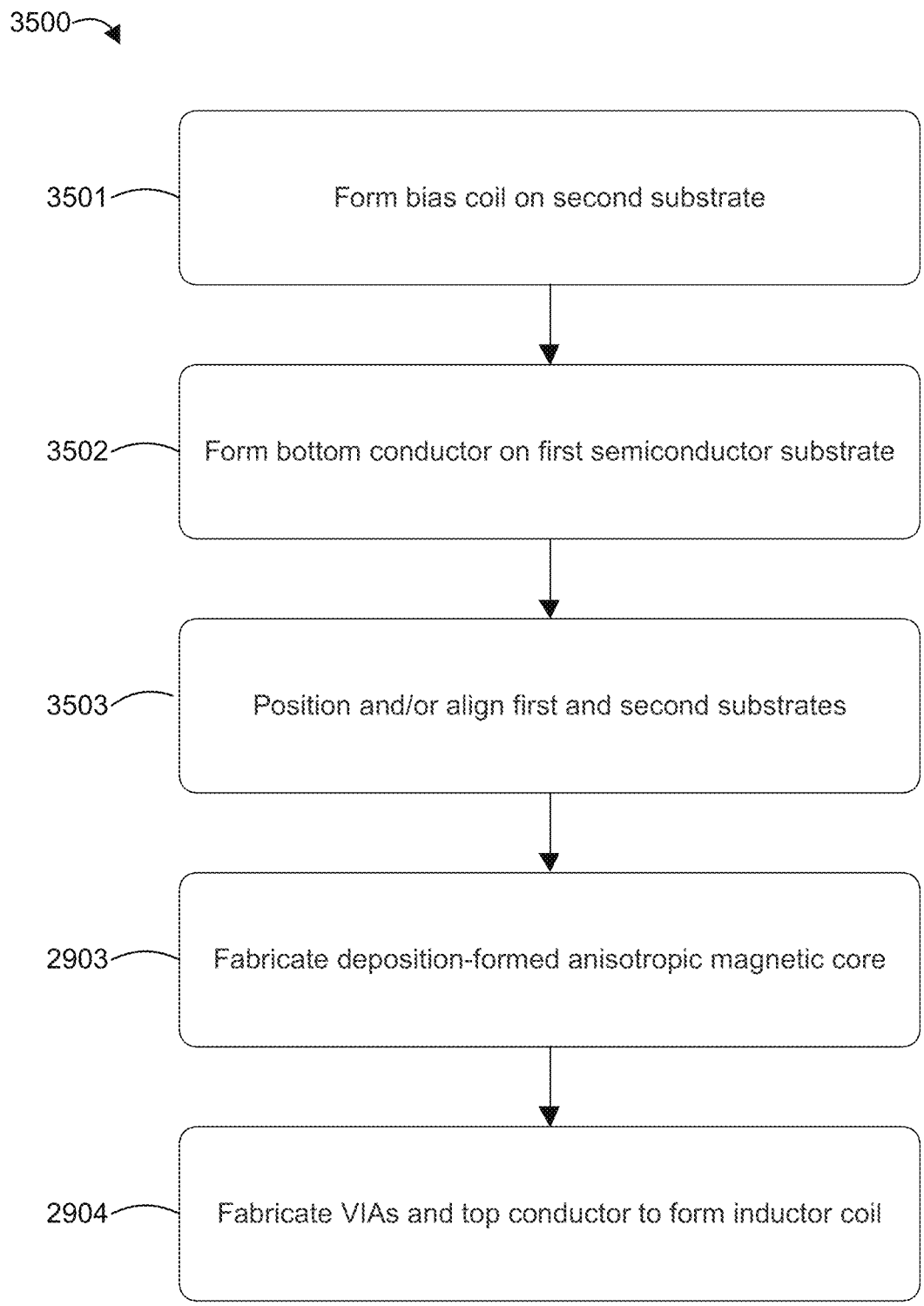
Figure 36:
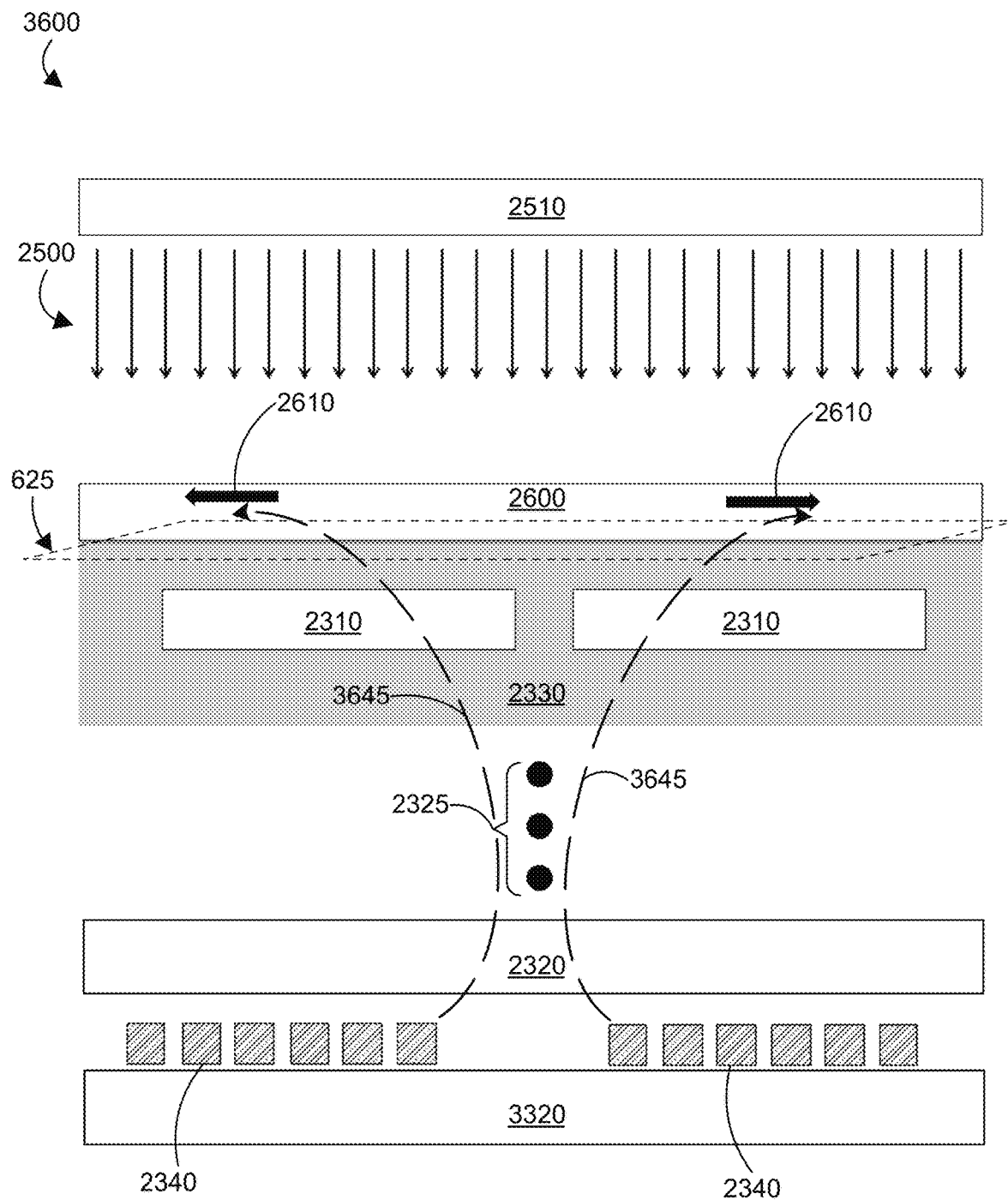
Figure 37:
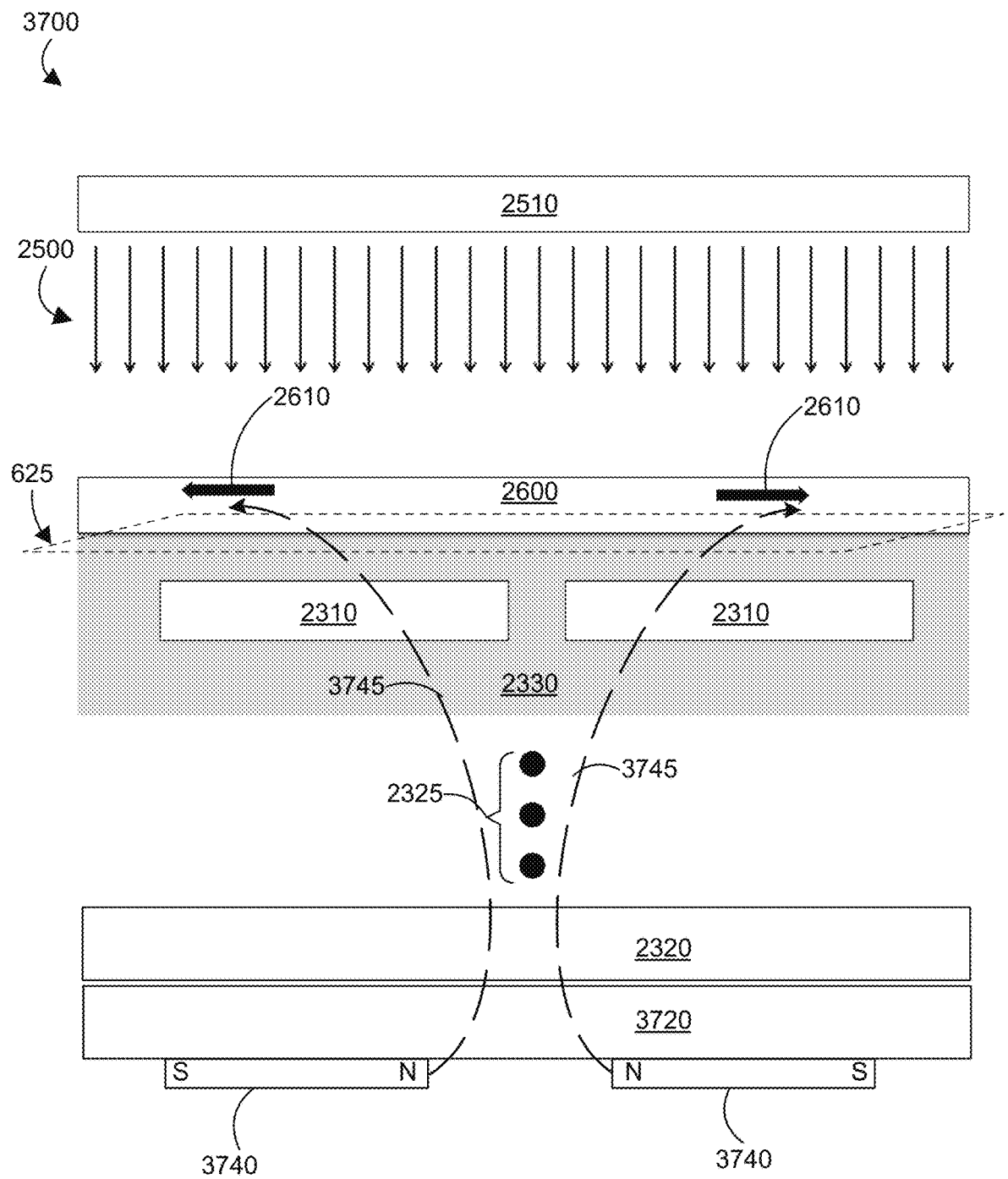
Figure 38:
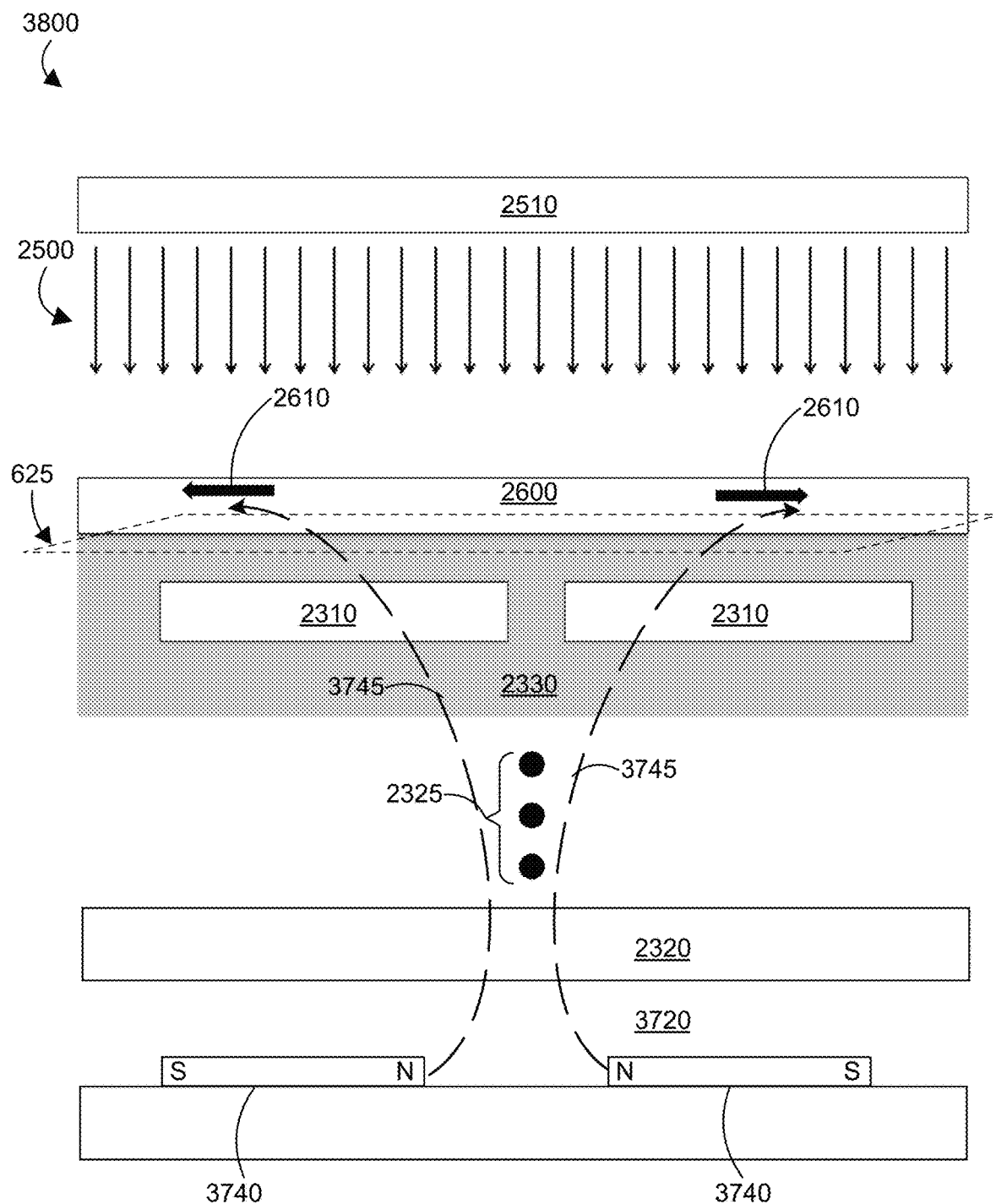
Figure 39:
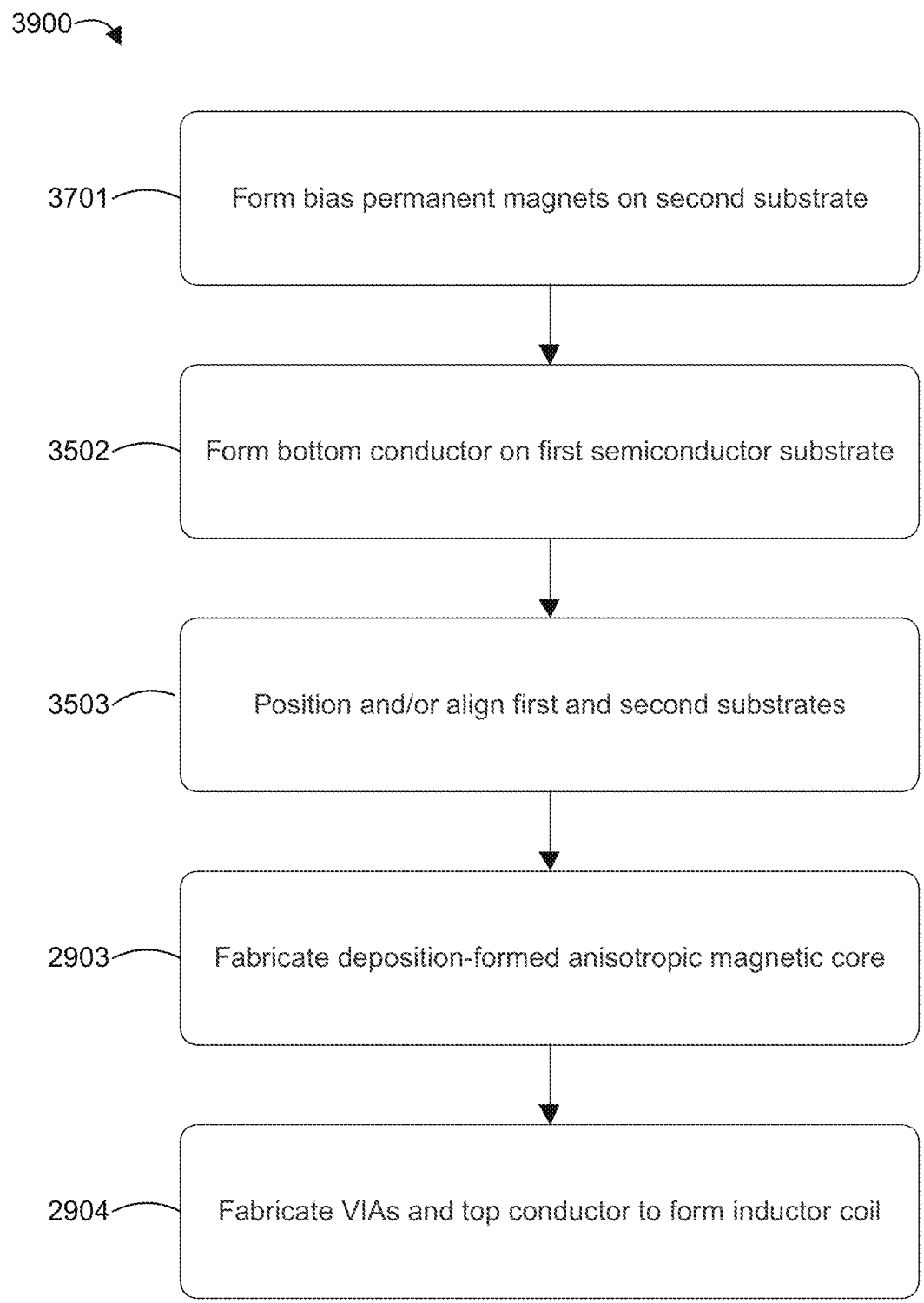
Figure 40:
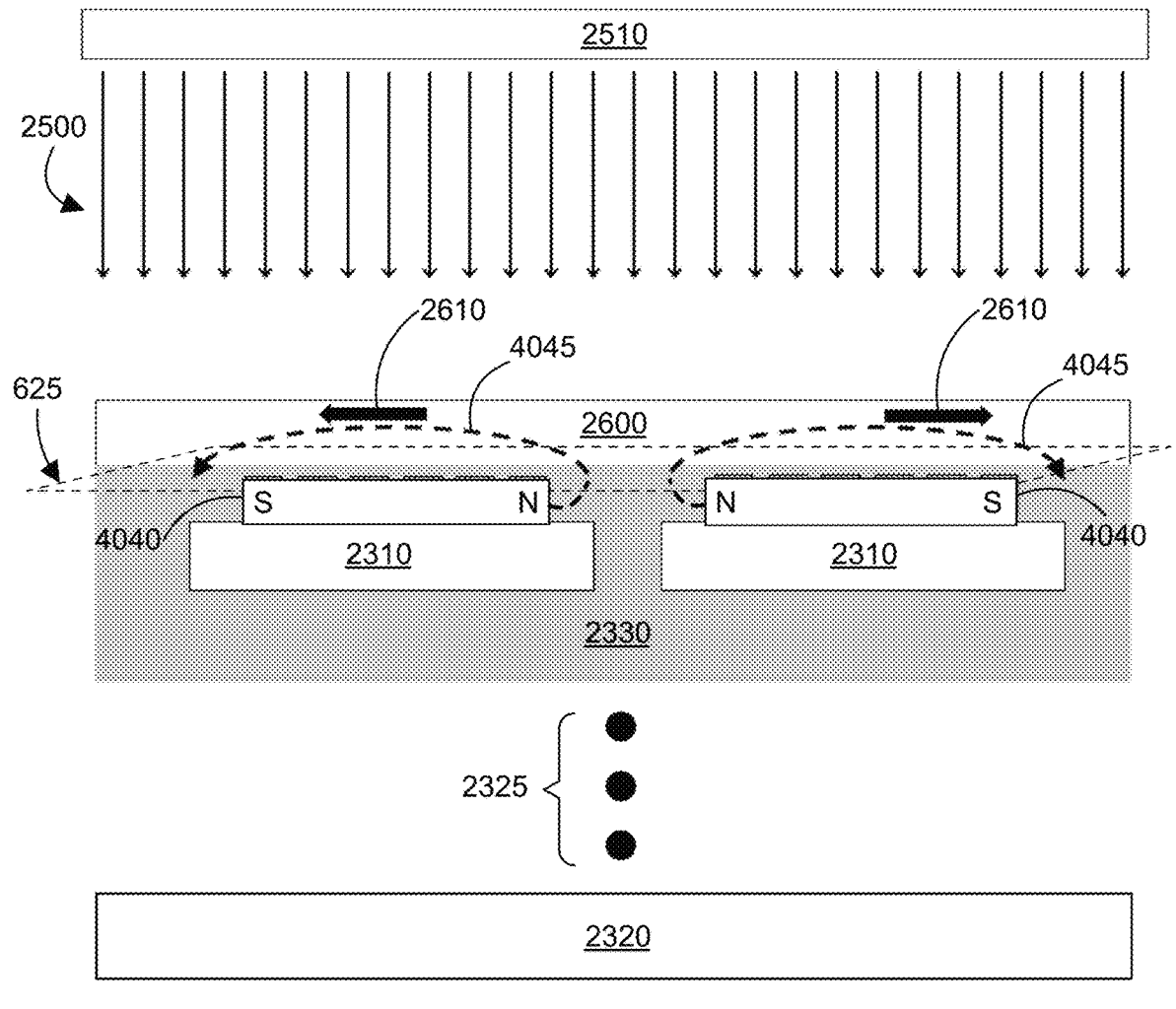
Figure 41:
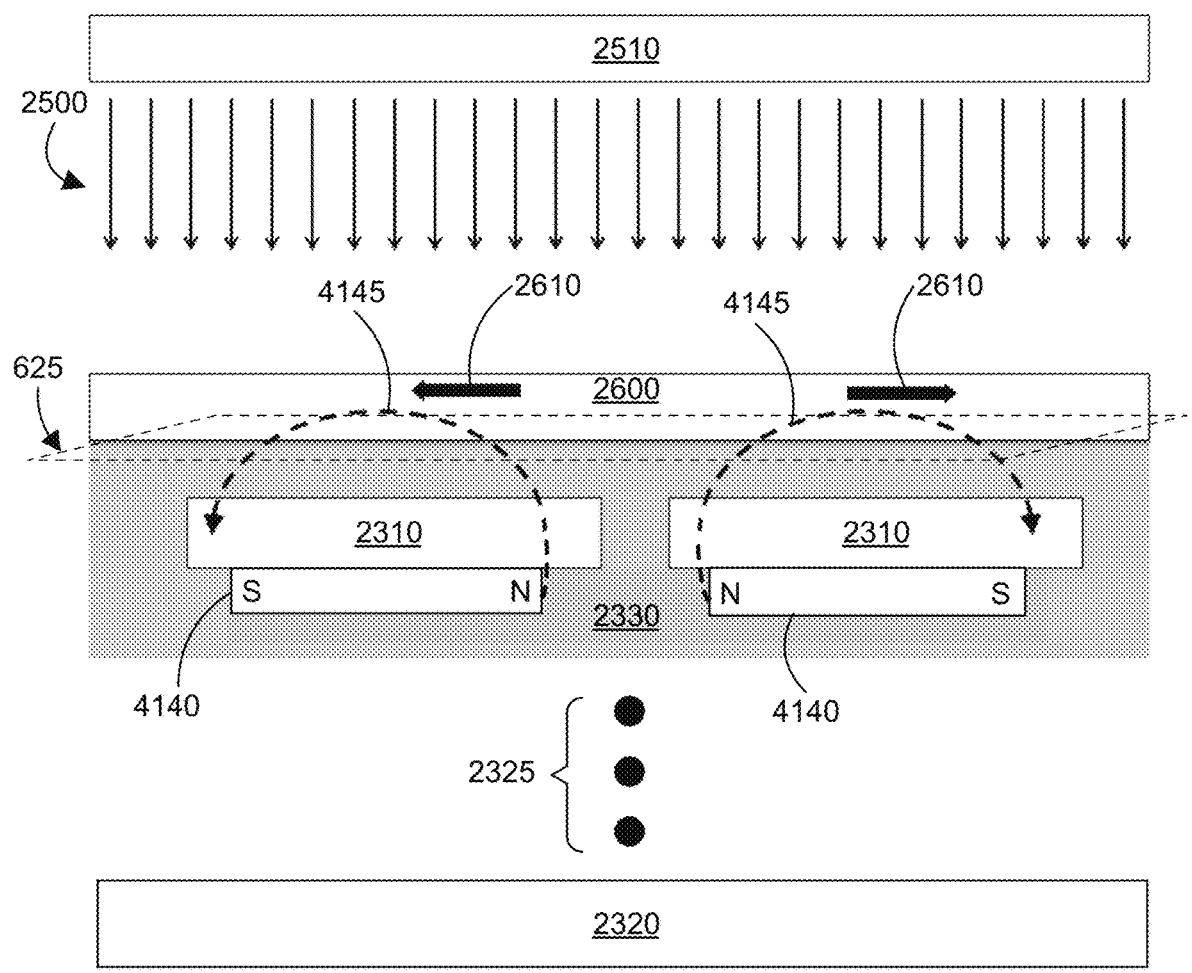

FIG. 16 portrays a side-view of an exemplary toroidal inductor with anisotropic magnetic core and integrated biasing coil disposed on a substrate, in accordance with at least some embodiments;

FIG. 17 portrays a side view of an exemplary toroidal inductor with anisotropic magnetic core on a first substrate and a side view of a biasing coil disposed on a second substrate, in accordance with at least some embodiments;

FIG. 18 is a flowchart of a method, in accordance with at least some embodiments;

FIG. 19 portrays a side view of an exemplary toroidal inductor with anisotropic magnetic core on a first substrate and a side view of a biasing coil disposed on a second substrate, in accordance with at least some embodiments;

FIG. 20 portrays a side view of an exemplary toroidal inductor with anisotropic magnetic core on a first substrate and a side view of a biasing coil disposed on a second substrate, in accordance with at least some embodiments;

FIG. 21 is a flow chart of a method for fabricating an inductor having a deposition-induced magnetic anisotropy according to one or more embodiments;

FIG. 22 is a flow chart of a method for forming a deposition-induced anisotropic magnetic core according to one or more embodiments;

FIG. 23 is a cross-sectional view of a semiconductor structure to illustrate a first step for fabricating an inductor that includes a deposition-induced anisotropic magnetic core according to one or more embodiments;

FIG. 24 is a cross-sectional view of a semiconductor structure to illustrate a second step for fabricating an inductor that includes a deposition-induced anisotropic magnetic core according to one or more embodiments;

FIGS. 25 and 26 are cross-sectional views of a semiconductor structure to illustrate a third step for fabricating an inductor that includes a deposition-induced anisotropic magnetic core according to one or more embodiments;

FIG. 27 is a cross-sectional view of a semiconductor structure to illustrate a fourth step for fabricating an inductor that includes a deposition-induced anisotropic magnetic core according to one or more embodiments;

FIG. 28 is a cross-sectional view of a semiconductor structure to illustrate a fifth step for fabricating an inductor that includes a deposition-induced anisotropic magnetic core according to one or more embodiments;

FIG. 29 is a flow chart of a method for fabricating an inductor that includes a deposition-induced anisotropic magnetic core according to one or more embodiments;

FIGS. 30 and 31 are cross-sectional views of a semiconductor structure to illustrate an alternative embodiment for fabricating an inductor that includes a deposition-induced anisotropic magnetic core;

FIG. 32 is a flow chart of a method for fabricating an inductor that includes a deposition-induced anisotropic magnetic core according to an alternative embodiment;

FIG. 33 is a cross-sectional view of an assembly to illustrate another alternative embodiment for fabricating an inductor that includes a deposition-induced anisotropic magnetic core;

FIG. 34 is a cross-sectional view of a fully-fabricated semiconductor structure including an inductor that includes the deposition-induced anisotropic magnetic core formed in FIG. 33;

FIG. 35 is a flow chart of a method for fabricating an inductor that includes a deposition-induced anisotropic magnetic core according to an alternative embodiments;

FIG. 36 is a cross-sectional view of an assembly to illustrate yet another alternative embodiment for fabricating an inductor that includes a deposition-induced anisotropic magnetic core;

FIG. 37 is a cross-sectional view of an assembly 3700 to illustrate another alternative embodiment for fabricating an inductor that includes a deposition-induced anisotropic magnetic core;

FIG. 38 is a cross-sectional view of an assembly 3800 to illustrate yet another alternative embodiment for fabricating an inductor that includes a deposition-induced anisotropic magnetic core;

FIG. 39 is a flow chart 3900 of a method for fabricating an inductor that includes a deposition-induced anisotropic magnetic core using permanent magnets according to an alternative embodiment;

FIG. 40 is a cross-sectional view of a semiconductor structure that includes permanent magnets for forming a deposition-induced anisotropic magnetic core according to an alternative embodiment; and FIG. 41 is a cross-sectional view of a semiconductor structure that includes permanent magnets for forming a deposition-induced anisotropic magnetic core according to another alternative embodiment.

DETAILED DESCRIPTION

As mentioned above, the present invention relates to inductive elements that utilize anisotropic materials and incorporate secondary biasing coils for the purpose of biasing the magnetic cores. One or more embodiments or implementations are hereinafter described in conjunction with the drawings, where like reference numerals are used to refer to like elements throughout, and where the various features are not necessarily drawn to scale.

The present invention discloses a novel inductor which can be integrated into large scale chip fabrication, according to one embodiment. Inductance is the property of a conductor by which a change in current in the conductor "induces" (creates) a voltage (electromotive force) in both the conductor itself (self-inductance) and in any nearby conductors (mutual inductance). These effects are derived from two fundamental observations of physics: first, that a steady current creates a steady magnetic field (Oersted's law), and second, that a time-varying magnetic field induces voltage in nearby conductors (Faraday's law of induction).

To add inductance to a circuit, electrical or electronic components called inductors are used. An inductor, also called a coil or reactor, is a passive two-terminal electrical component that resists changes in electric current passing through it. It consists of a conductor such as a wire, usually wound into a coil. When a current flows through it, energy is stored temporarily in a magnetic field in the coil. When the current flowing through an inductor changes, the time-varying magnetic field induces a voltage in the conductor, according to Faraday's law of electromagnetic induction, which opposes the change in current that created it.

Inductors increase their constituent magnetic fields by way of magnetic cores made of iron or ferrite inside the coil. A magnetic core can increase the inductance of a coil by a factor of several thousand, by increasing the magnetic field due to its higher magnetic permeability. However, the magnetic properties of the core material cause several side effects that alter the behavior of the inductor which are described by the following and addressed by the present invention.

As discussed, a time-varying current in a ferromagnetic inductor produces a time-varying magnetic field in its core. Energy losses occur in the core material (core loss) due to magnetic field change which are dissipated as heat. Core losses arise in the based two conditions: eddy currents and hysteresis. A changing magnetic field induces circulating loops of electric current in the conductive metal core. The currents dissipate into heat as a function of any nominal resistance associated with core material. The amount of energy loss is proportional to the area inside the loop of current.

Changing or reversing the magnetic field in the core also causes losses due to the motion of the tiny magnetic domains it is composed of. The energy loss is proportional to the area of the hysteresis loop in the BH graph of the core material. Materials with low coercivity have narrow hysteresis loops and corresponding low hysteresis losses. Energy loss per cycle of alternating current is constant. As such, core losses increase linearly with frequency.

Another concern addressed by the present invention is a condition of nonlinearity. High currents in a ferromagnetic core coil produces magnetic core saturation. Observed in ferromagnetic materials (e.g., iron, nickel, cobalt and alloys thereof), saturation is the state reached when an increase in applied external magnetic field H cannot appreciably increase the magnetization of the material further, so the total magnetic flux density B levels off.

In a saturated state, the inductance does not remain constant but changes with the current through the device. This is called nonlinearity and results in distortion of the signal. Even in an unsaturated state, materials exhibiting high coercivity produce signal distortion due to the nature of hysteretic loop, as the gain is a function of the non-linear shape of the curve.

The present invention employs magnetically anisotropic material—and manipulation thereof—to overcome some of the described shortcomings. Magnetic anisotropy is the directional dependence of a material's magnetic properties. In the absence of an applied magnetic field, a magnetically isotropic material has no preferential direction for its magnetic moment while a magnetically anisotropic material will align its moment with one of the easy axes. An easy axis is an energetically favorable direction of spontaneous magnetization that is determined by the sources of magnetic anisotropy. The two opposite directions along an easy axis are usually equivalent, and the actual direction of magnetization can be along either of them.

In one or more non-limiting embodiments, magnetic materials with uniaxial anisotropy are disclosed including Co, Fe, Ni, and any combination of these elements, potentially with other non-magnetic materials such as Ta, Zr, B, and P. Uniaxial anisotropic materials have one easy axis. Generally orthogonal to the easy axis, hard axes (not to be confused with "hard" ferromagnetic materials which denotes large coercivity) are desired for inductance. Hard axes are easily magnetized but tend not to hold their magnetization making them suitable for inductor core materials. Although the easy axis is more easily magnetized, by definition, hard axes retain significant permeabilities and linear operation beneath saturation. Other embodiments pertaining to crystallography, anisotropic orientation and saturation control will be discussed in greater detail later in the disclosure. In some embodiments, the magnetic anisotropy is induced during deposition of the inductor core material(s).

Figure 1:
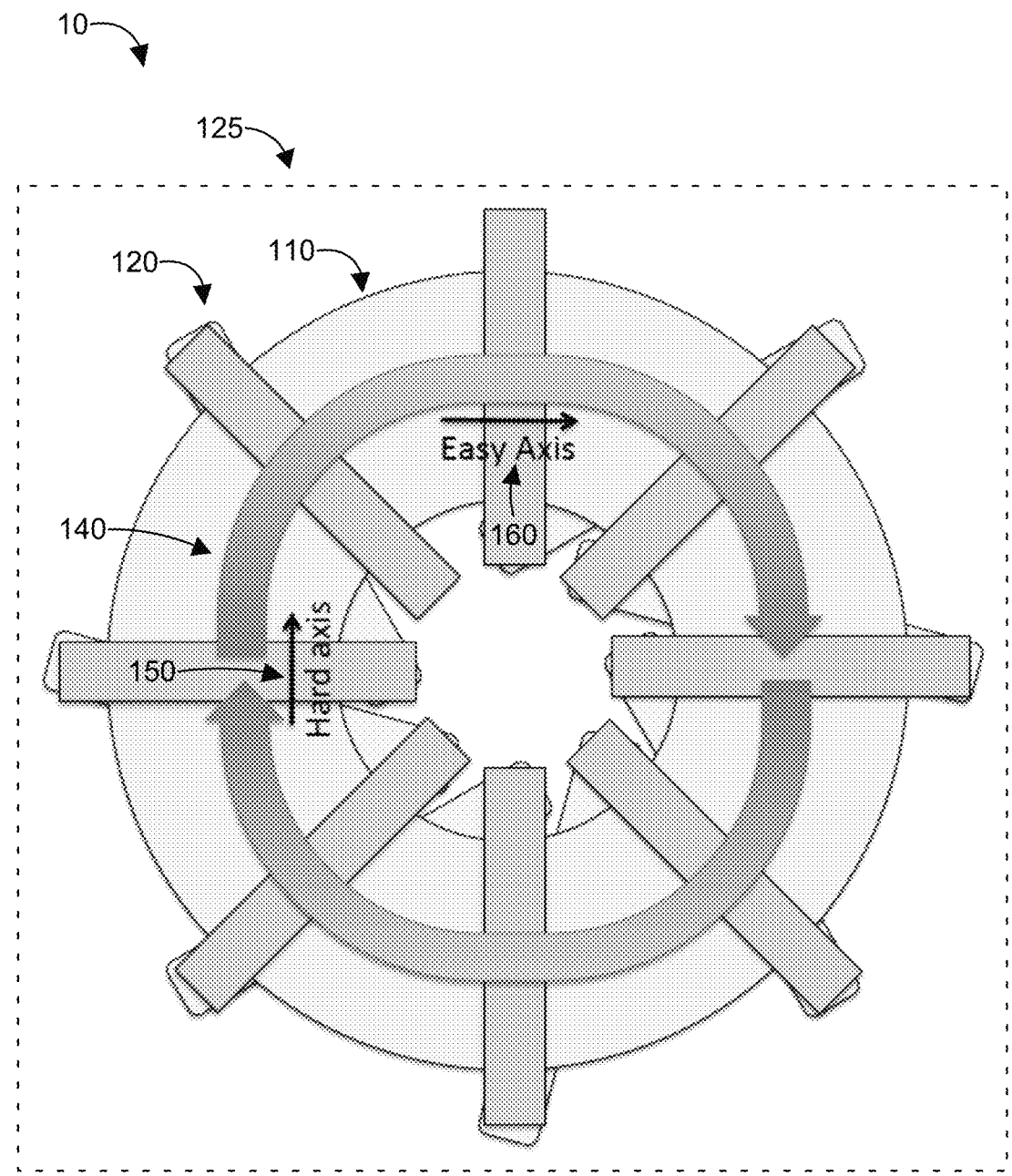
FIG. 1 illustrates a top view of a toroidal inductor according to the prior art.
Figure 2:
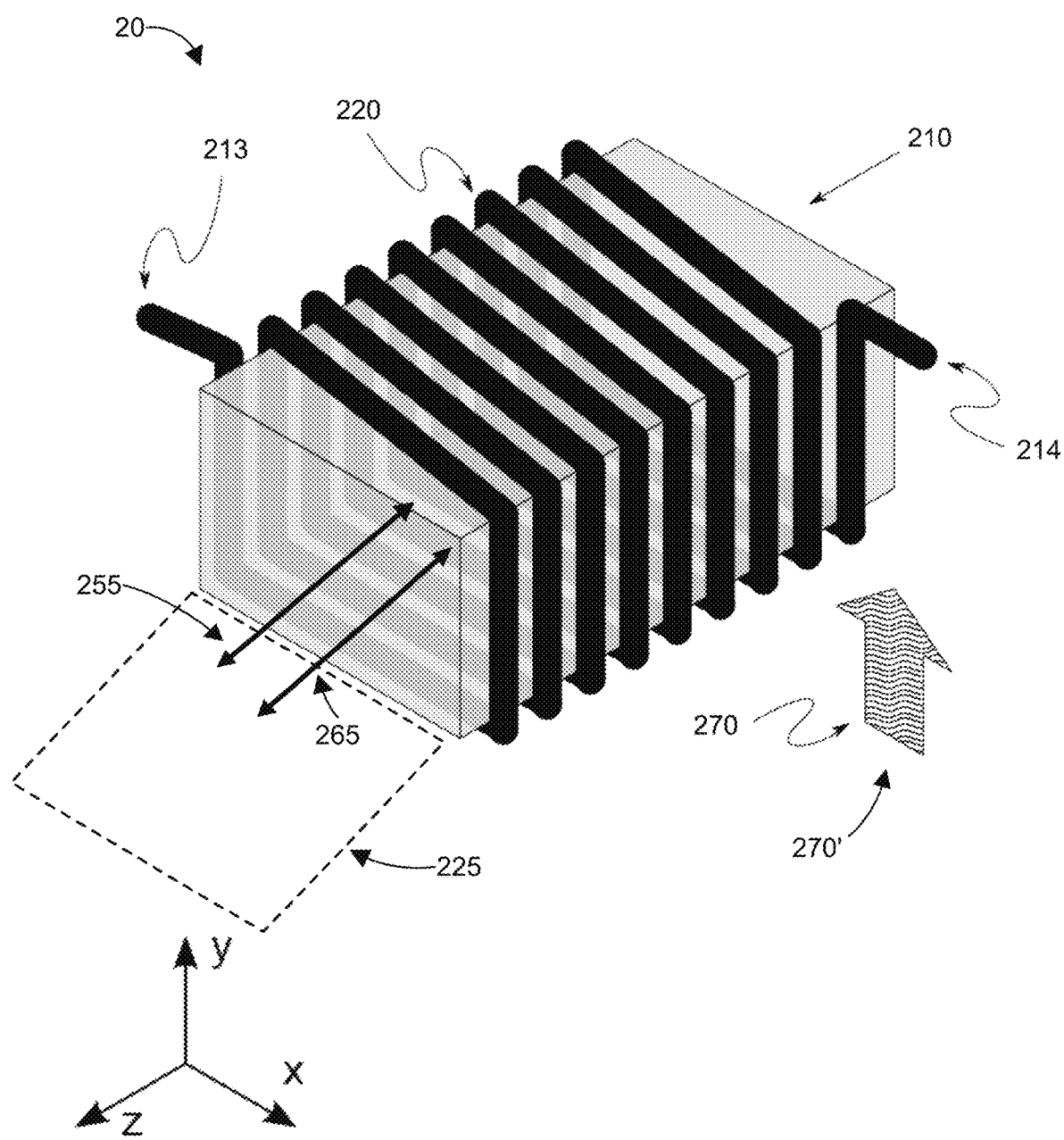
FIG. 2 illustrates an isometric perspective of an elementary inductor with an anisotropic magnetic core.

FIG. 2 illustrates an isometric perspective of an elementary inductor 20 with an anisotropic magnetic core 210. Anisotropic magnetic core 210 lies in a core plane 225. The core 210 is oriented such that its hard axis 265 is parallel to the core plane 225. That is, one or more (for uniaxial) hard axes 225 are disposed along and/or parallel with the (+/−) z direction. The hard axis 265 of a magnetic anisotropic material exhibits properties of soft ferromagnetic materials. The core 210 can be formed of Co, Ni or Fe or an alloy of one or more of such elements.

Soft ferromagnetic materials have a number of useful applications within circuits and microelectronic applications. They demonstrate relatively high permeability, low coercivity and linearity; three properties that are useful for enhancing inductance. Low coercivity mitigates core losses that are incurred by repeatedly changing the magnetization of the magnetic material. Methods and techniques are described to ensure that the high permeability and low coercivity of the material are maintained over specific ranges of inductor current, frequency and applied magnetic field strengths.

Soft ferromagnetic can be placed proximal to conductors in order to increase inductance values. In the present embodiment, anisotropic magnetic core 210 is disposed within and magnetically coupled to a coil 220, which is composed of one or more layers of electrical conductor (e.g., copper), in order to provide a high quality inductance with low resistance through the conductive element. Inductor 20 further comprises terminals 213, 214 which are conductive elements for the purpose of electrical communication to other devices or circuits within the semiconductor device.

In one aspect, anisotropic materials are integrated with other electronic circuits on a single, or multiple semiconductor substrates, in order to improve inductance or provide additional functionality that would not otherwise be available on an integrated circuit. Specifically, the integration of anisotropic magnetic cores enables efficient switched inductor power conversion.

The hard axis 265 can be oriented during the formation of the core 210 and/or it can be induced during operation by a magnetic field H generated by a bias coil. Various embodiments of forming and/or inducing the hard axis 265 are described herein.

In operation, a current flows through the conductive coil 220, which is wrapped around the core 220. The coil 220 extends in a direction 255 parallel to the core plane 225. The current flowing through the coil 220 induces a magnetic field H that travels parallel to the direction 255 of winding and, thus, in alignment with the hard axis 265 for the length of the magnetic core 220. Outside of the magnetic core, the induced magnetic flux forms a closed loop as described by Gauss's law for magnetism.

In some embodiments, the hard axis 265 can be induced during operation of the inductor 20. For example, a second magnetic field 270 can be generated in a direction orthogonal to the core plane 225 or orthogonal to the magnetic field that is generated by the inductor coil. One skilled in the art will recognize that at least in some embodiments, the core plane 225 is parallel with the magnetic field generated by the inductor coil for the length of the magnetic core 220, as described above. The second magnetic field 270 induces an easy axis in the core 210 in a direction parallel to the second magnetic field 270. The hard axis 265 naturally aligns in an orthogonal direction to the easy axis and, thus, will be induced to align in a direction parallel to the core plane 225 and/or the direction of the magnetic field for the length of the magnetic core 220. The second magnetic field 270 can be generated by a bias coil or any other method as understood by those skilled in the art. The easy axis and hard axis can be disposed in the same plane.

The core 210 can be in the form a variety of shapes. For example, the core 210 can curve into a shape with a circular cross section such as described below. The core 210 can also be elongated (e.g., a parallelepiped).

In some embodiments, the core 210 can be manufactured while an external magnetic field 270' is applied in the direction of the y-axis, as shown in FIG. 2. The application assures coaxial alignment with the anisotropy's easy axis. This effectively orients the anisotropy's hard axis to be coupled to the inductor's magnetic field H in operation, thereby engendering the desired characteristics of low coercivity, relatively high permeability and linearity. In such embodiments a bias magnetic field is not needed during operation to assure alignment of the hard axis with the inductor's magnetic field. However, for thin magnetic films, shape anisotropy may be large enough to preclude to formation of the easy axis of magnetization orthogonal to the core plane or the direction of the magnetic field for the length of the magnetic core 220.

The induced magnetic anisotropy may be controlled by several, potentially competing physical phenomena: magnetocrystalline anisotropy, shape anisotropy, magnetoelastic anisotropy and exchange anisotropy. Arising from spin-orbit coupling, the atomic structure of a crystal introduces preferential directions for the magnetization in magnetocrystalline anisotropy. In one or more embodiments, the induced anisotropy may be set by controlling the direction of crystal lattice growth during deposition by applying the magnetic field 270' to a seed layer or substrate. In other embodiments, the magnetic field 270' is applied after the core is deposited during a high temperature anneal. In the high-temperature anneal, the magnetic field strength should be considerably higher than the magnetic material's intrinsic saturation field (e.g., greater than or equal to about 30 Oe), the temperature should be greater than 200° C. and the duration of the anneal should be several hours. Many combinations of temperature, magnetic field strength and time may be effective at inducing the magnetic anisotropy. This is useful in more amorphous and sintered magnetic core materials.

Shape anisotropy occurs as a result of orientation of magnetic domains in an effort to minimize their cumulative field energy. Magnetic domains align their moments to effectively demagnetize each other macroscopically. Shape anisotropy is a function of magnetic structure, which is determined by the magnet's physical scale, shape, symmetry and material. Other factors can influence a magnetic structures orientation of anisotropy, including various types of coupling to adjacent magnetic structures.

The apparent orientation of anisotropy for a specific structure is determined by the collection of these effects. The application of a static magnetic field sufficiently large in magnitude has a similar effect as controlling the orientation of anisotropy, by magnetizing the material such that the easy axis aligns with the applied magnetic field thereby allowing microcrystalline anisotropy to dominate. The magnitude of the static magnetic field should be on the order of the magnitude of the saturation field of the magnetic material.

In one or more embodiments, insulating layers in the x-z or y-z planes are employed to suppress the formation of eddy currents and minimize other loss mechanisms over potential operating conditions. An electrical insulator is a material whose internal electric charges do not flow freely. An electrical insulator, therefore, does not conduct an electric current under the influence of an electric field. It is characterized by a low conductivity/high resistivity. Exemplary materials include glass, paper and Teflon, which have high resistivity making them very good electrical insulators. The layers included in these magnetic inductors can be about (i.e., within +/−10%) 1 nm to about 100 nm in thickness.

According to one aspect, anisotropic magnetic core 210 is fabricated with magnetic film layers and alternating electrically insulating layers. Insulating layers are inserted into the magnetic film layers separating the film into two or more thin (about 1 nm to about 1000 nm) laminations that are electrically isolated. The insulating layers suppress the formation of eddy currents, which is a major source of loss at high frequencies. In one or more embodiments, electrically insulating layers comprises photoresist, metal oxide, silicon dioxide, polymer or other suitable material suitably used in semiconductor device fabrication.

Figure 3:
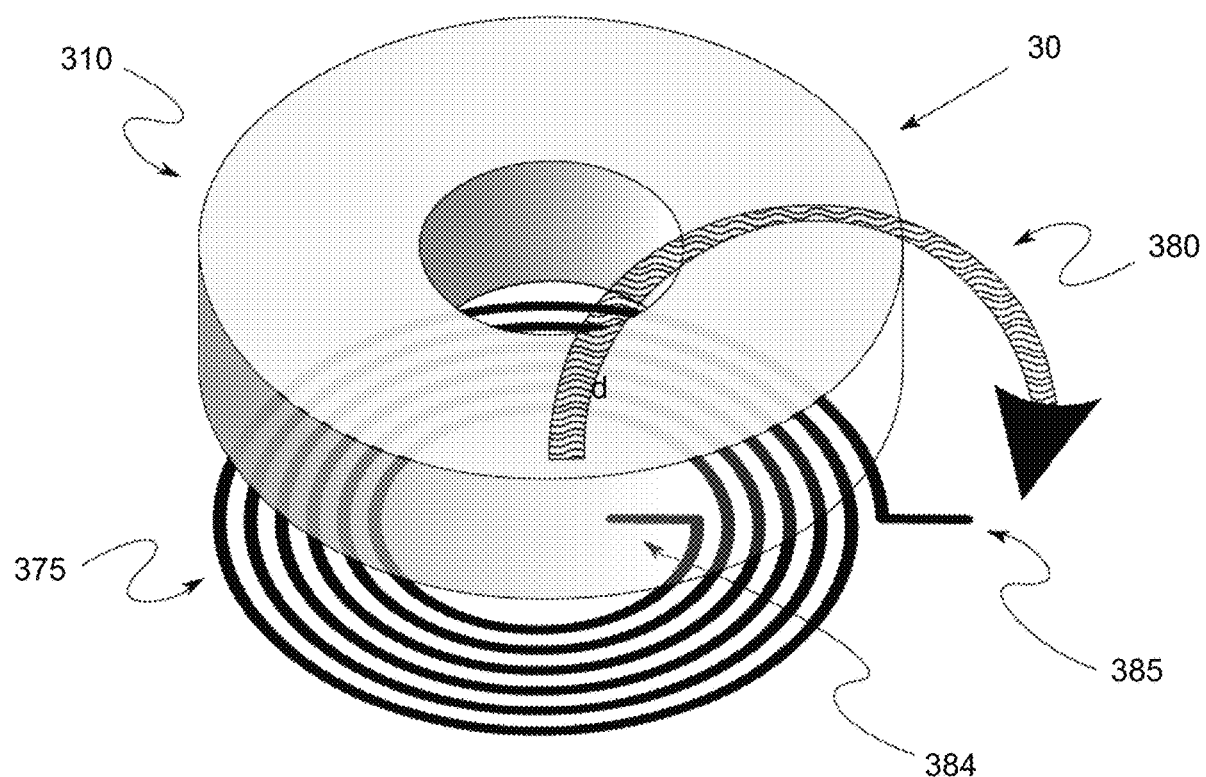
FIG. 3 depicts an isometric perspective of an exemplary magnetic core with a biasing coil according to an alternate embodiment.

FIG. 3 depicts an isometric perspective of an exemplary incomplete magnetically coupled inductor 30 with a bias coil 375 according to an embodiment. In the configuration depicted, anisotropic magnetic core 310 is annular in shape and fabricated to be used in a toroidal inductor. Bias coil 375 with terminals 384, 385 is manufactured using any conductive or semiconductive materials. If integrated into printed circuit board (PCB) fabrication, these can be circuit traces, wires, strip lines or any other suitable material. One skilled in the art can appreciate the limit to the number of turns N in bias coil 375 is a practical, engineering consideration.

Bias coil 375 is included primarily for the purposes of controlling the magnetic materials orientation of anisotropy. Therefore, it is desirable that the bias coil 375 consume very little power during operation of the device. This can be accomplished by using many turns in the bias coil, so that a small current can induce a magnetic field similar or greater in magnitude than the inductor coil. It is acceptable for the bias coil to have a large resistance, whereas this is generally not true for the inductor coil where resistance must be kept low to maintain a good inductor quality factor.

According to one aspect of the invention, a biasing coil 375 is disposed proximal to the anisotropic magnetic core 310 to induce the desired orientation of anisotropy for the entire length or substantially the entire length of the magnetic flux path. When a DC electrical current is passed through the biasing coil 375, the biasing magnetic fields 380 that originate (DC bias fields) are perpendicular to the magnetic fields of the inductor coil (inductor fields not shown). The biasing magnetic field 380 must be large enough in magnitude to steer the easy axis of magnetization to orient parallel to the bias field.

At the intersecting plane of biasing magnetic field 380 and anisotropic magnetic core 310 the field lines of the biasing magnetic field 380 are disposed radially to the plane of the anisotropic magnetic core 310 thereby inducing an easy axis of the same direction. Consequently, the hard axis of magnetization will be oriented tangential to the radial direction along the inductor fields (depicted later in the disclosure), which will result in a higher permeability for the entire length of the inductor flux/field path and consequently a higher inductance. The easy axis and the hard axis can be disposed in the same plane.

Figure 4:
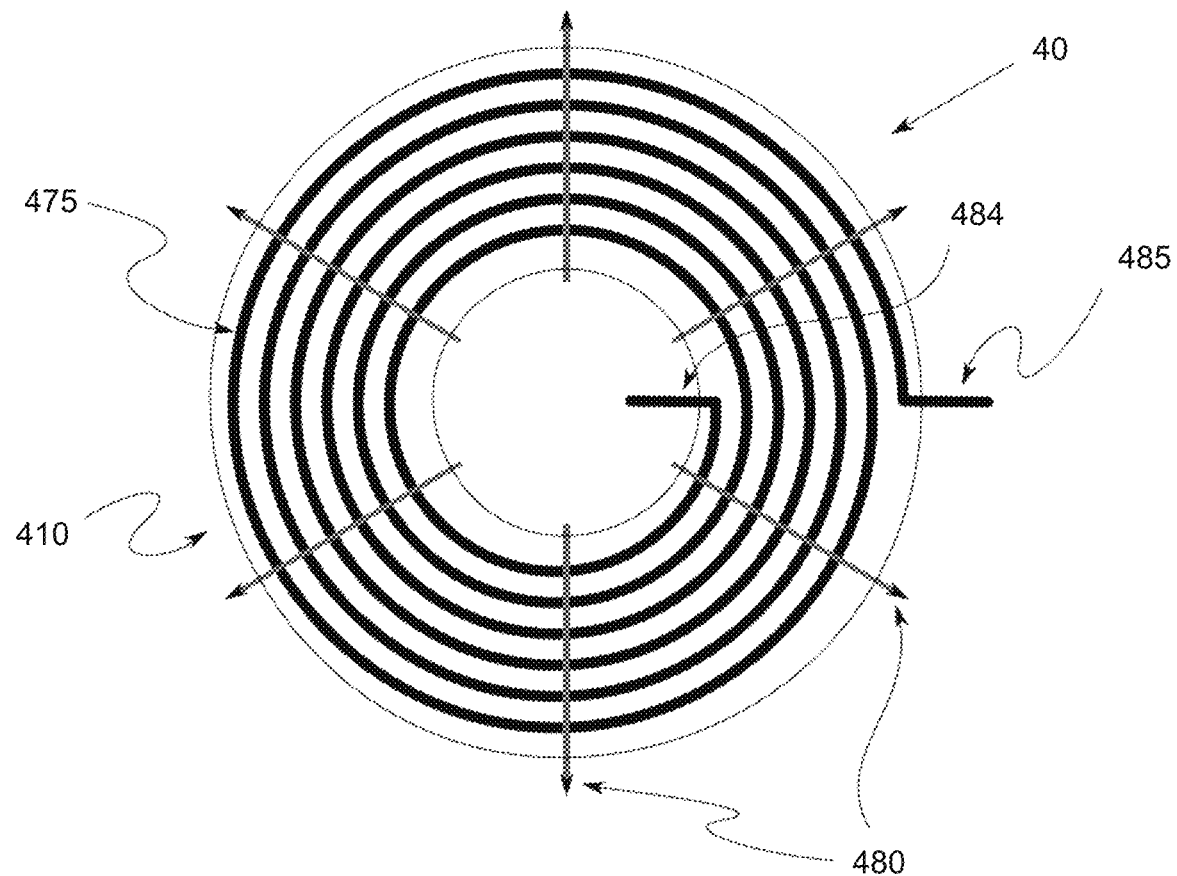
FIG. 4 illustrates a top-down view of an exemplary magnetic core with biasing coil.

FIG. 4 illustrates a top-down view of an exemplary incomplete magnetically coupled inductor 40 with biasing coil 475, in accordance with the present embodiment depicted in FIG. 3. Again, anisotropic magnetic core 410 is generally annular in shape and fabricated to be used in a toroidal inductor. Biasing coil 475 with terminals 484, 485 are manufactured using any conductive or semiconductive materials. The biasing coil 475 generates magnetic field lines 480 that radiate in the radial direction in the plane of anisotropic magnetic core 410 thereby inducing anisotropy of the easy axis and consequently the hard axis tangentially thereof. The easy and hard axes can be co-planar.

Figure 5A:
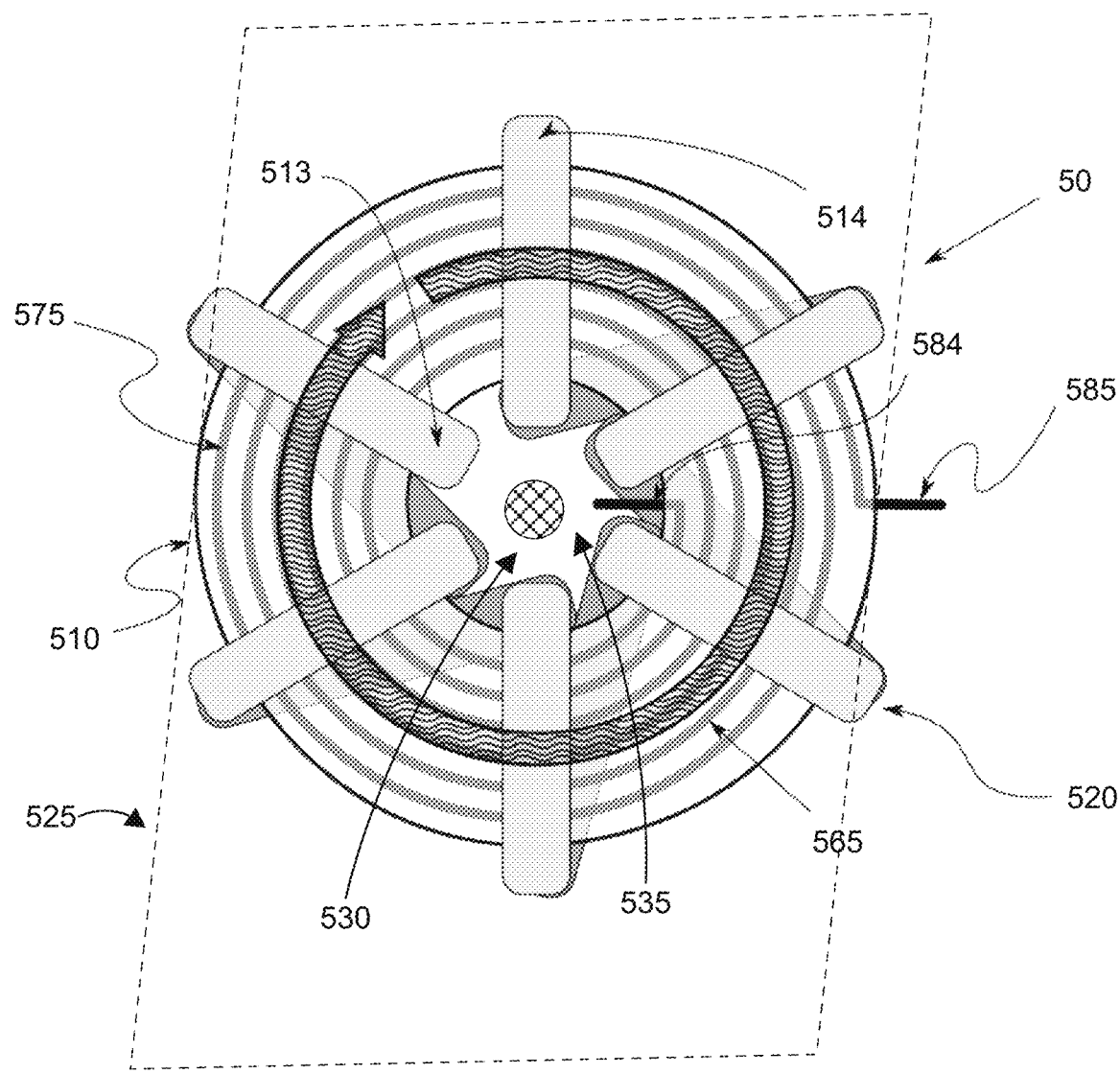
FIG. 5A illustrates a top-down view of an exemplary toroidal inductor with anisotropic magnetic core and integrated biasing coil.

FIG. 5A illustrates a top-down view of an exemplary toroidal inductor 50 with anisotropic magnetic core 510 continuing with the present embodiment. Toroidal inductor 50 comprises integrated biasing coil 575, biasing terminals 584, 585, a toroidal or annular shaped anisotropic magnetic core 510, inductor coil 520, and inductor terminals 513, 514. Integrated biasing coil 575, biasing terminals 584, 585, and anisotropic magnetic core 510 are fabricated and disposed in the manner described above. The biasing coil 575 wraps in a generally spiral direction parallel to a core plane 525.

Inductor coil 520 wraps around the core 510, which lies in the core plane 525. The core plane 525 is orthogonal to an axis of symmetry 530, which extends through a center 535 of the core 510. The inductor coil 520 wraps in a direction parallel to a core plane 525. The coil 520 can be manufactured using any conductive material and will be discussed in more detail later in the disclosure. Inductor terminals 513, 514 electrically couple to other circuits and devices integrated into semiconductor fabrication. Application of a DC current through inductor terminals 513, 514 gives rise to a magnetic field 565 that extends through the core 510 in an arc or closed loop. The magnetic field 565 is orthogonal to the radial direction (e.g., the direction of the bias magnetic field) and coaxial to the hard axis of the induced magnetic anisotropy. The magnetic field 565 is also parallel to the core plane 525.

The magnetic field 565 and flux induced by the inductor coil 520 forms a closed circular path with the magnetic anisotropic core 510.

It is noted that the core 510 can have a generally circular cross section in the core plane 525. Although a toroidal or annular shape is illustrated in FIG. 5, the core 510 can have other cross sectional shapes such as a circle, an oval, an ellipse, or similar shapes. Such cross sectional shapes can form a core 510 having various three-dimensional shapes such as a sphere, an ovoid, a spheroid, a cylinder, a cone, an ellipsoid, or similar shapes.

Figure 5B:
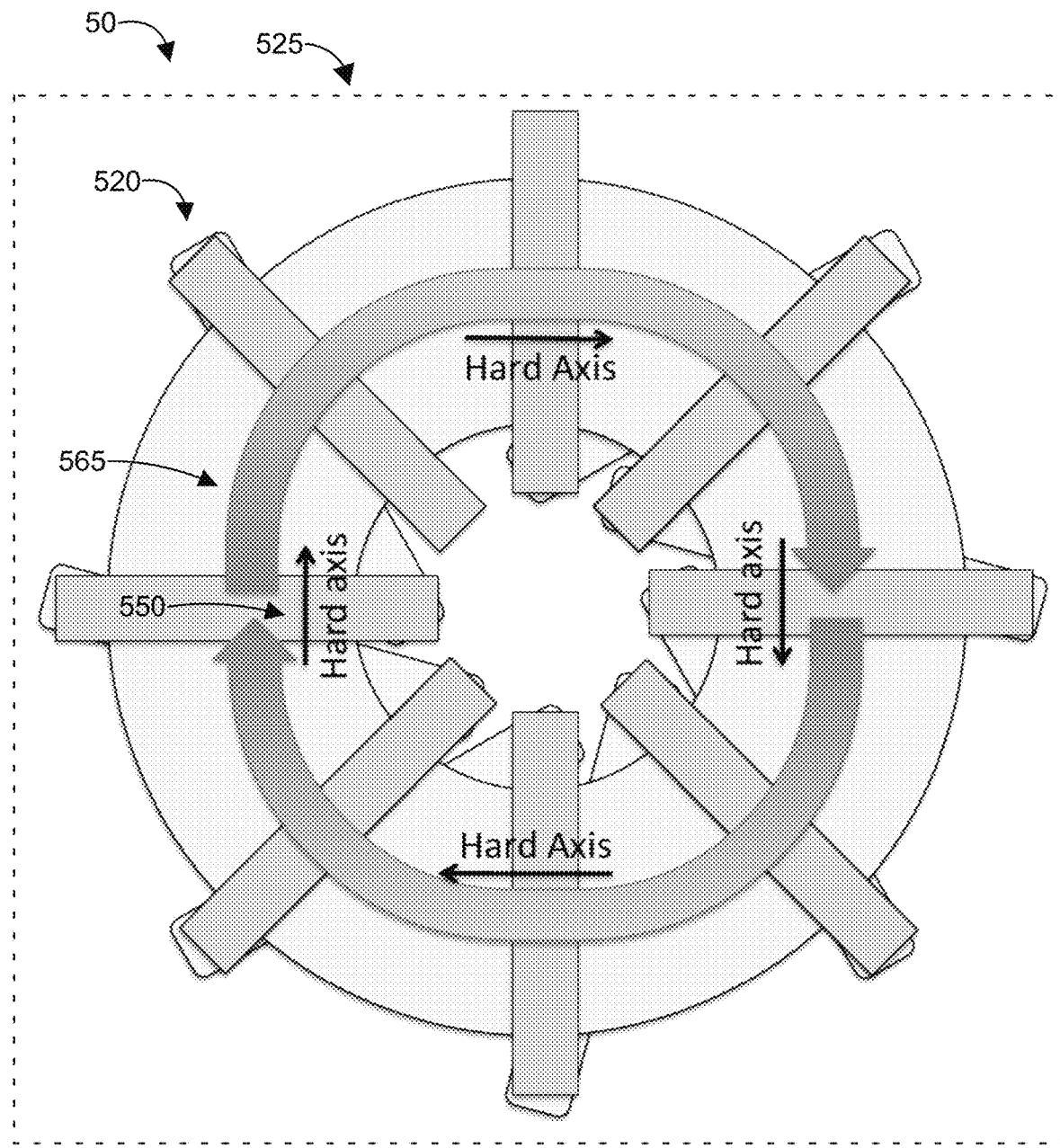
FIG. 5B illustrates another top-down view of the toroidal inductor of FIG. 5A.

FIG. 5B illustrates another top view of the toroidal inductor 50. As illustrated, the hard axis 550 is induced by the inductor coil 520 to follow and align with the magnetic field 565. Thus, both the hard axis 550 and the magnetic field 550 have a generally circular closed path and extend in an arc parallel to the core plane 525. As discussed above, this is beneficial because the hard axis 550 has a lower coercivity, which results in a reduction or elimination of magnetic saturation.

FIG. 6 portrays a side view of an exemplary toroidal inductor 60 comprising anisotropic magnetic core 610, inductor coil 620, and integrated biasing coil 675. The side view is taken through a plane orthogonal to a core plane 625 (described below). The inductor coil 620 includes a top conductor 621, bottom conductor 622 and conductor vertical interconnect access (VIA) 623. The complete device fabrication spans four layers with insulating layers interposed therebetween. VIA 623 electrically couples top conductor 621 to bottom conductor 622 in predetermined locations and is electrically isolated from anisotropic magnetic core 610. The biasing coil 675 wraps in a generally spiral direction parallel to the core plane 625.

The inductor coil 620 is wound around the core 610, which lies in the core plane 625. The core plane 625 is orthogonal to an axis of symmetry 630, which extends through a center 635 of the core 610. As illustrated, the inductor coil 620 has a generally rectangular cross section in the plane orthogonal to the core plane 625. It is noted that the inductor coil 620 can have other generally rectangular shapes in cross section, such as a square, a parallelogram, or a similar shape. Alternatively, the inductor coil 620 can have a generally circular shape in cross section, such as a circle, an oval, an ellipse, or a similar shape.

In operation, a current in the inductor coil 620 generates a magnetic field that passes through the core 610 in a closed loop parallel to the core plane 625. The biasing coil 675, which is disposed parallel to the core plane 625, generates a second magnetic field 680 that passes through the core 610 in a second direction (e.g., radially) that is orthogonal to the first direction. As discussed above, the second magnetic field 680 induces an easy axis in the core 610 along the direction of the second magnetic field 680 (i.e., the second or radial direction), which causes alignment of the hard axis with the magnetic field caused by the inductor coil 620. As discussed above, the easy axis and the hard axis can be co-planar.

In at least some embodiments, the device is fabricated on a substrate.

FIG. 16 portrays a side view of the device disposed on a substrate 1602, in accordance with at least some embodiments.

As with FIG. 6 discussed above, the side view is taken through the core plane 625.

As used herein, the term "disposed on" means "disposed directly on" and/or "disposed indirectly on." Unless stated otherwise, the term "on" does not necessarily mean "on top of" since relative position (above or below) depends on orientation.

As used herein, the term "substrate" may comprise any type of substrate. In some embodiments, the substrate may include one or more integrated circuits or portion(s) thereof.

In at least some embodiments, the device may be fabricated without the biasing coil 675, and a biasing, e.g., biasing coil 675, for use in inducing an orientation of anisotropy for the magnetic core 610 may be disposed on a second (separate) substrate. In at least some embodiments, this allows a single biasing coil to be used in inducing an orientation of anisotropy for magnetic cores in multiple devices, and as such, may reduce the cost of each device since each device does not need its own "on board" biasing coil.

FIG. 17 portrays a side view of the device disposed on a first substrate, e.g., substrate 1602, without the biasing coil 675, and a side view of a biasing coil, e.g., biasing coil 675, disposed on a second substrate 1702, in accordance with at least some embodiments.

As with FIG. 16, the side view is taken through the core plane 625.

In at least some embodiments, the biasing core 675 has a center and/or axis (of symmetry or otherwise) 1704.

In at least some embodiments, the biasing coil, e.g., biasing coil 675, on the second substrate 1702, may be used in inducing a permanent or semi-permanent orientation of anisotropy for a magnetic core, e.g., magnetic core 610, on the first substrate 1602.

FIG. 18 is a flowchart 1800 of a method for using the biasing core, e.g., biasing core 675, disposed on the second substrate 1702 to induce a permanent or semi-permanent orientation of anisotropy for a magnetic core, e.g., magnetic core 610, disposed on the first substrate 1602, in accordance with at least some embodiments.

Referring to FIG. 18, at 1802, the method may include providing relative movement between the first substrate 1602 and the second substrate 1702 such that the biasing core, e.g., biasing core 675, disposed on the second substrate 1702 and the magnetic core, e.g., magnetic core 610, disposed on the first substrate 1602 are within range of one another, in accordance with some embodiments.

As used herein, the term "within range of one another" means close enough that the biasing coil can: (i) generate a bias magnetic field that passes through the magnetic core and (ii) generate heat to heat the magnetic core, to induce a permanent or semi-permanent orientation of anisotropy for the magnetic core.

In at least some embodiments, the relative movement between the first substrate and the second substrate comprises moving the second substrate toward the first substrate, moving the first substrate toward the second substrate and/or a combination thereof.

FIG. 19 portrays a side view of the device disposed on a first substrate, e.g., substrate 1602, without the biasing coil 675, and a side view of a biasing coil, e.g., biasing coil 675, disposed on a second substrate 1702, after relative movement between the first substrate and the second substrate such that the biasing core disposed on the second substrate 1702 and the magnetic core disposed on the first substrate 1602 are within range of one another, in accordance with at least some embodiments.

As with FIG. 17, the side view is taken through the core plane 625.

In at least some embodiments, the relative movement between the first substrate and the second substrate result in a relative positioning thereof in which the biasing coil 675 is disposed parallel to the core plane 625.

In at least some embodiments, the biasing core 675 has a center and/or axis (of symmetry or otherwise) 1704 and the relative movement between the first substrate and the second substrate result in a relative positioning thereof in which the center and/or axis 1704 of the biasing core 675 is aligned with and/or parallel to the center 635 and/or axis of symmetry 630 of the magnetic core 610.

In at least some embodiments, the relative movement between the first substrate, e.g., first substrate 1602, and the second substrate, e.g., second substrate 1702, result in a relative positioning thereof in which the first substrate 1602 and the second substrate 1702 are in contact with one another.

FIG. 20 portrays a side view of the device disposed on a first substrate, e.g., substrate 1602, without the biasing coil 675, and a side view of a biasing coil, e.g., biasing coil 675, disposed on a second substrate 1702, with the first substrate in contact with the second substrate, in accordance with at least some embodiments.

As with FIG. 19, the side view is taken through the core plane 625.

In at least some embodiments, the first substrate, e.g., first substrate 1602, has an outer surface (major or otherwise) 1902 (FIG. 19) and the second substrate, e.g., second substrate 1702, has an outer surface (major or otherwise) 1904 (FIG. 19) and the relative movement between the first substrate and the second substrate result in a relative positioning thereof in which the outer surface 1902 of the first substrate and the outer surface 1904 of the second substrate are in contact with one another. In at least some embodiments, a major portion of the outer surface 1902 of the first substrate and a major portion of the outer surface 1904 of the second substrate are in contact with one another.

Unless stated otherwise, the term "major portion" means a portion that is greater than 50%.

In at least some embodiments, the contact comprises uniform contact.

In at least some embodiments, the relative movement between the first substrate and the second substrate result in a relative positioning thereof in which the biasing coil 675 is disposed parallel to the core plane 625.

In at least some embodiments, the biasing core 675 has a center and/or axis (of symmetry or otherwise) 1704 and the relative movement between the first substrate and the second substrate result in a relative positioning thereof in which the center and/or axis 1704 of the biasing core 610 is aligned with and/or parallel to the center 635 and/or axis of symmetry 630 of the magnetic core 610.

In at least some embodiments, the method may further comprise applying force, e.g., force 2010, to press at least one of the second substrate and the first substrate against the other. In at least some embodiments, this comprises applying force to press the second substrate against the first substrate, applying force to press the first substrate against the second substrate and/or a combination thereof.

Referring again to FIG. 18, at 1804, the method may further include applying current in the biasing coil, e.g., biasing coil 675, to: (i) generate a bias magnetic field, e.g., magnetic field 680, that passes through the magnetic core, e.g., magnetic core 610, in a second direction that is orthogonal to the first direction and (ii) generate heat to heat the magnetic core, to induce a permanent or semi-permanent orientation of anisotropy for the magnetic core.

In at least some embodiments, applying current in the bias coil comprises applying at least 10 mA of current in the bias coil.

In at least some embodiments, the heat is generated for at least 15 minutes.

In at least some embodiments, the generated heat is sufficient to heat the magnetic core to a temperature greater than 200° C.

In at least some embodiments, said induce a permanent or semi-permanent orientation of anisotropy for the magnetic core comprises induce a permanent orientation of anisotropy for the magnetic core.

In at least some embodiments, said induce a permanent or semi-permanent orientation of anisotropy for the magnetic core comprises permanently or semi-permanently fix an easy axis of magnetization of the magnetic core parallel to the second direction.

In at least some embodiments, said permanently or semi-permanently fix an easy axis of magnetization of the magnetic core parallel to the second direction causes a hard axis of magnetization of the magnetic core to be permanently or semi-permanently oriented parallel to the first direction.

In at least some embodiments, said induce a permanent or semi-permanent orientation of anisotropy for the magnetic core comprises permanently fix an easy axis of magnetization of the magnetic core parallel to the second direction to cause a hard axis of magnetization of the magnetic core to be permanently oriented parallel to the first direction.

In at least some embodiments, the biasing core 675 may generate a second magnetic field 680 that passes through the core 610 in a second direction (e.g., radially) that is orthogonal to the first direction and induces an easy axis in the core 610 along the direction of the second magnetic field 680 (i.e., the second or radial direction), which causes alignment of the hard axis with the magnetic field caused by the inductor coil 620. As discussed above, the easy axis and the hard axis can be co-planar.

FIG. 7 depicts a top-view of an exemplary toroidal mutual inductor 70 comprising integrated biasing coil 775, anisotropic magnetic core 710, primary inductor coil 720A and secondary inductor coil 720B. The magnetic field 765 and flux induced by primary inductor coil 720A forms a closed circular path with the magnetic anisotropic core 710 which magnetically couples secondary coil 720B. Electrical communication occurs though primary 713, 714 and secondary terminals 63, 69, respectively.

Toroidal mutual inductor 70 can function as a transformer or other coupled inductor. Primary and secondary coils 720A, 720B wind around the same magnetic anisotropic core 61. In the present embodiment, windings are separate (distinct). In another embodiment, windings are interleaved, at least in part. In another embodiment, the number of windings on the primary and secondary turns may be dissimilar to form a transformer with turns ratio other than 1:1.

According to another embodiment, FIG. 8 depicts a top-view of an exemplary race-track mutual inductor 80 comprising integrated biasing coil 875, anisotropic magnetic core 810, primary inductor coil 820A and secondary inductor coil 820B. Mutual inductor 80 is in the shape of an elongated toroid or an oval in cross section. As with the previous embodiment, the magnetic field and flux induced by primary inductor coil 820A forms a closed elliptical path with the magnetic anisotropic core 810 which magnetically couples secondary coil 820B. The biasing coil 875 induces a hard axis in the core 810 to align with the magnetic field generated by the inductor coils 820A, 820B.

According to another embodiment, FIG. 9 depicts a top-view of an exemplary rectangular mutual inductor 90 comprising integrated biasing coil 975, anisotropic magnetic core 910, primary inductor coil 920A and secondary inductor coil 920B. The core 910 is substantially rectangular shaped, but other 4-sided profiles, such as square, rhombus, etc., are not beyond the present invention. As with the previous embodiment, the magnetic field and flux induced by primary inductor coil 920A forms a closed elliptical path with the magnetic anisotropic core 910 which magnetically couples secondary coil 920B. Alignment of the magnetic field generated by the inductor coils 920A, 920B with the hard axis of the core 910 is achieved in the same way as described above.

According to another embodiment of a bias coil inductor, a bias coil may be fabricated using the same conductive interconnect layers as the inductor coil. In another embodiment, the bias coil may be used to induce the magnetic anisotropy only in locations of the magnetic core where the intrinsic hard axis of magnetization of the core is not aligned with the magnetic flux that is generated by the inductor coil. In regions of the magnetic core where the intrinsic hard axis orientation is aligned with the inductor coil's magnetic field, no bias field is necessary. In regions of the magnetic core where the intrinsic hard axis orientation is not aligned with the inductor coil's field, the bias coil can be used to induce a magnetic field that aligns the hard axis with the magnetic flux originating from the inductor coil.

This invention is also applicable to other inductor topologies and dimensions. Maximum benefit is achieved when the magnetic core forms a closed path for the inductor fields (this provides maximum inductance enhancement). However, there is still benefit achieved when a biasing coil is used with open inductor cores such as solenoids. Further, this invention applies to any coupled inductors and transformers, where one or more electrically isolated coils wrap around the same magnetic core.

FIG. 10 graphically illustrates the juxtaposition of hysteresis loops for the hard 1001 and soft axes 1002 in a soft ferromagnetic material. Suitable soft magnetic materials employed in one or more embodiments comprise alloys containing at least one of Co, Ni or Fe, which are anisotropic in their magnetic response. Magnetic anisotropy is the directional dependence of a material's magnetic properties. In the absence of an applied magnetic field, a magnetically isotropic material has no preferential direction for its magnetic moment, while a magnetically anisotropic material will align its moment with one of the easy axes in the presence of an applied magnetic field.

An easy axis is an energetically favorable direction of spontaneous magnetization. The two opposite directions along an easy axis are usually equivalent, and the actual direction of magnetization can be along either of them. Basal plane (two easy axes) and other magnetic anisotropy is not beyond the scope of the present invention. However, in practice these may need to be grown using crystallographic seed layers.

In the context of the present invention, there exists one or more hard axes of magnetization and one or more easy axes of magnetization in a predetermined plane. Along the easy axis, the material tends to exhibit a higher coercivity and a highly non-linear relationship between applied magnetic field and magnetization, as previously described. This is in contrast with the hard axis which tends to exhibit lower coercivity and maintain a relatively linear relationship between applied magnetic field and magnetization. This is generally illustrated in the graph 1000, which includes hysteresis loops for hard 1001 and soft 1002 axes.

Due to the low coercivity and linearity in magnetization, it is desirable to utilize the hard axis for most applications. In the case of an inductor, this would involve aligning the orientation of the hard axis with the expected orientation of magnetic field lines that originate from the inductor winding. The hard axis orientation can be controlled by applying a DC magnetic field along the desired orientation of the easy axis during deposition or annealing. The magnitude of the applied magnetic field should be of equal or greater magnitude than the saturation field of the hard axis. The saturation field of the hard axis, which is the magnetic field that saturates the magnetization along the hard axis, is the same as the induced anisotropy of the material.

Patterned magnetic cores, like those in the present invention, the induced anisotropy must overcome the shape anisotropy, or demagnetizing field ($H_{shape}$), in order for the magnetic core to maintain the desired orientation of anisotropy. Shape anisotropy is determined by the shape of the patterned core. For thin cores, the magnitude of the demagnetizing field can be approximated as:

$$H_{shape} \approx M(N_w - N_L)$$

where, M is the material's saturation magnetization, and $N_w$–$N_L$ are the patterned cores width and length, respectively. Thus, a core with high permeability will have low induced anisotropy, assuming constant saturation magnetization. In applications where a high permeability is required, it may be difficult to achieve the desired orientation of anisotropy for specific geometries where the shape anisotropy exceeds the induced anisotropy.

Fabricating one or more embodiments entails deposition of magnetic material by electrodeposition, physical vapor deposition or other suitable means. Layers are deposited onto the integrated circuit or a planar substrate proximal to an electrically coupled integrated circuit. After deposition of the complete core of magnetic material, they are covered with a masking layer that protects desired areas of the magnetic core. Other areas are left exposed so material may be selectively removed by a wet chemical etch. This forging yields magnetic cores with specific geometries that are transferred through the mask. A dry chemical etch may remove the magnetic material, insulating and interface layers without much discrimination.

Another method for fabricating one or more embodiments, the substrate is covered with a conductive seed layer that is deposited by physical vapor deposition. This seed layer is then covered with a photo-imageable polymer masking layer that is not electrically conductive. Portions of the substrate where growth of the magnetic core is not desired are coated with the polymer so that electrodeposition is conducted through the mask. This process yields magnetic cores with specific geometries that are transferred through the mask.

Fabrication can comprise depositing and patterning the magnetic cores by PVD and subtractive etching. This may also be performed by electrodeposition through a non-conductive mask. The core then undergoes an oxidation process so that the exposed areas of the magnetic core are oxidized. Insulating oxide magnetic materials prevent electrical shorting between electrical connectors. The two different material compositions for the alternating layers are chosen so that different electrically insulating oxides are formed during the oxidation process.

FIG. 10 is a graphical abstraction 1000 of a magnetic anisotropic inductor under a saturation condition. As long as the inductor current remains below the saturation current level, the inductance will stay relatively constant with respect to inductor current. Inductor current is depicted as being driven by a pulse width modulation (PWM) voltage, which is representative of a buck converter (power converter). The graph 1000 plots magnetization (Tesla) versus magnetic field (Oersted).

FIG. 11 includes a graphical abstraction 1100 of a magnetic anisotropic inductor below a saturation current condition. The saturation current is the inductor current level at which the magnetic core saturates along the inductor field direction. As long as the inductor current stays below the saturation current level the inductance will stay relative constant with respect to inductor current.

The graph 1100 plots inductor coil current versus time. The graph 1100 illustrates the inductor current when driven by a PWM voltage, which is representative of a buck converter (power converter). If an inductor current exceeds the current, the effective relative magnetic permeability will go to 1, and the effective inductance will decrease significantly.

FIG. 11 also illustrates a graphical abstraction 1150 of bias coil current versus time. As illustrated, the bias coil current is kept constant to control the hard axis orientation of the magnetic core.

FIG. 12 includes a graphical abstraction 1200 of a magnetic anisotropic inductor above a saturation current condition. If the inductor current exceeds the saturation current, the effective relative magnetic permeability will go to 1, and the effective inductance will decrease significantly. The graph 1200 plots inductor coil current versus time.

FIG. 12 also illustrates a graphical abstraction 1250 of bias coil current versus time. As illustrated, the bias coil current is kept constant to control the hard axis orientation of the magnetic core. In some embodiments, the bias coil current is increased to avoid magnetic saturation by raising the effective saturation current limit.

FIG. 13 includes a graphical abstraction 1300 that illustrates the saturation current increasing over time as the bias coil current increases. The graph 1300 plots inductor coil current versus time. FIG. 13 also illustrates a graphical abstraction 1350 of bias coil current versus time. The bias coil current is increased to raise the effective saturation current level, thus avoiding magnetic saturation.

Bias coil current is driven so that low frequency (DC) current is proportional to inductor coil current, and AC current is inversely proportionally inductor coil current. AC current is superimposed onto the bias coil. As such, the peak-to-peak inductor current ripple is reduced. Consequently, this has a similar effect of increasing the inductance value by raising the effective saturation limit.

The biasing coil may also be used to avoid magnetic saturation along the direction of the inductor field/flux path in the described invention. In some applications, the electrical current that passes through the inductor coil will have both an AC and DC component. In power conversion applications, the DC component can be especially large in magnitude and may be sufficient to saturate the magnetic core along the direction of the inductor. The inductor current that is sufficient to saturate the magnetic core is called the saturation current.

In the event of magnetic saturation, the effective relative permeability of the core is reduced to 1 (relative permeability of these materials is typically between 100 and 1500), which in turn causes the effective inductance to decrease. In order to avoid magnetic saturation, the bias coil current can be increased to raise the effective inductor coil saturation current. The fields from the bias coil and the inductor coil will be perpendicular to one another within the plane of the magnetic core, competing to magnetize the magnetic material along their field path. This competition between the two magnetic fields prevents the inductor coil's magnetic field from saturating the magnetic core.

The biasing coil may also be used to increase the apparent inductance in the device by generating an AC bias field that is superimposed upon the DC/low frequency bias field. Similar to the use case described previously, where the bias coil field is used to avoid magnetic saturation, the current through the bias coil can be increased to avoid magnetic saturation in the core. In addition to the DC/low frequency current increasing, an AC current can be added that is opposite the current traveling through the inductor coil. As the magnetic fields from the bias coil and inductor coil will be competing for magnetization of the core, decreasing the current that travels through the bias coil has the same effect upon the magnetization of the core as increasing the current through the inductor coil.

Likewise, increasing the current that travels through the bias coil has the same effect upon the magnetization of the core as decreasing the current through the inductor coil. The overall consequence is that superposition of an AC current on the bias coil that is inversely proportional to the inductor current will increase the apparent inductance observed by the inductor coil. Increasing this apparent inductance will result in either a smaller AC current through the inductor for a constant applied voltage, or a larger AC voltage across the inductor terminals for a constant applied current.

FIG. 14 includes a graphical abstraction 1400 that illustrates the saturation current increasing over time as the inductor coil current increases. The role of the bias coil and inductor coil can be switched, such that the inductor coil carries a current with the purpose of biasing the magnetic core such that the biasing coil will see a favorable change in inductance, hysteresis or both. Due to AC current superimposed onto the bias coil, the peak-to-peak inductor current ripple is reduced. This can have a similar effect as increasing the inductance value.

FIG. 14 also illustrates a graphical abstraction 1450 of bias coil current versus time. The bias coil current is driven so that low frequency (DC) current is proportional to inductor coil current, and AC current is proportional but opposite to the inductor coil current.

In some embodiments, large current (e.g., greater than or equal to about 10 mA depending on bias coil resistance) may be applied to the bias coil for an extended period of time (e.g., greater than or equal to about 15 minutes), so that the thermal energy dissipated in the bias coil can heat the magnetic film/core. The heat generated by the bias coil, in combination with time and the magnetic field originating from the bias coil can create conditions similar to those used during a high-temperature magnetic anneal (e.g., as described above) to permanently or semi-permanently fix the orientation of anisotropy for the film/core. In this manner, the anisotropy of the magnetic film can be controlled so that the hard axis orientation is parallel to the magnetic flux induced by the inductor coil, for the entire path of the magnetic flux.

FIG. 15 illustrates a method of operating an anisotropic inductor. The method includes 1501 inducing an easy axis in an anisotropic magnetic core lying in a core plane, the easy axis orthogonal to the core plane. The method also includes 1502 inducing a hard axis in the core, the hard axis parallel to the core plane and/or the direction of the magnetic field. The method also includes 1503 generating a magnetic field with an inductor coil, the magnetic field parallel to the hard axis, the inductor coil wrapped around the core. In some embodiments, the easy axis and the hard axis are disposed in the same plane.

In another aspect, the anisotropy of the magnetic core can be induced during deposition of the magnetic core material. A magnetic core having deposition-induced magnetic anisotropy can have improved magnetic properties (and thus improved performance of the inductor that includes the deposition-induced anisotropic magnetic core) relative to magnetic cores that have magnetic anisotropy induced after they are deposited and/or formed. For example, a deposition-induced anisotropic magnetic core can have reduced magnetic coercivity compared to magnetic cores that have magnetic anisotropy induced after they are deposited and/or formed.

FIG. 21 is a flow chart 2100 of a method for fabricating an inductor having a deposition-induced magnetic anisotropy according to one or more embodiments. In step 2101, a magnetic core is formed on a semiconductor substrate. The magnetic core comprises a ferromagnetic material, such as Co, Fe, or Ni, and/or any combination or alloy of these elements, potentially with other non-magnetic materials such as Ta, Zr, B, and/or P. While the magnetic core is being formed in step 2101, a bias magnetic field is generated in step 2102. The bias magnetic field passes through the magnetic core in a second direction. In step 2103, the bias magnetic field induces magnetic anisotropy in the magnetic core. For example, the bias magnetic field can induce an easy axis of magnetization in the magnetic core that is parallel to the bias magnetic field and/or that is parallel to the second direction. Inducement of the easy axis of magnetization can further induce a hard axis of magnetization in the magnetic core in a direction that is generally orthogonal to (e.g., within about 10° of) the easy axis of magnetization.

In step 2104, an inductor coil is fabricated. The inductor coil winds around the magnetic core formed in step 2101 such that the inductor coil can generate an inductor magnetic field that passes through the magnetic core in a first direction that is orthogonal to the second direction. The inductor magnetic field and the hard axis of magnetization can be aligned (e.g., parallel to one another) in at least a portion of the magnetic core, and preferably for all or substantially all (e.g., at least about 90%) of the magnetic core.

FIG. 22 is a flow chart 2100 of a method for forming a deposition-induced anisotropic magnetic core according to one or more embodiments. In step 2201, a magnetic core material is deposited on a semiconductor substrate. The magnetic core material can comprise a ferromagnetic material, for example as described herein. The magnetic core material can be deposited on a bottom conductor that forms a portion of the inductor coil. Alternatively, the magnetic core material can be deposited on a biasing coil that is formed above the bottom conductor. In either case, at least some insulating material is disposed between the magnetic core material and the underlying structure (e.g., bottom conductor or biasing coil). The magnetic core material can be deposited by physical vapor deposition (PVD) (including variants thereof such as ionized PVD (iPVD)) and/or PVD followed by electrodeposition.

In step 2202, a bias magnetic field is generated or produced while the magnetic core material is being deposited in step 2201. The bias magnetic field is configured to pass through the magnetic core material as it forms the magnetic core. For example, the bias magnetic field can be generated during PVD of the magnetic core material and/or during electrodeposition of the magnetic core material. The bias magnetic field is configured to pass through the magnetic core in a second direction, for example as described above in step 2102. The bias magnetic field can be generated by a bias coil formed on the same semiconductor substrate on which the bottom conductor is formed, on another semiconductor substrate, or on another location. In addition or in the alternative, the bias magnetic field can be generated by a permanent magnet formed on the same semiconductor substrate on which the bottom conductor is formed. In some embodiments, the semiconductor substrate can be heated during step 2202 which can improve or enhance certain properties of the deposited magnetic core material.

In step 2203, the bias magnetic field induces magnetic anisotropy in the magnetic core material as it is being deposited in step 2201, for example as described above in step 2103. For example, the bias magnetic field can induce an easy axis of magnetization that is aligned with and substantially parallel to the direction that the bias magnetic field passes through the magnetic core material. The bias magnetic field can be configured to induce the easy axis of magnetization in the magnetic core material in a direction that is orthogonal to the direction through which an inductor magnetic field, generated by an inductor coil that wraps around the magnetic core (defined in the magnetic core material), will pass through the magnetic core. Inducement of the easy axis of magnetization in the magnetic core material can induce a hard axis of magnetization in a direction orthogonal to the easy axis of magnetization. The bias coil can be configured to induce the easy axis in a second direction such that the induced hard axis of magnetization is aligned with and substantially parallel to the direction (e.g., a first direction) that the inductor magnetic field will pass through the magnetic core. In the embodiments where the bias magnetic field is generated by a bias coil, the bias magnetic field can be turned off after the magnetic core material is deposited.

In step 2204, a pattern is defined in the magnetic core material to form an anisotropic magnetic core. The pattern can be defined by depositing and patterning a photo-imageable material, such as photoresist, and etching the underlying magnetic core material according to the patterned photo-imageable material. The pattern can also be defined by depositing the magnetic material through a shadow mask, a masking substrate with openings, that is physically placed on the wafer during film deposition. Those of skill in the art will recognize that there may be other fabrication techniques to define a pattern in the magnetic core material.

In some embodiments, the shadow mask can be comprised of a permanent magnet and/or a bias coil that induces a desired anisotropy in the magnetic core material during deposition. As such, steps 2203 and 2204 can be combined in these embodiments. The magnetic fields generated by the permanent magnet and/or by the bias coil in the shadow mask can function the same as or similar to the bias magnetic field described above. For example, the magnetic fields generated by the permanent magnet and/or the bias coil in the shadow mask can be configured to induce an easy axis of magnetization in the magnetic core material in the second direction that is orthogonal to the direction through which the inductor magnetic field will pass. Inducement of the easy axis of magnetization in the magnetic core material can induce a hard axis of magnetization in a direction orthogonal to the easy axis of magnetization. The induced hard axis of magnetization can be aligned with and substantially parallel to the direction (e.g., a first direction) that the inductor magnetic field will pass through the magnetic core.

In some embodiments, steps 2101-2103 in flow chart 2100 can be performed according to flow chart 2200.

FIG. 23 is a cross-sectional view of a semiconductor structure 2300 to illustrate a first step for fabricating an inductor that includes a deposition-induced anisotropic magnetic core according to one or more embodiments. The cross section in FIG. 23 is taken through a plane orthogonal to core plane 625. In FIG. 23, a bottom conductor 2310 is deposited and patterned on a semiconductor substrate 2320. The bottom conductor 2310 is formed in an insulating material 2330 such as polyimide, polybenzoxazole (PBO), SU-8 photoresist, SiO$_2$ and/or SiN. In some embodiments, the bottom conductor 2310 can be formed using known semiconductor fabrication techniques. The bottom conductor 2310 can comprise copper and/or aluminum, an alloy of copper and/or aluminum, or another conductive material.

FIG. 24 is a cross-sectional view of the semiconductor structure 2300 to illustrate a second step for fabricating an inductor that includes a deposition-induced anisotropic magnetic core according to one or more embodiments. In FIG. 24, a bias coil 2340 is deposited and patterned on the bottom conductor 2310. However, some insulating material 2330 is disposed between the bias coil 2340 and the bottom conductor 2310 to prevent electrical conduction/shorting therebetween. In some embodiments, the bias coil 2340 can be formed using known semiconductor fabrication techniques. The bias coil 2340 comprises a conductive material that can be the same as or different than the material(s) that comprise the bottom conductor 2310. The bias coil 2340 is configured and arranged to produce a bias magnetic field that will pass through the magnetic core material in a direction that is orthogonal to the direction that the inductor coil will pass through the magnetic core.

FIG. 25 is a cross-sectional view of the semiconductor structure 2300 to illustrate a third step for fabricating an inductor that includes a deposition-induced anisotropic magnetic core according to one or more embodiments. In FIG. 25, the bias coil 2340 produces a bias magnetic field 2345 as magnetic core material is deposited 2500 from a deposition source 2510. The deposition source 2510 can be a PVD manufacturing tool, an electroplating (or electrodeposition) manufacturing tool, a chemical vapor deposition manufacturing tool, or other semiconductor manufacturing tool. As discussed above, the bias coil 2340 is configured and arranged to produce the bias magnetic field 2345 through the magnetic core material, during deposition thereof, in a direction that is orthogonal to the direction that the inductor coil will pass through the magnetic core material (and magnetic core). The bias coil 2340 can produce or generate the bias magnetic field 2345 when current flows in the bias coil 2340. For example, each bias coil 2340 across the wafer can be connected to common positive and negative terminals that interface with terminals on the wafer chuck, in the deposition chamber for the magnetic core material, around the edge of the wafer. Alternatively, bias coil 2340 can comprise or can be replaced with a bias permanent magnet 4040 that can generate a bias permanent magnetic field 4045 without flowing current in the bias coil 2340, as illustrated in semiconductor structure 4000 in FIG. 40. The bias permanent magnetic field 4045 can function the same as or substantially the same as bias magnetic field 2345.

FIG. 26 is a cross-sectional view of the semiconductor structure 2300 to further illustrate the third step for fabricating an inductor that includes a deposition-induced anisotropic magnetic core according to one or more embodiments. In FIG. 26, magnetic core material 2600 has been deposited from deposition source 2510 while being exposed to the bias magnetic field 2345. The bias magnetic field 2345 induces an easy axis of magnetization 2610 in the magnetic core material 2600 in a direction parallel to the bias magnetic field 2345 as it passes through the magnetic core material 2600. In the embodiments where the bias magnetic field 2345 is generated by bias coil 2340, the bias magnetic field 2345 can be turned off after the magnetic core material 2600 is deposited.

FIG. 27 is a cross-sectional view of the semiconductor structure 2300 to illustrate a fourth step for fabricating an inductor that includes a deposition-induced anisotropic magnetic core according to one or more embodiments. In FIG. 27, the magnetic core material 2600 has been deposited and patterned to form a magnetic core 2700 having a shape, which can be a toroid or other shape (e.g., as discussed herein). As discussed above, the bias magnetic field 2600 induced the magnetic core material 2600 to become magnetically anisotropic. Specifically, the bias magnetic field 2345 induced the easy axis of magnetization 2610 in the magnetic core material 2600. Inducing the easy axis of magnetization 2610 further induces a hard axis of magnetization 2710 in a direction orthogonal to the easy axis of magnetization 2610. For example, the hard axis of magnetization 2710 is oriented into the page in magnetic core portion 2700A and out of the page in magnetic core portion 2700B.

FIG. 28 is a cross-sectional view of the semiconductor structure 2300 to illustrate a fifth step for fabricating an inductor that includes a deposition-induced anisotropic magnetic core according to one or more embodiments. In FIG. 28, a top conductor 2810 is formed above the magnetic core 2700. The top conductor 2810 can comprise the same or different conductive material as bottom conductor 2310 or bias coil 2340. In addition, conductive VIAs 2820 electrically connect the bottom and top conductors 2310, 2810 to form an inductor coil 2800 that winds around the magnetic core 2700. The top conductor 2810 and the conductive VIAs are formed in additional insulating material 2330. The inductor coil 2800 is configured and arranged so that, when current flows therein, the inductor coil 2800 produces an inductor magnetic field 2830 that is substantially parallel to (e.g., within about 10° of) and aligned with the hard axis of magnetization 2710 of the magnetic core material 2600. The inductor coil 2800 and magnetic core 2700 form an inductor 2840. The fully-fabricated semiconductor structure 3000 including inductor 2840 that includes the deposition-induced anisotropic magnetic core 2700 is illustrated in FIG. 28.

Therefore, the inductor coil 2800 is configured and arranged to produce the inductor magnetic field 2830 that passes through the magnetic core 2700 (e.g., through the magnetic core material 2600) in a first direction. The bias coil 2340 is configured and arranged to produce the bias magnetic field 2345 that passes through the magnetic core 2700 (e.g., through the magnetic core material 2600) during its deposition in a second direction that is orthogonal to the first direction. The bias magnetic field 2345 induces the magnetic core material 2600 to substantially align its easy axis of magnetization 2610 with the bias magnetic field 2345 such that the easy axis of magnetization 2610 is substantially parallel to the second direction. Inducement of the easy axis of magnetization 2610 in the second direction causes the magnetic core material 2600 to substantially align its hard axis of magnetization 2710 in a direction orthogonal to the second direction. The bias magnetic field 2345 can be configured to orient the easy axis of magnetization 2610 such that the magnetic core material 2600 aligns its hard axis of magnetization 2710 to be substantially parallel to and aligned with the second direction and to the inductor magnetic field 2830.

In some embodiments, the deposition-induced magnetic anisotropy of the magnetic core 2700 can have improved magnetic properties (and thus improved performance of the inductor 2840) relative to magnetic cores that have magnetic anisotropy induced after they are deposited and/or formed. For example, magnetic core 2700 has a reduced magnetic coercivity compared to magnetic cores that have magnetic anisotropy induced after they are deposited and/or formed.

FIG. 29 is a flow chart 2900 of a method for fabricating an inductor that includes a deposition-induced anisotropic magnetic core according to one or more embodiments. The flow chart 2900 can correspond to FIGS. 23-28, described above.

In step 2901, a bottom conductor is formed on a semiconductor substrate. For example, the bottom conductor (e.g., bottom conductor 2310) can be formed as discussed above in FIG. 23. The bottom conductor can be formed directly on the semiconductor substrate or indirectly on the semiconductor substrate. For example, the bottom conductor can be formed on a semiconductor structure that itself is formed directly on the semiconductor substrate.

In step 2902, a bias coil is formed over the bottom conductor. For example, the bias coil (e.g., bias coil 2340) can be formed as discussed above in FIG. 24. An insulating material (e.g., insulating material 2330) is disposed between the bottom conductor and the bias coil to prevent electrical conduction/shorting therebetween.

In step 2903, a deposition-induced anisotropic magnetic core is formed. For example, the deposition-induced anisotropic magnetic core (e.g., magnetic core 2700) can be formed as discussed above in FIGS. 25-27.

In step 2904, a top conductor and VIAs that electrically connect the bottom and top conductors are fabricated. For example, the top conductor and VIAs (e.g., top conductor 2810 and VIAs 2820) can be formed as discussed above in FIG. 28. The bottom conductor, the top conductor, and the VIAs form an inductor coil (e.g., inductor coil 2800) that is wound or wrapped around the deposition-induced anisotropic magnetic core. An inductor (e.g., inductor 2840) that includes a deposition-induced anisotropic magnetic core is formed upon completion of step 2904 in flow chart 2900.

FIG. 30 is a cross-sectional view of a semiconductor structure 3000 to illustrate an alternative embodiment for fabricating an inductor that includes a deposition-induced anisotropic magnetic core. In FIG. 30, the bias coil 2340 is formed below the bottom conductor 2310, in contrast to semiconductor structure 2300 (e.g., FIG. 24) where the bias coil 2340 is formed above the bottom conductor 2310. Thus in FIG. 30 the bias coil 2340 is disposed between the bottom conductor 2310 and the semiconductor substrate 2320. Alternatively, the bias coil 2340 can comprise or can be replaced with a bias permanent magnet 4140 that can generate a bias permanent magnetic field 4145 without flowing current in the bias coil 2340, as illustrated in semiconductor structure 4100 in FIG. 41. The bias permanent magnetic field 4145 can function the same as or substantially the same as bias magnetic field 3045.

Regardless of whether the bias coil 2340 is disposed above or below the bottom conductor 2310 (e.g., as illustrated in FIGS. 24 and 30, respectively), (a) the bias coil 2340 and (b) the magnetic core to be formed out of magnetic core material 2600 (e.g., a target location for the magnetic core) and/or the bottom conductor 2310 can be aligned horizontally within about 200 µm of each other, including about 150 µm, about 100 µm, about 50 µm, and/or about 20 µm, including any value or range between any two of the foregoing.

The fabrication of the inductor otherwise follows flow chart 2900 and FIGS. 25-28. For example, the bias coil 2340 can produce a bias magnetic field 3045, during deposition of the magnetic core material 2600, to induce magnetic anisotropy in the magnetic core material 2600. For example, the bias magnetic field 3045 induces an easy axis of magnetization 2610 in the magnetic core material 2600 that is aligned with and substantially parallel to the bias magnetic field 3045 as it passes through the magnetic core material 2600. The fully-fabricated semiconductor structure 3000 including an inductor 3030 that includes the deposition-induced anisotropic magnetic core 2700 is illustrated in FIG. 31.

Therefore, the inductor coil 2800 is configured and arranged to produce the inductor magnetic field 2830 that passes through the magnetic core 2700 (e.g., through the magnetic core material 2600) in a first direction. The bias coil 2340 is configured and arranged to produce the bias magnetic field 3045 that passes through the magnetic core 2700 (e.g., through the magnetic core material 2600) during its deposition in a second direction that is orthogonal to the first direction. The bias magnetic field 3045 induces the magnetic core material 2600 to align its easy axis of magnetization 2610 with the bias magnetic field 3045 such that the easy axis of magnetization 2610 is substantially parallel to the second direction. Inducement of the easy axis of magnetization 2610 in the second direction causes the magnetic core material 2600 to align its hard axis of magnetization 2710 in a direction orthogonal to the second direction. The bias magnetic field 3045 can be configured to orient the easy axis of magnetization 2610 such that the magnetic core material 2600 aligns its hard axis of magnetization 2710 to be substantially parallel to the second direction and to the inductor magnetic field 2830.

FIG. 32 is a flow chart 3200 of a method for fabricating an inductor that includes a deposition-induced anisotropic magnetic core according to an alternative embodiment.

In step 3201, a bias coil is formed on a semiconductor substrate. For example, the bias coil (e.g., bias coil 2340) can be formed as discussed above in FIGS. 24 and 30. The bias coil can be formed directly on the semiconductor substrate or indirectly on the semiconductor substrate. For example, the bias coil can be formed on a semiconductor structure that itself is formed directly on the semiconductor substrate.

In step 3202, a bottom conductor is formed over the bias coil. For example, the bottom conductor (e.g., bottom conductor 2310) can be formed as discussed above in FIGS. 23 and 30. An insulating material (e.g., insulating material 2330) is disposed between the bias coil and the bottom conductor to prevent electrical conduction/shorting therebetween.

Steps 2903 and 2904 in flow chart 3200 proceed as described above in flow chart 2200. An inductor (e.g., inductor 3040) that includes a deposition-induced anisotropic magnetic core is formed upon completion of step 2904 in flow chart 3200.

FIG. 33 is a cross-sectional view of an assembly 3300 to illustrate another alternative embodiment for fabricating an inductor that includes a deposition-induced anisotropic magnetic core. In FIG. 33, the bias coil 2340 is disposed below a second substrate 3320. Thus in FIG. 33 substrates 2320 and 3320 are disposed between the bias coil 2340 and the bottom conductor 2310. The substrates 2320, 3320 are positioned relative to each other so that a bias magnetic field 3345, produced by the bias coil 2340 on the second substrate 3320, can pass through the magnetic core material 2600 in a second direction to induce the easy axis of magnetization 2610 in the magnetic core material 2600 to be substantially parallel to the second direction.

The fabrication of the inductor otherwise follows flow chart 2900 and FIGS. 25-28. For example, the bias coil 2340 produces the bias magnetic field 3345, during deposition of the magnetic core material 2600, to induce magnetic anisotropy in the magnetic core material 2600. The bias magnetic field 3345 induces an easy axis of magnetization 2610 in the magnetic core material 2600 that is aligned with and substantially parallel to the bias magnetic field 3345 as it passes through the magnetic core material 2600. The fully-fabricated semiconductor structure 3400 including an inductor 3430 that includes the deposition-induced anisotropic magnetic core 2700 is illustrated in FIG. 34.

Therefore, the inductor coil 2800 is configured and arranged to produce the inductor magnetic field 2830 that passes through the magnetic core 2700 (e.g., through the magnetic core material 2600) in a first direction. The bias coil 2340 is configured and arranged to produce the bias magnetic field 3345 that passes through the magnetic core 2700 (e.g., through the magnetic core material 2600) during its deposition in a second direction that is orthogonal to the first direction. The bias magnetic field 3345 induces the magnetic core material 2600 to align its easy axis of magnetization 2610 with the bias magnetic field 3345 such that the easy axis of magnetization 2610 is substantially parallel to the second direction. Inducement of the easy axis of magnetization 2610 in the second direction causes the magnetic core material 2600 to align its hard axis of magnetization 2710 in a direction orthogonal to the second direction. The bias magnetic field 3345 can be configured to orient the easy axis of magnetization 2610 such that the magnetic core material 2600 aligns its hard axis of magnetization 2710 to be substantially parallel to the second direction and to the inductor magnetic field 2830. The first and second 2320, 3320 can be separated after the deposition-induced magnetic core material is deposited. The second substrate 3320 can include a semiconductor material (e.g., silicon) or a non-semiconductor material such as glass, ceramic, metal, or polymer.

FIG. 35 is a flow chart 3200 of a method for fabricating an inductor that includes a deposition-induced anisotropic magnetic core according to an alternative embodiment. In step 3501, a bias coil is formed on a second substrate. For example, the bias coil (e.g., bias coil 2340) can be formed as discussed above in FIGS. 24 and 30. The bias coil can be formed directly or indirectly on the second substrate. For example, the bias coil can be formed on a structure that itself is formed directly on the second substrate. The second substrate can include a semiconductor material (e.g., silicon) or a non-semiconductor material such as glass, ceramic, metal, or polymer.

In step 3202, a bottom conductor is formed on a first semiconductor substrate. For example, the bottom conductor (e.g., bottom conductor 2310) can be formed as discussed above in FIGS. 23 and 30. An insulating material (e.g., insulating material 2330) can be disposed between the bottom conductor and the first semiconductor substrate (or underlying layer such as in a semiconductor structure disposed on the first semiconductor substrate) to prevent electrical conduction/shorting therebetween.

In step 3503, the first and second substrates are positioned and aligned relative to one another (e.g., as discussed herein) such that the bias magnetic field generated by the bias coil will pass through the magnetic core material, during deposition thereof, in a direction that is orthogonal to the direction that the inductor coil will pass through the magnetic core. For example, the first and second substrates can be positioned relative to each other so that a bias magnetic field, produced by the bias coil on the second substrate 3320 can pass through the magnetic core material, during deposition thereof, in a first direction. Positioning the first and second substrates can include moving the first and/or the second semiconductor substrate(s) relative to the other. In some embodiments, the first and second substrates are positioned so they are in contact with each other (e.g., a major portion of each substrate is in contact with the other).

Steps 2903 and 2904 in flow chart 3500 proceed as described above in flow chart 2900. An inductor (e.g., inductor 3040) that includes a deposition-induced anisotropic magnetic core is formed upon completion of step 2904 in flow chart 3500. Following step 2903 or 2904, the first and second substrates can be separated.

FIG. 36 is a cross-sectional view of an assembly 3600 to illustrate yet another alternative embodiment for fabricating an inductor that includes a deposition-induced anisotropic magnetic core. Assembly 3600 is the same as assembly 3300 except that the bias coil 2340 is disposed above the second semiconductor substrate 3320.

The fabrication of the inductor using assembly 3600 follows flow chart 3500. For example, the bias coil 2340 produces a bias magnetic field 3645, during deposition of the magnetic core material 2600, to induce magnetic anisotropy in the magnetic core material 2600. The bias magnetic field 3645 induces an easy axis of magnetization 2610 in the magnetic core material 2600 that is aligned with and substantially parallel to the bias magnetic field 3645 as it passes through the magnetic core material 2600. The fully-fabricated semiconductor structure including an inductor that includes the deposition-induced anisotropic magnetic core is the same as the semiconductor structure 3400 illustrated in FIG. 34.

Regardless of whether the bias coil 2340 is disposed below or above the second substrate 3320 (e.g., as illustrated in FIGS. 33 and 36, respectively), (a) the bias coil 2340 and (b) the magnetic core to be formed out of magnetic core material 2600 (e.g., a target location for the magnetic core) and/or the bottom conductor 2310 can be aligned horizontally within about 200 μm of each other, including about 150 μm, about 100 μm, about 50 μm, and/or about 20 μm, including any value or range between any two of the foregoing. In addition or in the alternative, (a) the bias coil 2340 and (b) the magnetic core to be formed out of magnetic core material 2600 (e.g., a target location for the magnetic core) and/or the bottom conductor 2310 can be aligned vertically within about 4 mm of each other, including about 3 mm, about 2 mm, and/or about 1 mm.

The first and second substrates 2320, 3320 can be separated after the deposition-induced magnetic core material is deposited.

FIG. 37 is a cross-sectional view of an assembly 3700 to illustrate another alternative embodiment for fabricating an inductor that includes a deposition-induced anisotropic magnetic core. In FIG. 37, bias permanent magnets 3740 are disposed below a second substrate 3720 such that the substrates 2320 and 3720 are disposed between the bias permanent magnets 3740 and the bottom conductor 2310. The substrates 2320, 3720 are positioned relative to each other so that bias permanent magnetic fields 3745, produced by the bias permanent magnets 3740 on the second substrate 3720, can pass through the magnetic core material 2600 in a second direction to induce the easy axis of magnetization 2610 in the magnetic core material 2600 to be substantially parallel to the second direction. The second substrate 3720 can include a semiconductor material (e.g., silicon) or a non-semiconductor material such as glass, ceramic, metal, or polymer.

The fabrication of the inductor otherwise follows flow chart 2900 and FIGS. 25-28. For example, the bias permanent magnets 3740 produce the bias permanent magnetic fields 3345, during deposition of the magnetic core material 2600, to induce magnetic anisotropy in the magnetic core material 2600. The bias permanent magnetic fields 3345 induce an easy axis of magnetization 2610 in the magnetic core material 2600 that is aligned with and substantially parallel to the bias permanent magnetic field 3345 as it passes through the magnetic core material 2600. The fully-fabricated semiconductor structure is the same as the fully-fabricated semiconductor structure 3400, including an inductor 3430 that includes the deposition-induced anisotropic magnetic core 2700, illustrated in FIG. 34. The first and second substrates 2320, 3720 can be separated after the deposition-induced magnetic core material is deposited.

FIG. 38 is a cross-sectional view of an assembly 3800 to illustrate yet another alternative embodiment for fabricating an inductor that includes a deposition-induced anisotropic magnetic core. Assembly 3800 is the same as assembly 3700 except that the bias permanent magnets 3740 are disposed above the second substrate 3720.

Regardless of whether the bias permanent magnets 3740 are disposed below or above the second substrate 3720 (e.g., as illustrated in FIGS. 37 and 38, respectively), (a) the bias permanent magnets 3740 and (b) the magnetic core to be formed out of magnetic core material 2600 (e.g., a target location for the magnetic core) and/or the bottom conductor 2310 can be aligned horizontally within about 200 μm of each other, including about 150 μm, about 100 μm, about 50 μm, and/or about 20 μm, including any value or range between any two of the foregoing. In addition or in the alternative, (a) the bias permanent magnets 3740 and (b) the magnetic core to be formed out of magnetic core material 2600 (e.g., a target location for the magnetic core) and/or the bottom conductor 2310 can be positioned vertically within a predetermined distance of each other such as about 4 mm of each other, including about 3 mm, about 2 mm, and/or about 1 mm.

FIG. 39 is a flow chart 3900 of a method for fabricating an inductor that includes a deposition-induced anisotropic magnetic core using permanent magnets according to an alternative embodiment. In step 3701, permanent magnets (e.g., bias permanent magnets 3740) are formed on a second substrate. The permanent magnets can be formed directly or indirectly on the second substrate. For example, the permanent magnets can be formed on a structure that itself is formed directly on the second substrate. The second substrate can include a semiconductor material (e.g., silicon) or a non-semiconductor material such as glass, ceramic, metal, or polymer.

Flow chart 3900 is otherwise identical to flow chart 3500. Following step 2903 or 2904, the first and second substrates can be separated.

In one or more of the methods for fabricating an inductor that includes a deposition-induced anisotropic magnetic core, the method(s) can include heating the substrate on which the deposition-induced anisotropic magnetic core is to be formed to a temperature of about 150° C. to about 250° C., including about 175° C., 200° C., 225° C., or any temperature or temperature range between any two of the foregoing temperatures. This heating can occur during deposition of the magnetic core material. In some embodiments, the heating can reduce the magnetic coercivity of the deposition-induced anisotropic magnetic core.

The present invention is designed to be easily integrated with complementary metal oxide semiconductor (CMOS) and integrated circuit chip fabrication. However, other scale and methods of manufacture are not beyond the scope of the present invention.

The embodiments described and illustrated herein are not meant by way of limitation, and are rather exemplary of the kinds of features and techniques that those skilled in the art might benefit from in implementing a wide variety of useful products and processes. For example, in addition to the applications described in the embodiments above, those skilled in the art would appreciate that the present disclosure can be applied to other applications.

The present invention should not be considered limited to the particular embodiments described above, but rather should be understood to cover all aspects of the invention as fairly set out herein. Various modifications, equivalent processes, as well as numerous structures to which the present invention may be applicable, will be readily apparent to those skilled in the art to which the present invention is directed upon review of the present disclosure.

What is claimed is:
1. A method of fabricating an inductor, the method comprising:
   depositing a ferromagnetic material on a substrate;
   defining a pattern in the ferromagnetic material to form a ferromagnetic core on the substrate, the ferromagnetic core lying in a core plane;

fabricating an inductor coil that winds around the ferromagnetic core, the inductor coil configured to generate an inductor magnetic field that passes through the ferromagnetic core in a first direction parallel to the core plane; and while depositing the ferromagnetic material:
generating a bias magnetic field that passes through the ferromagnetic material in a second direction that is orthogonal to the first direction; and
inducing a magnetic anisotropy in the ferromagnetic material with the bias magnetic field,
wherein inducing the magnetic anisotropy further comprises:
with the bias magnetic field, inducing an easy axis of magnetization in the ferromagnetic material, the easy axis parallel to the second direction, and
inducing a hard axis of magnetization in the ferromagnetic material, the hard axis orthogonal to the easy axis.

2. The method of claim 1, wherein the hard axis is parallel to the first direction.

3. The method of claim 1, further comprising, while depositing the ferromagnetic material, applying current in a bias coil disposed on the substrate to generate the bias magnetic field.

4. The method of claim 3, further comprising applying at least 10 mA of current in the bias coil.

5. The method of claim 3, further comprising fabricating the bias coil on the substrate, the bias coil disposed parallel to the core plane.

6. The method of claim 5, further comprising disposing the bias coil between the ferromagnetic core and the substrate.

7. The method of claim 6, further comprising disposing the bias coil between the inductor coil and the substrate.

8. The method of claim 6, wherein the inductor coil includes a top conductor, a bottom conductor, and a VIA that is electrically coupled to the top and bottom conductors, and the method further comprises disposing the bias coil between the ferromagnetic core and the bottom conductor.

9. The method of claim 5, further comprising aligning an axis of symmetry of the bias coil with a target axis of symmetry of the ferromagnetic core.

10. The method of claim 1, wherein the ferromagnetic core is formed on a first substrate and the method further comprises:
providing relative movement between the first substrate and a second substrate having a bias coil disposed thereon such that the bias coil on the second substrate and a target location for the ferromagnetic core on the first substrate are within a predetermined distance of one another; and
generating the bias magnetic field with the bias coil.

11. The method of claim 10, further comprising applying current in the bias coil to generate the bias magnetic field.

12. The method of claim 11, further comprising applying at least 10 mA of current in the bias coil.

13. The method of claim 10, wherein the relative movement between the first substrate and the second substrate results in a relative positioning thereof in which the first substrate and the second substrate are in contact with one another.

14. The method of claim 10, wherein the relative movement between the first substrate and the second substrate aligns the bias coil and a target location for the ferromagnetic core.

15. The method of claim 1, wherein the ferromagnetic material is deposited on a semiconductor substrate.

16. The method of claim 1, wherein the ferromagnetic core is formed on a semiconductor substrate.

17. A method of fabricating an inductor, the method comprising:
depositing a ferromagnetic material on a substrate;
defining a pattern in the ferromagnetic material to form a ferromagnetic core on the substrate, the ferromagnetic core lying in a core plane;
fabricating an inductor coil that winds around the ferromagnetic core, the inductor coil configured to generate an inductor magnetic field that passes through the ferromagnetic core in a first direction parallel to the core plane; and
while depositing the ferromagnetic material:
generating a bias magnetic field that passes through the ferromagnetic material in a second direction that is orthogonal to the first direction;
inducing a magnetic anisotropy in the ferromagnetic material with the bias magnetic field; and
while depositing the ferromagnetic material, applying current in a bias coil disposed on the substrate to generate the bias magnetic field.

18. The method of claim 17, wherein inducing the magnetic anisotropy further comprises inducing a hard axis of magnetization in the ferromagnetic material, the hard axis orthogonal to the easy axis.

19. The method of claim 18 wherein the hard axis is parallel to the first direction.

20. The method of claim 17, further comprising applying at least 10 mA of current in the bias coil.

21. The method of claim 17, further comprising fabricating the bias coil on the substrate, the bias coil disposed parallel to the core plane.

22. The method of claim 21, further comprising disposing the bias coil between the ferromagnetic core and the substrate.

23. The method of claim 22, further comprising disposing the bias coil between the inductor coil and the substrate.

24. The method of claim 22, wherein the inductor coil includes a top conductor, a bottom conductor, and a VIA that is electrically coupled to the top and bottom conductors, and the method further comprises disposing the bias coil between the ferromagnetic core and the bottom conductor.

25. The method of claim 21, further comprising aligning an axis of symmetry of the bias coil with a target axis of symmetry of the ferromagnetic core.

26. The method of claim 17, wherein the ferromagnetic material is deposited on a semiconductor substrate.

27. The method of claim 17, wherein the ferromagnetic core is formed on a semiconductor substrate.

28. A method of fabricating an inductor, the method comprising:
depositing a ferromagnetic material on a substrate;
defining a pattern in the ferromagnetic material to form a ferromagnetic core on the substrate, the ferromagnetic core lying in a core plane;
fabricating an inductor coil that winds around the ferromagnetic core, the inductor coil configured to generate an inductor magnetic field that passes through the ferromagnetic core in a first direction parallel to the core plane; and
while depositing the ferromagnetic material:
generating a bias magnetic field that passes through the ferromagnetic material in a second direction that is orthogonal to the first direction; and inducing a magnetic anisotropy in the ferromagnetic material with the bias magnetic field, wherein the ferromagnetic core is formed on a first substrate and the method further comprises:

providing relative movement between the first substrate and a second substrate having a bias coil disposed thereon such that the bias coil on the second substrate and a target location for the ferromagnetic core on the first substrate are within a predetermined distance of one another; and generating the bias magnetic field with the bias coil.

29. The method of claim 28, wherein inducing the magnetic anisotropy further comprises inducing a hard axis of magnetization in the ferromagnetic material, the hard axis orthogonal to the easy axis.

30. The method of claim 28, wherein the hard axis is parallel to the first direction.

31. The method of claim 28, further comprising applying current in the bias coil to generate the bias magnetic field.

32. The method of claim 31, further comprising applying at least 10 mA of current in the bias coil.

33. The method of claim 28, wherein the relative movement between the first substrate and the second substrate results in a relative positioning thereof in which the first substrate and the second substrate are in contact with one another.

34. The method of claim 28, wherein the relative movement between the first substrate and the second substrate aligns the bias coil and a target location for the ferromagnetic core.

35. The method of claim 28, wherein the ferromagnetic material is deposited on a semiconductor substrate.

36. The method of claim 28, wherein the ferromagnetic core is formed on a semiconductor substrate.

* * * * *